United States Patent
Parham et al.

(10) Patent No.: US 10,544,360 B2
(45) Date of Patent: Jan. 28, 2020

(54) MATERIALS FOR ORGANIC ELECTROLUMINESCENT DEVICES

(71) Applicant: Merck Patent GmbH, Darmstadt (DE)

(72) Inventors: Amir Hossain Parham, Frankfurt am Main (DE); Christof Pflumm, Darmstadt (DE); Anja Jatsch, Frankfurt am Main (DE); Thomas Eberle, Landau (DE); Jonas Valentin Kroeber, Frankfurt am Main (DE); Rouven Linge, Darmstadt (DE)

(73) Assignee: Merck Patent GmbH (DE)

( * ) Notice: Subject to any disclaimer, the term of this patent is extended or adjusted under 35 U.S.C. 154(b) by 157 days.

(21) Appl. No.: 15/513,808

(22) PCT Filed: Aug. 25, 2015

(86) PCT No.: PCT/EP2015/001733
§ 371 (c)(1),
(2) Date: Mar. 23, 2017

(87) PCT Pub. No.: WO2016/045765
PCT Pub. Date: Mar. 31, 2016

(65) Prior Publication Data
US 2018/0230378 A1     Aug. 16, 2018

(30) Foreign Application Priority Data
Sep. 24, 2014 (EP) .................................... 14003299

(51) Int. Cl.
*C09K 11/06*         (2006.01)
*H01L 51/00*         (2006.01)
*H01L 51/50*         (2006.01)

(52) U.S. Cl.
CPC .......... *C09K 11/06* (2013.01); *H01L 51/0052* (2013.01); *H01L 51/0072* (2013.01); *H01L 51/0074* (2013.01); *H01L 51/0085* (2013.01); *H01L 51/0087* (2013.01); *H01L 51/5016* (2013.01); *H01L 51/5076* (2013.01); *H01L 2251/50* (2013.01)

(58) Field of Classification Search
CPC . C09K 11/06; H01L 51/0052; H01L 51/0072; H01L 51/0074; H01L 51/0085; H01L 51/5016; H01L 51/5076; H01L 2251/50
See application file for complete search history.

(56) References Cited

U.S. PATENT DOCUMENTS

| 3,740,402 A | 6/1973 | Cevasco |
| 3,892,972 A | 7/1975 | Cevasco |
| 7,345,301 B2 | 3/2008 | Gerhard et al. |
| 2004/0219390 A1 | 11/2004 | Potrawa et al. |
| 2011/0101328 A1 | 5/2011 | Kaiser et al. |
| 2012/0217485 A1* | 8/2012 | Lee ..................... C07D 403/14 257/40 |
| 2017/0012218 A1 | 1/2017 | Park et al. |

FOREIGN PATENT DOCUMENTS

| JP | H07292353 A | 11/1995 | |
| JP | H10294178 A | 11/1998 | |
| JP | 2001250689 | * 9/2001 | ............. C09K 11/06 |
| JP | 2001250689 A | 9/2001 | |
| JP | 2006523740 A | 10/2006 | |
| JP | H11074080 A | 10/2006 | |
| JP | 2010275255 A | 12/2010 | |
| JP | 2012512536 A | 5/2012 | |

OTHER PUBLICATIONS

International Search Report for PCT/EP2015/001733 dated Dec. 4, 2015.
Nosova, E., et al., "3-Phenyl/Pyridinyl Derivatives of Trans-2-(aryl/heleryl)vinyl-3H-quinazolin-4-ones: Synthesis and Fluorescent Properties", International Journal of Organic Chemistry, vol. 2, No. 1, (2012), pp. 56-63.
Written Opinion of the International Searching Authority for PCT/EP2015/001733 dated Dec. 4, 2015.

* cited by examiner

*Primary Examiner* — Bijan Ahvazi
(74) *Attorney, Agent, or Firm* — Drinker Biddle & Reath LLP

(57) ABSTRACT

The present invention relates to mixtures comprising at least one phosphorescent dopant and at least one compound of one of the formulae (1) and (2), and the use thereof in electronic devices, especially in organic electroluminescent devices.

14 Claims, No Drawings

MATERIALS FOR ORGANIC ELECTROLUMINESCENT DEVICES

CROSS-REFERENCE TO RELATED APPLICATIONS

This application is a national stage application (under 35 U.S.C. § 371) of PCT/EP2015/001733 filed Aug. 25, 2015, which claims benefit of European Application No. 14003299.6, filed Sep. 24, 2014, both of which are incorporated herein by reference in their entirety.

The present invention describes mixtures of quinazolinone derivatives and phosphorescent dopants, and the use of quinazolinone derivatives and triplet matrix materials in organic electroluminescent devices. The invention further relates to a process for preparing the compounds of the invention and to electronic devices comprising these compounds.

The structure of organic electroluminescent devices (OLEDs) in which organic semiconductors are used as functional materials is described, for example, in U.S. Pat. Nos. 4,539,507, 5,151,629, EP 0676461 and WO 98/27136. Emitting materials used are frequently organometallic complexes which exhibit phosphorescence rather than fluorescence. For quantum-mechanical reasons, up to four times the energy efficiency and power efficiency is possible using organometallic compounds as phosphorescent emitters. In general terms, there is still a need for improvement in OLEDs, especially also in OLEDs which exhibit triplet emission (phosphorescence), for example with regard to efficiency, operating voltage and lifetime.

The properties of phosphorescent OLEDs are not just determined by the triplet emitters used. More particularly, the other materials used, for example matrix materials, are also of particular significance here. Improvements to these materials can thus also lead to distinct improvements in the OLED properties.

According to the prior art, among other materials, indolocarbazole derivatives (for example according to WO 2007/063754 or WO 2008/056746) or indenocarbazole derivatives (for example according to WO 2010/136109 or WO 2011/000455), especially those substituted by electron-deficient heteroaromatics such as triazine, are used as matrix materials for phosphorescent emitters. In addition, for example, bisdibenzofuran derivatives (for example according to EP 2301926) are used as matrix materials for phosphorescent emitters. However, there is still a need for improvement in the case of use of these matrix materials, especially in relation to the efficiency, the lifetime and the operating voltage of the device.

It is an object of the present invention to provide compounds suitable for use in phosphorescent OLEDs, especially as matrix material. More particularly, it is an object of the present invention to provide matrix materials suitable for green- and blue-phosphorescing OLEDs.

It has been found that, surprisingly, a mixture comprising at least one phosphorescent dopant and at least one compound of the following formulae (1) and (2) has improvements over the prior art, especially when used in organic electroluminescent devices:

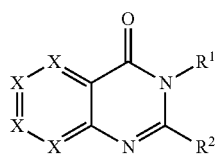

Formula (1)

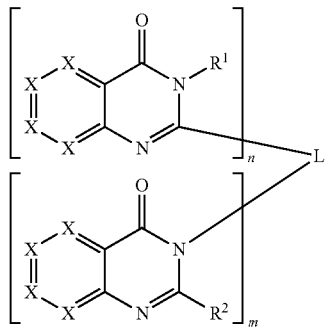

Formula (2)

where the symbols and indices used are as follows

X is the same or different at each instance and is N or $CR^3$, where not more than 2 X per heteroaryl group are N;

L is the same or different at each instance and is an (m+n)-valent aromatic or heteroaromatic ring system which has 5 to 60 aromatic ring atoms and may be substituted by one or more $R^4$ radicals;

$R^1$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si($R^4$)$_3$, B(O$R^4$)$_2$, OSO$_2R^4$, a straight-chain alkyl, alkoxy or thioalkoxy group having 1 to 40 carbon atoms or a branched or cyclic alkyl, alkoxy or thioalkoxy group having 3 to 40 carbon atoms and may be substituted in each case by one or more $R^4$ radicals, where one or more nonadjacent CH$_2$ groups may be replaced by C≡C, Si($R^4$)$_2$, Ge($R^4$)$_2$, Sn($R^4$)$_2$, C=O, C=S, C=Se, P(=O)($R^4$), SO, SO$_2$, O, S or CON$R^4$ and where one or more hydrogen atoms may be replaced by D, F, Cl, Br, I, CN or NO$_2$, or an aromatic or heteroaromatic ring system which has 5 to 60 aromatic ring atoms and may be substituted in each case by one or more $R^4$ radicals, or an aryloxy or heteroaryloxy group which has 5 to 60 aromatic ring atoms and may be substituted by one or more $R^4$ radicals, or a combination of these systems; at the same time, two or more $R^1$ substituents may also form a mono- or polycyclic, aliphatic or aromatic ring system with one another;

$R^2$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si($R^4$)$_3$, B(O$R^4$)$_2$, OSO$_2R^4$, N(Ar)$_2$, a straight-chain alkyl, alkoxy or thioalkoxy group having 1 to 40 carbon atoms or a branched or cyclic alkyl, alkoxy or thioalkoxy group having 3 to 60 carbon atoms and may be substituted in each case by one or more $R^4$ radicals, where one or more nonadjacent CH$_2$ groups may be replaced by C≡C, Si($R^4$)$_2$, Ge($R^4$)$_2$, Sn($R^4$)$_2$, C=O, C=S, C=Se, P(=O)($R^4$), SO, SO$_2$, O, S or CON$R^4$ and where one or more hydrogen atoms may be replaced by D, F, Cl, Br, I, CN or NO$_2$, or an aromatic or heteroaromatic ring system which has 5 to 60 aromatic ring atoms and may be substituted in each case by one or more $R^4$ radicals, or an aryloxy or heteroaryloxy group which has 5 to 60 aromatic ring atoms and may be substituted by one or more $R^4$ radicals, or a combination of these systems; at the same time, two or more $R^2$ substituents may also form a mono- or polycyclic, aliphatic or aromatic ring system with one another;

$R^3$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si($R^4$)$_3$, B(O$R^4$)$_2$, OSO$_2R^4$, N($R^4$)$_2$, a straight-chain alkyl, alkoxy or thioalkoxy group having 1 to 40 carbon atoms or a branched or cyclic alkyl, alkoxy or thioalkoxy group having 3 to 40 carbon atoms and may be substituted in each case by one or more $R^4$ radicals, where one or more nonadjacent $CH_2$ groups may be replaced by $C≡C$, $Si(R^4)_2$, $Ge(R^4)_2$, $Sn(R^4)_2$, $C=O$, $C=S$, $C=Se$, $P(=O)(R^4)$, $SO$, $SO_2$, $O$, $S$ or $CONR^4$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^4$ radicals, or an aryloxy or heteroaryloxy group which has 5 to 60 aromatic ring atoms and may be substituted by one or more $R^4$ radicals, or a combination of these systems; at the same time, two or more adjacent $R^3$ substituents may also form a mono- or polycyclic, aliphatic or aromatic ring system with one another;

Ar is the same or different at each instance and is an aromatic or heteroaromatic ring system which has 6 to 60 aromatic ring atoms and may also be substituted in each case by one or more $R^4$ radicals, $R^4$ is the same or different at each instance and is H, D, F, Cl, Br, I, CHO, $C(=O)R^5$, $P(=O)(R^5)_2$, $S(=O)R^5$, $S(=O)_2R^5$, CN, $NO_2$, $Si(R^5)_3$, $B(OR^5)_2$, $OSO_2R^5$, $N(R^5)_2$, a straight-chain alkyl, alkoxy or thioalkoxy group having 1 to 40 carbon atoms or a branched or cyclic alkyl, alkoxy or thioalkoxy group having 3 to 40 carbon atoms, each of which may be substituted by one or more $R^5$ radicals, where one or more nonadjacent $CH_2$ groups may be replaced by $C≡C$, $Si(R^5)_2$, $Ge(R^5)_2$, $Sn(R^5)_2$, $C=O$, $C=S$, $C=Se$, $P(=O)(R^5)$, $SO$, $SO_2$, $O$, $S$ or $CONR^5$ and where one or more hydrogen atoms may be replaced by D, F, Cl, Br, I, CN or $NO_2$, or an aromatic or heteroaromatic ring system which has 5 to 60 aromatic ring atoms, each of which may be substituted by one or more $R^5$ radicals, or an aryloxy or heteroaryloxy group which has 5 to 60 aromatic ring atoms and may be substituted by one or more $R^5$ radicals, or a combination of these systems; at the same time, two or more adjacent $R^4$ substituents may also form a mono- or polycyclic, aliphatic or aromatic ring system with one another;

$R^5$ is the same or different at each instance and is H, D, F, Cl, Br, I, $N(R^6)_2$, $C(=O)R^6$, $P(=O)(R^6)_2$, $S(=O)R^6$, $S(=O)_2R^6$, $CR^6=C(R^6)_2$, CN, $NO_2$, $Si(R^6)_3$, $B(OR^6)_2$, $OSO_2R^6$, $N(R^6)_2$, a straight-chain alkyl, alkoxy or thioalkoxy group having 1 to 40 carbon atoms or a branched or cyclic alkyl, alkoxy or thioalkoxy group having 3 to 40 carbon atoms, each of which may be substituted by one or more $R^6$ radicals, where one or more nonadjacent $CH_2$ groups may be replaced by $R^6C=CR^6$, $C≡C$, $Si(R^6)_2$, $C=O$, $C=NR^6$, $P(=O)(R^6)$, $SO$, $SO_2$, $NR^6$, $O$, $S$ or $CONR^6$ and where one or more hydrogen atoms may be replaced by D, F, Cl, Br, I, CN or $NO_2$, or an aromatic or heteroaromatic ring system which has 5 to 60 aromatic ring atoms, each of which may be substituted by one or more $R^6$ radicals, or an aryloxy or heteroaryloxy group which has 5 to 60 aromatic ring atoms and may be substituted by one or more $R^6$ radicals, or an aralkyl or heteroaralkyl group which has 5 to 60 aromatic ring atoms and may be substituted by one or more $R^6$ radicals, or a combination of these systems; at the same time, two or more adjacent $R^5$ substituents together may also form a mono- or polycyclic, aliphatic or aromatic ring system;

$R^6$ is the same or different at each instance and is H, D, F or an aliphatic hydrocarbyl radical having 1 to 20 carbon atoms or an aryl or heteroaryl group having 5 to 60 ring atoms and may be substituted by one or more $R^7$ radicals, or a combination of these groups;

$R^7$ is the same or different at each instance and is H, D, F or an aliphatic hydrocarbyl radical having 1 to 20 carbon atoms;

m, n are the same or different at each instance and are 0, 1, 2, 3, 4, 5, 6 or 7;

where m+n is equal to or superior to 2.

The bicyclic system in formula (1) is also referred to as the quinazolinone base skeleton to which $R^1$, $R^2$ or $R^3$ bind.

In this context, (m+n)-valent aromatic or heteroaromatic ring system means that m+n quinazolinone radicals are bonded to the aromatic or heteroaromatic ring system. The rest of the unoccupied positions may be substituted by $R^4$.

An aryl group in the context of this invention contains 6 to 60 carbon atoms; a heteroaryl group in the context of this invention contains 2 to 60 carbon atoms and at least one heteroatom, with the proviso that the sum total of carbon atoms and heteroatoms is at least 5. The heteroatoms are preferably selected from N, O and/or S. An aryl group or heteroaryl group is understood here to mean a simple aromatic cycle, i.e. benzene, or a simple heteroaromatic cycle, for example thiophene, etc., or a condensed (fused) aryl or heteroaryl group, for example naphthalene, anthracene, phenanthrene, dibenzofuran, etc. Aromatic systems joined to one another by a single bond, for example biphenyl, by contrast, are not referred to as an aryl or heteroaryl group but as an aromatic ring system.

An aromatic ring system in the context of this invention contains 6 to 80 carbon atoms in the ring system. A heteroaromatic ring system in the context of this invention contains 2 to 60 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention is understood to mean a system which does not necessarily contain only aryl or heteroaryl groups, but in which it is also possible for two or more aryl or heteroaryl groups to be joined by a nonaromatic unit (preferably less than 10% of the atoms other than H), for example a carbon, nitrogen or oxygen atom. For example, systems such as fluorene, 9,9'-spirobifluorene, 9,9-diarylfluorene, triarylamine, diaryl ethers, stilbene, etc. shall also be regarded as aromatic ring systems in the context of this invention, and likewise systems in which two or more aryl groups are joined, for example, by a short alkyl group. In addition, aromatic systems joined to one another by a single bond, for example biphenyl, are referred to as aromatic ring system in the context of this application.

An electron-deficient heteroaryl group in the context of the present invention is defined as a 5-membered heteroaryl group having at least two heteroatoms, for example imidazole, oxazole, oxadiazole, etc., or as a 6-membered heteroaryl group having at least one heteroatom, for example pyridine, pyrimidine, pyrazine, triazine, etc. It is also possible for further 6-membered aryl or 6-membered heteroaryl groups to be fused onto these groups, as, for example, in benzimidazole or quinoline.

In the context of the present invention, an aliphatic hydrocarbyl radical or an alkyl group or an alkenyl or alkynyl group which may typically contain 1 to 40 or else 1 to 20 carbon atoms and in which individual hydrogen atoms or $CH_2$ groups may also be replaced by the abovementioned groups are preferably understood to mean the methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl radicals. An alkoxy group having 1 to 40 carbon atoms is preferably understood to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy and 2,2,2-trifluoroethoxy. A thioalkyl group having 1 to 40 carbon atoms is understood to mean especially methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio. In general, alkyl, alkenyl, alkynyl, alkoxy or thioalkyl groups according to the present invention may be straight-chain, branched or cyclic, where one or more nonadjacent CH$_2$ groups may be replaced by the abovementioned groups; in addition, it is also possible for one or more hydrogen atoms to be replaced by D, F, Cl, Br, I, CN or NO$_2$, preferably F, Cl or CN, further preferably F or CN, especially preferably CN.

An aromatic or heteroaromatic ring system which has 5-80 aromatic ring atoms and may also be substituted in each case by the abovementioned radicals and which may be joined to the aromatic or heteroaromatic system via any desired positions is especially understood to mean groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, triphenylene, fluorene, spirobifluorene, dihydrophenanthrene, dihydropyrene, tetrahydropyrene, cis- or trans-indenofluorene, cis- or trans-indenocarbazole, cis- or trans-indolocarbazole, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, hexaazatriphenylene, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or groups derived from combinations of these systems. These groups may each be substituted by the abovementioned radicals.

An aryloxy group as defined in the present invention is understood to mean an aryl group as defined above bonded via an oxygen atom. An analogous definition applies to heteroaryloxy groups.

An electron-deficient heteroaryl group in the context of the present invention is defined as a 5-membered heteroaryl group having at least two heteroatoms, for example imidazole, oxazole, oxadiazole, etc., or as a 6-membered heteroaryl group having at least one heteroatom, for example pyridine, pyrimidine, pyrazine, triazine, etc. It is also possible for further 6-membered aryl or 6-membered heteroaryl groups to be fused onto these groups, as, for example, in benzimidazole or quinoline.

The wording that two or more radicals together may form a ring, in the context of the present description, shall be understood to mean, inter alia, that the two radicals are joined to one another by a chemical bond. This is illustrated by the following scheme:

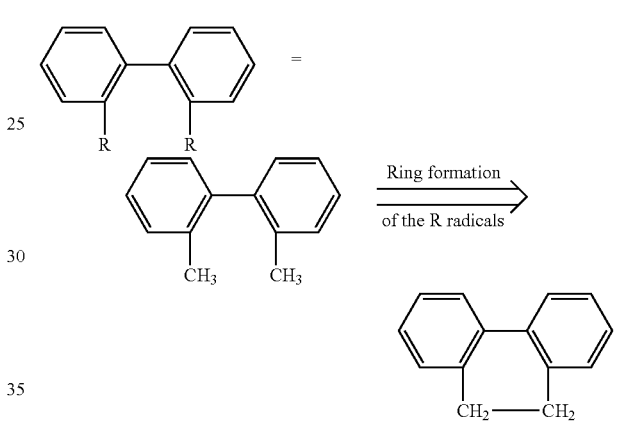

In addition, however, the abovementioned wording shall also be understood to mean that, if one of the two radicals is hydrogen, the second radical binds to the position to which the hydrogen atom was bonded, forming a ring. This shall be illustrated by the following scheme:

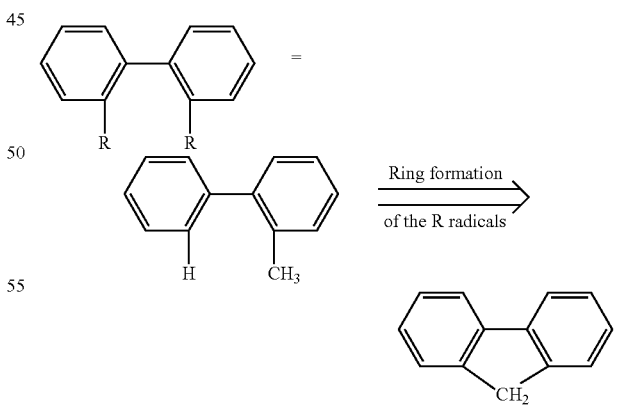

In a further embodiment of the invention, not more than 1 X in formula (1) or in a quinazolinone base skeleton in formula (2) is N. More preferably, no X in formula (1) or formula (2) is N.

A preferred embodiment of the compound of the formula (1) is a compound of the following formula (3), and a preferred embodiment of the compound of the formula (2) is a compound of the following formula (4):

Formula (3)

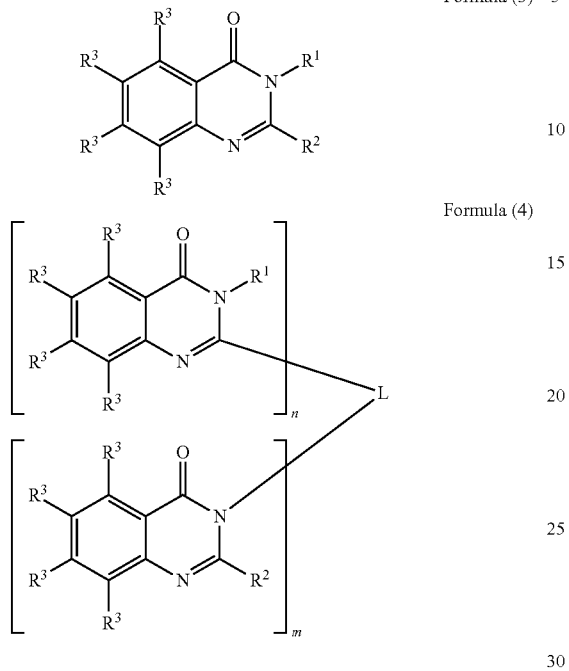

Formula (4)

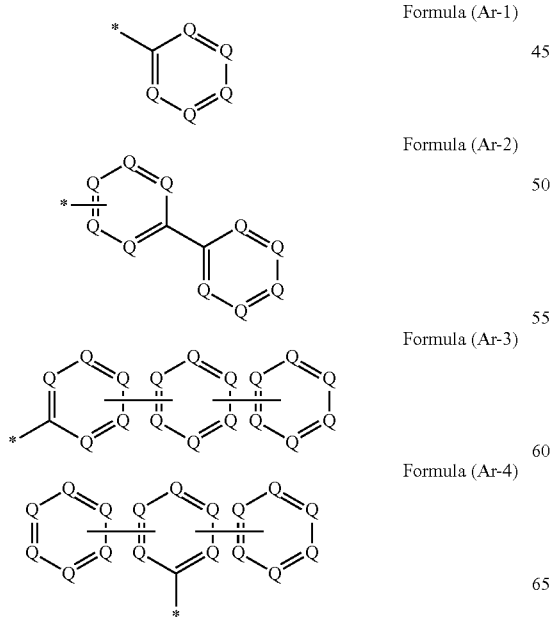

where the symbols and indices correspond to the definition of formulae (1) and (2).

In a preferred embodiment of the invention, the compound does not comprise any aryl group or heteroaryl group having more than 22 aromatic ring atoms.

In a preferred embodiment of the invention, the $R^1$, $R^2$ and $R^3$ groups are the same or different at each instance and, in the case of an aromatic or heteroaromatic ring system, are selected at each instance from the groups having the following formulae (Ar-1) to (Ar-27):

Formula (Ar-1)

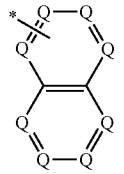

Formula (Ar-2)

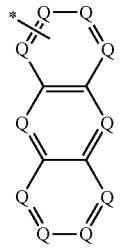

Formula (Ar-3)

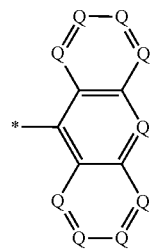

Formula (Ar-4)

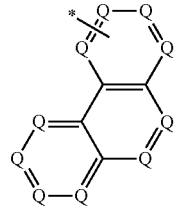

Formula (Ar-5)

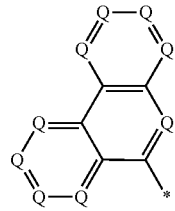

Formula (Ar-6)

Formula (Ar-7)

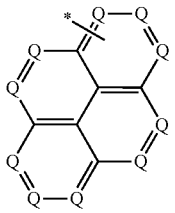

Formula (Ar-8)

Formula (Ar-9)

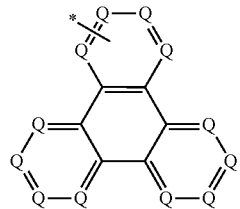

Formula (Ar-10)

Formula (Ar-11)

-continued
Formula (Ar-12)
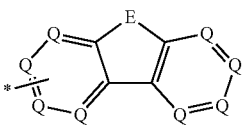
Formula (Ar-13)
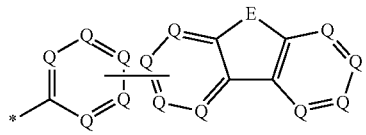
Formula (Ar-14)
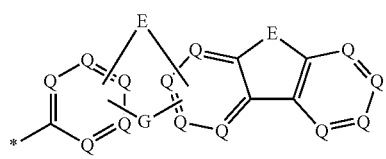
Formula (Ar-15)
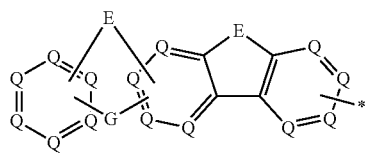
Formula (Ar-16)
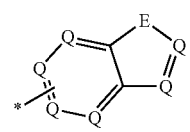
Formula (Ar-17)
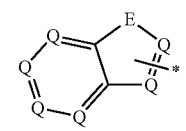
Formula (Ar-18)
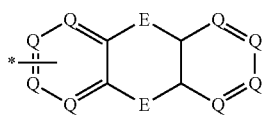
Formula (Ar-19)
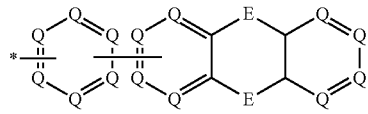
Formula (Ar-20)
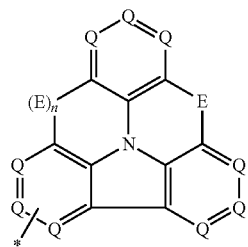
-continued
Formula (Ar-21)
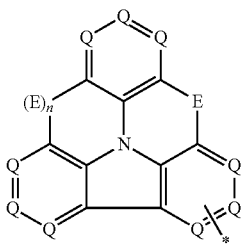
Formula (Ar-22)
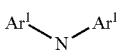
Formula (Ar-23)
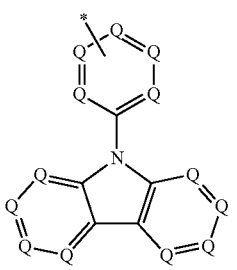
Formula (Ar-24)
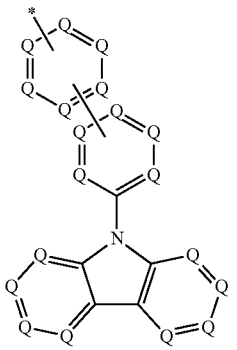
Formula (Ar-25)
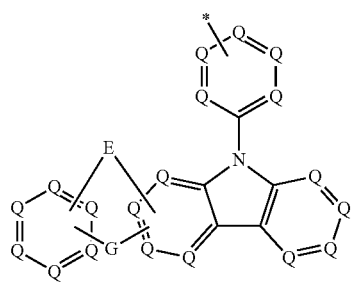
Formula (Ar-26)
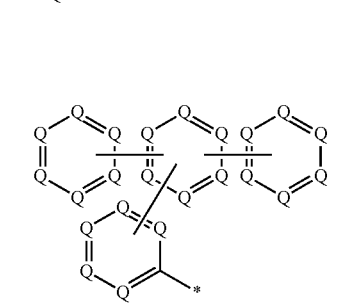

Formula (Ar-27)

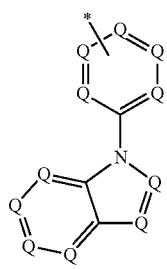

where the symbols and indices correspond to the symbols and indices of the formulae (1) and (2) and, in addition:

Q is the same or different at each instance and is CR$^4$ or N, where not more than 3 Q symbols per cycle are N;

E is the same or different at each instance and is (CR$^4$)$_2$, NR$^4$, O, S or C=O;

G at each instance is a single bond, (CR$^4$)$_2$, NR$^4$, O, S or C=O;

n is 0 or 1, where n=0 means that no E group is bonded at this position and R$^4$ radicals are bonded to the corresponding carbon atoms instead;

Ar$^2$ is the same or different at each instance and is a bivalent aromatic or heteroaromatic ring system which has 5 to 60 aromatic ring atoms and may be substituted by one or more R$^4$ radicals;

Ar$^1$ are the same or different at each instance and are an aromatic or heteroaromatic ring system which has 6 to 60 aromatic ring atoms and may in each case also be substituted by one or more R$^4$ radicals; where the two Ar$^1$ may be joined and/or Ar$^1$ may be joined to Ar$^2$ via at least one bridge K in each case;

K is the same or different at each instance and is a single bond or a divalent bridge selected from N(R$^4$), B(R$^4$), O, C=O, C(R$^4$)$_2$, Si(R$^4$)$_2$ and S; and

* represents the bond to the quinazolinone base skeleton.

In addition, the R$^2$ and R$^3$ groups are selected from the groups of one of the following formulae (Ar1-1) to (Ar1-7):

Formula (Ar1-1)

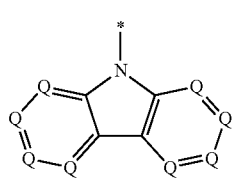

Formula (Ar1-2)

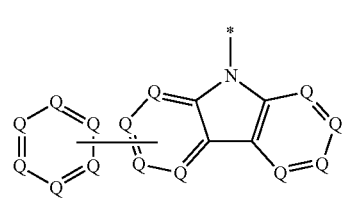

Formula (Ar1-3)

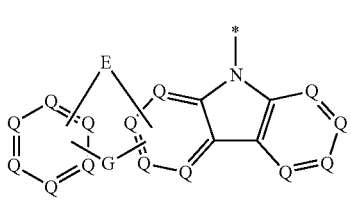

Formula (Ar1-4)

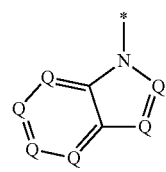

Formula (Ar1-5)

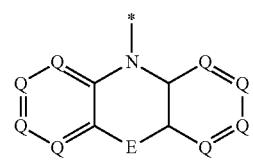

Formula (Ar1-6)

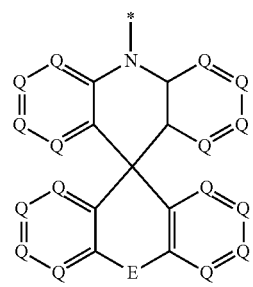

Formula (Ar1-7)

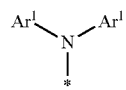

where the symbols and indices correspond to the symbols and indices of formula (1) and, in addition, for the formulae (Ar1-1) to (Ar1-7):

Q is the same or different at each instance and is CR$^4$ or N, where not more than 2 Q symbols per cycle are N;

E is the same or different at each instance and is (CR$^4$)$_2$, NR$^4$, O, S or C=O;

G at each instance is a single bond, (CR$^4$)$_2$, NR$^4$, O, S or C=0;

n is 0 or 1, where n=0 means that no E group is bonded at this position and R$^4$ radicals are bonded to the corresponding carbon atoms instead;

Ar$^1$ are the same or different at each instance and are an aromatic or heteroaromatic ring system which has 6 to 60 aromatic ring atoms and may in each case also be substituted by one or more R$^4$ radicals; where the two Ar$^1$ may be joined via at least one bridge K in each case;

K is the same or different at each instance and is a single bond or a divalent bridge selected from N(R$^4$), B(R$^4$), 0, C=O, C(R$^4$)$_2$, Si(R$^4$)$_2$ and S; and

* represents the bond to the quinazolinone base skeleton.

In a further preferred embodiment, in the formula (Ar-1), 0, 1, 2 or 3 Q symbols are N.

Preferred embodiments of the formula (Ar-15) are shown by the following formulae (Ar-15-1) to (Ar-15-7):

Formula (Ar-15-1)
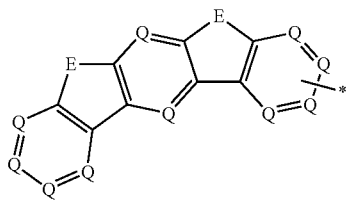

Formula (Ar-15-2)
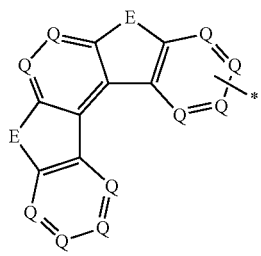

Formula (Ar-15-3)
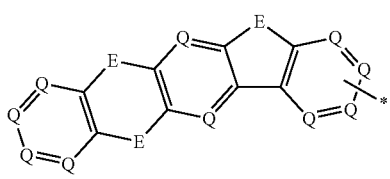

Formula (Ar-15-4)
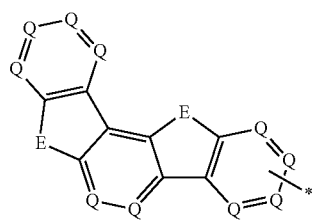

Formula (Ar-15-5)
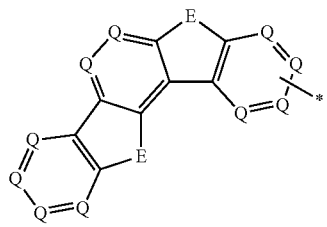

Formula (Ar-15-6)
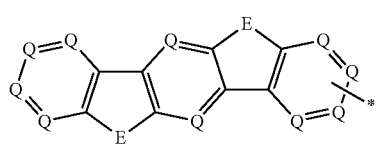

Formula (Ar-15-7)
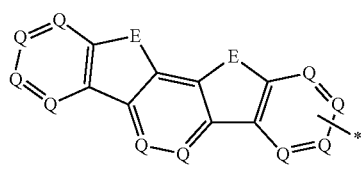

where the symbols correspond to the symbols of the formula (Ar-15). More preferably, Q is always $CR^4$.

In a further preferred embodiment, the $R^1$, $R^2$ and $R^3$ groups are the same or different at each instance and, in the case of an aromatic or heteroaromatic ring system, are selected from the groups having the structures of the formulae (Ar-1) to (Ar-24), where the general formulae are replaced by the respective particularly preferred embodiments of the following formulae (Ar-1-1) to (Ar-21-1) (for example, formula (Ar-1) is replaced by one of the formulae (Ar-1-1) to (Ar-1-9)):

Formula (Ar-1-1)
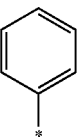

Formula (Ar-1-2)
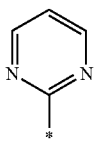

Formula (Ar-1-3)
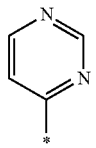

Formula (Ar-1-4)
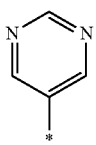

Formula (Ar-1-5)
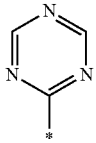

Formula (Ar-2-1)
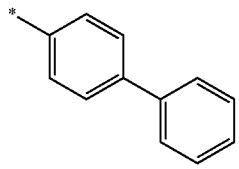

Formula (Ar-2-2)
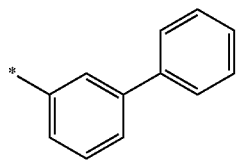

Formula (Ar-2-3)
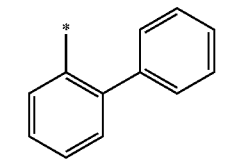

Formula (Ar-3-1)
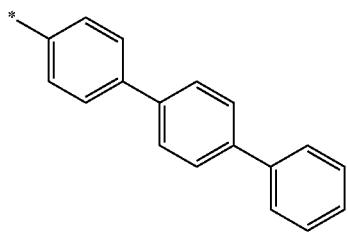
Formula (Ar-3-2)
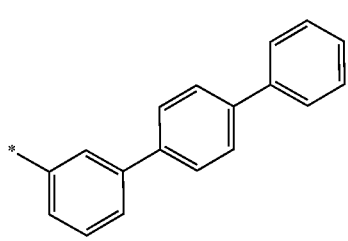
Formula (Ar-3-3)
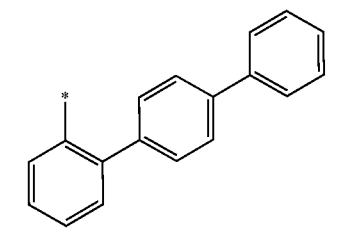
Formula (Ar-3-4)
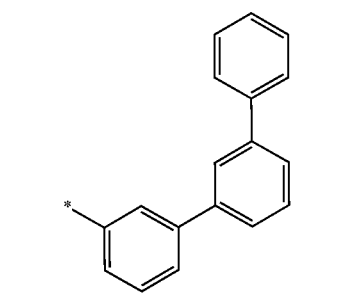
Formula (Ar-3-5)
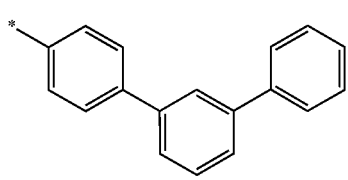
Formula (Ar-3-6)
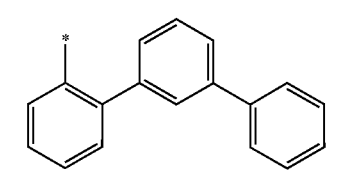
Formula (Ar-3-7)
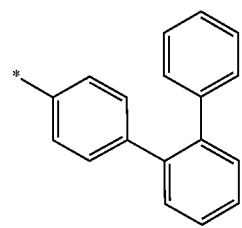
Formula (Ar-3-8)
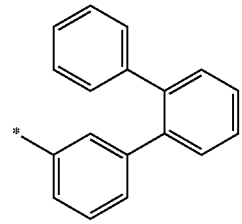
Formula (Ar-3-9)
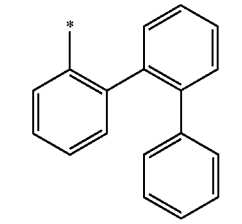
Formula (Ar-4-1)
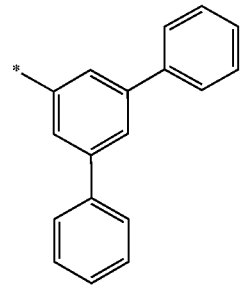
Formula (Ar-4-2)
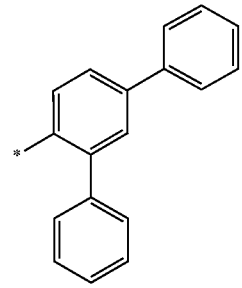
Formula (Ar-4-3)
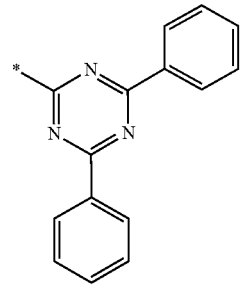

Formula (Ar-4-4)
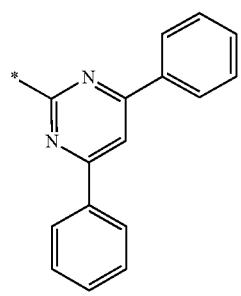
Formula (Ar-5-1)
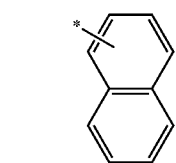
Formula (Ar-8-1)
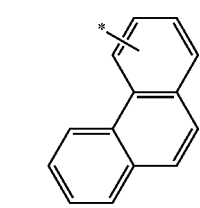
Formula (Ar-10-1)
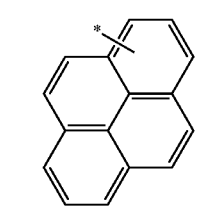
Formula (Ar-11-1)
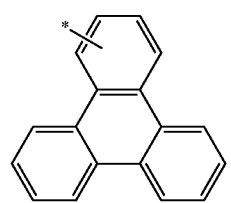
Formula (Ar-12-1)
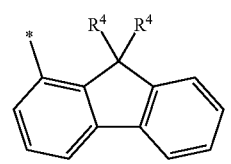
Formula (Ar-12-2)
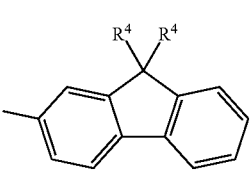
Formula (Ar-12-3)
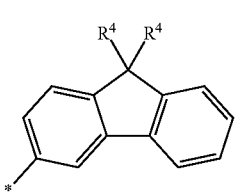
Formula (Ar-12-4)
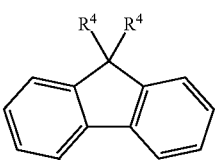
Formula (Ar-12-5)
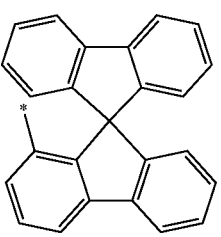
Formula (Ar-12-6)
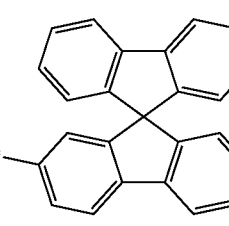
Formula (Ar-12-7)
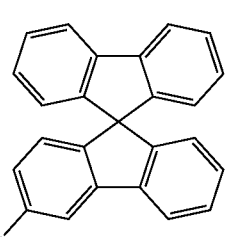
Formula (Ar-12-8)
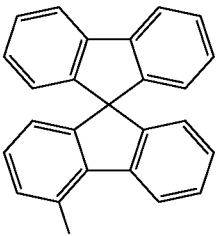
Formula (Ar-12-9)
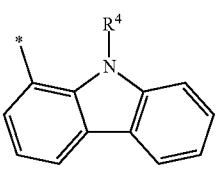
Formula (Ar-12-10)
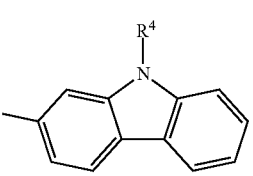

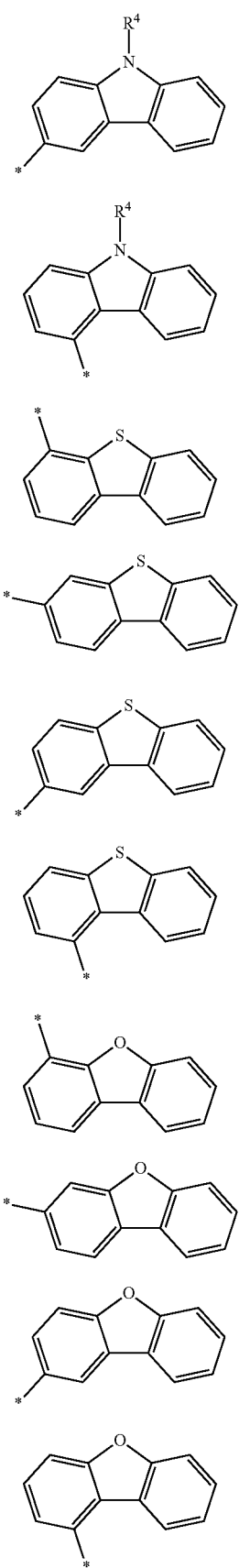
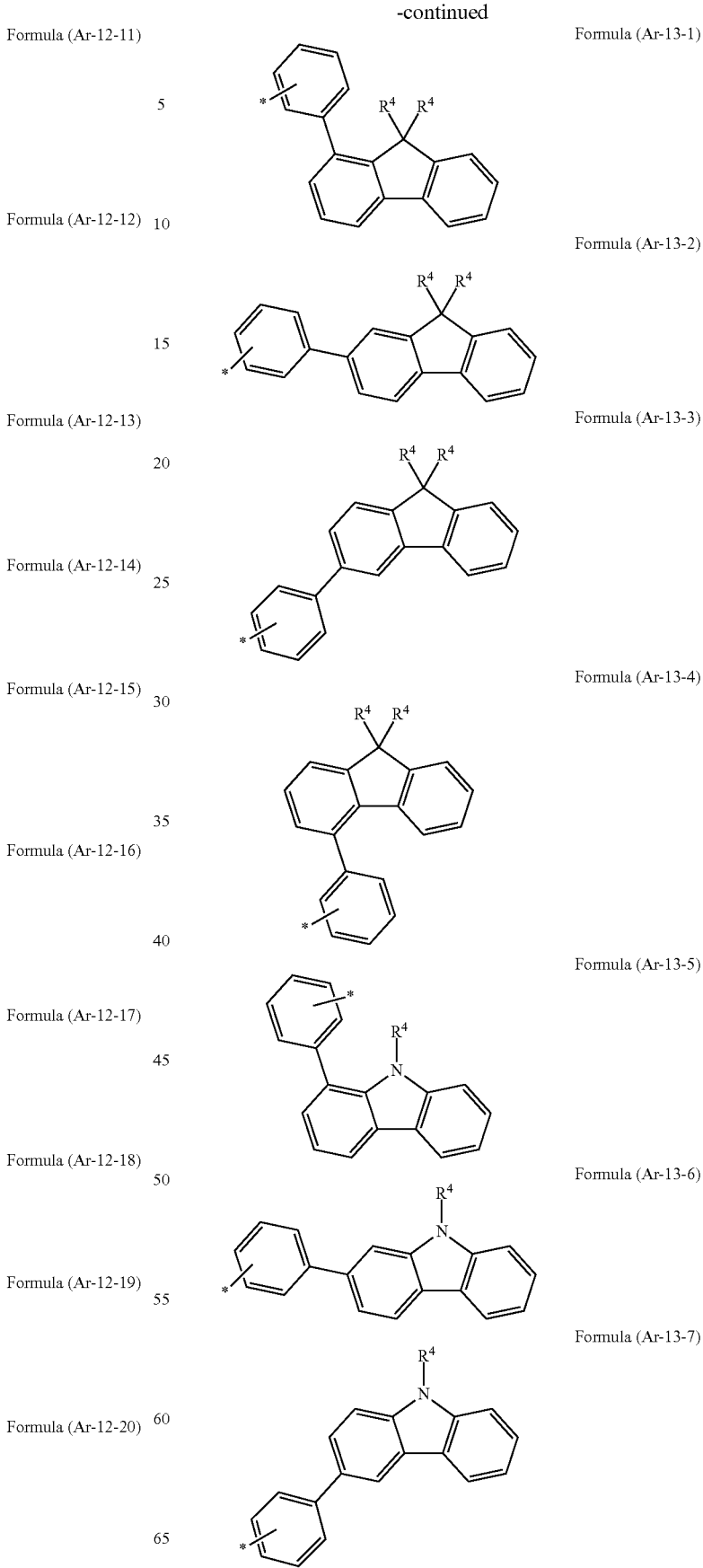

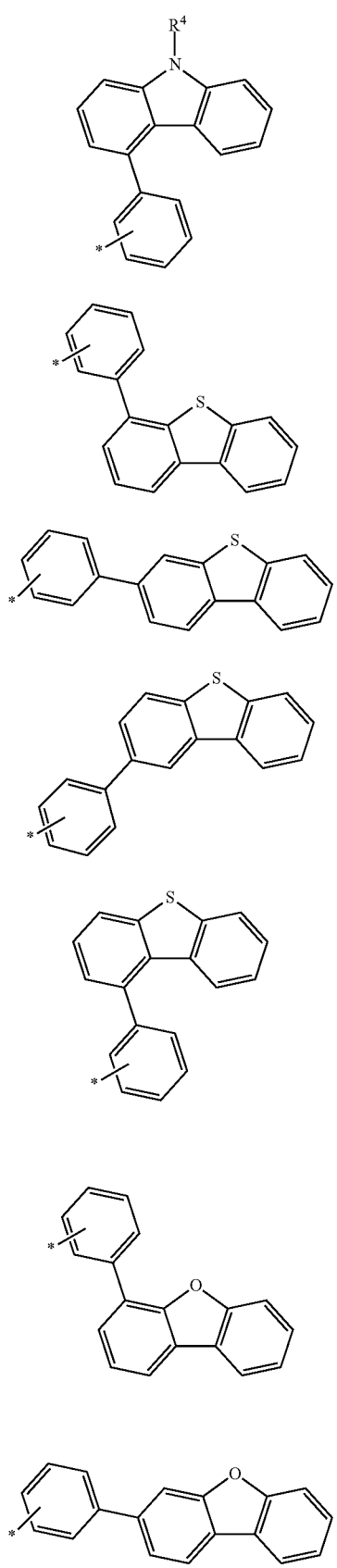
Formula (Ar-13-8)
Formula (Ar-13-9)
Formula (Ar-13-10)
Formula (Ar-13-11)
Formula (Ar-13-12)
Formula (Ar-13-13)
Formula (Ar-13-14)
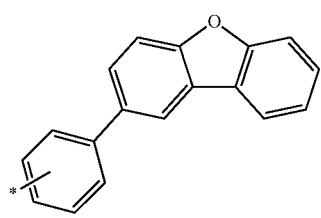
Formula (Ar-13-15)
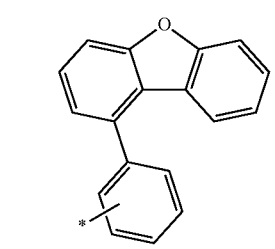
Formula (Ar-13-16)
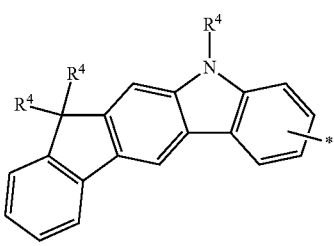
Formula (Ar-15-1-1)
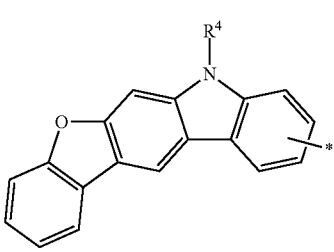
Formula (Ar-15-1-2)
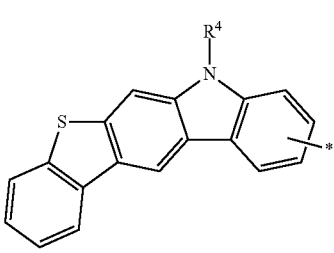
Formula (Ar-15-1-3)
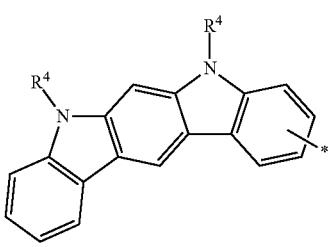
Formula (Ar-15-1-4)
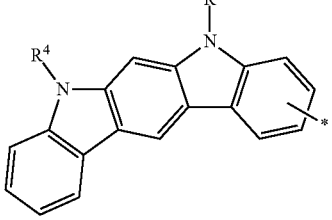

Formula (Ar-15-1-5)
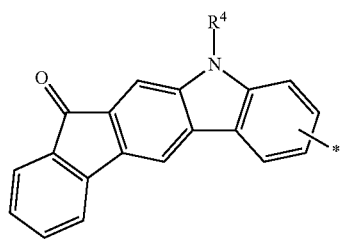
Formula (Ar-15-1-6)
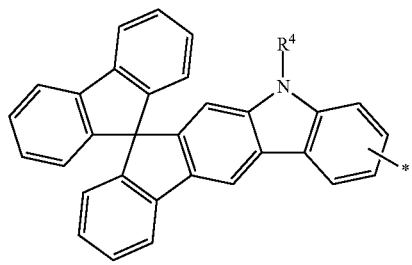
Formula (Ar-15-2-1)
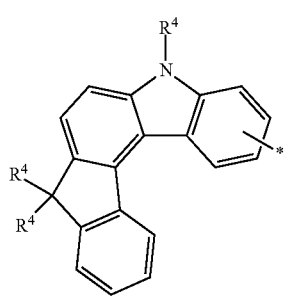
Formula (Ar-15-2-2)
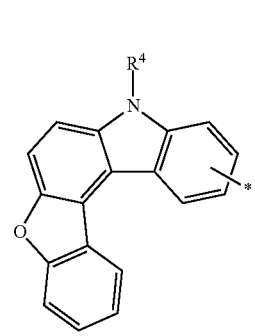
Formula (Ar-15-2-3)
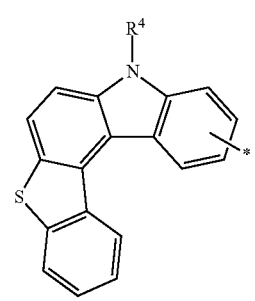
Formula (Ar-15-2-4)
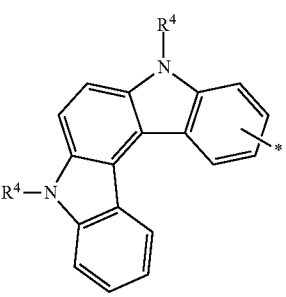
Formula (Ar-15-2-5)
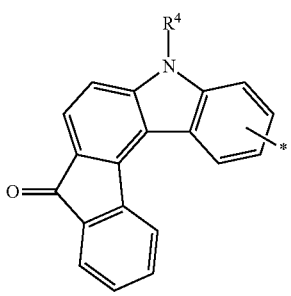
Formula (Ar-15-2-6)
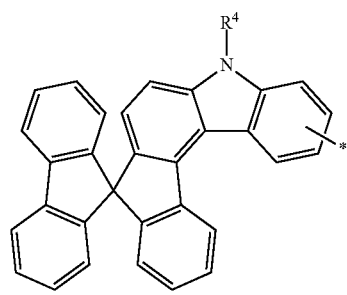
Formula (Ar-15-3-1)
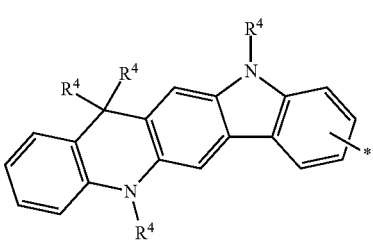
Formula (Ar-15-3-2)
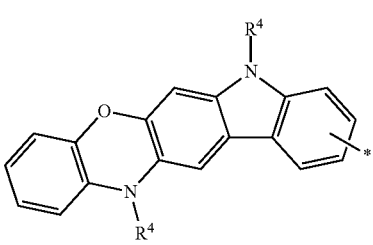

Formula (Ar-15-3-3)
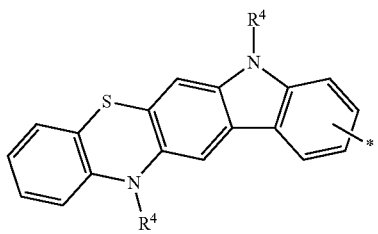
Formula (Ar-15-3-4)
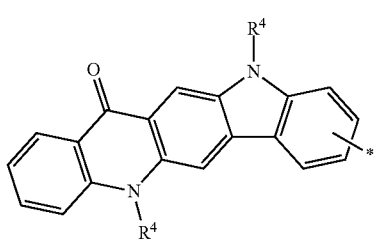
Formula (Ar-15-4-1)
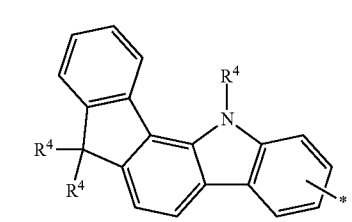
Formula (Ar-15-4-2)
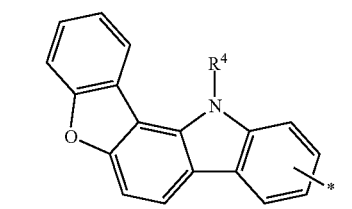
Formula (Ar-15-4-3)
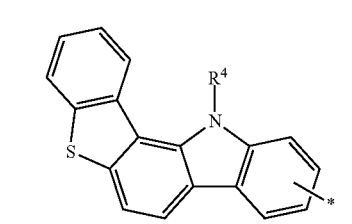
Formula (Ar-15-4-4)
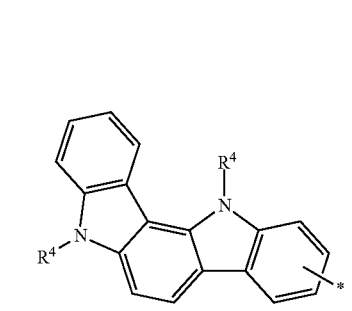
Formula (Ar-15-4-5)
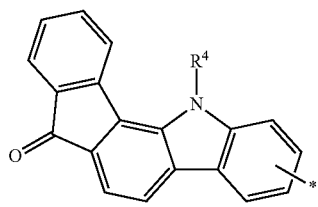
Formula (Ar-15-4-6)
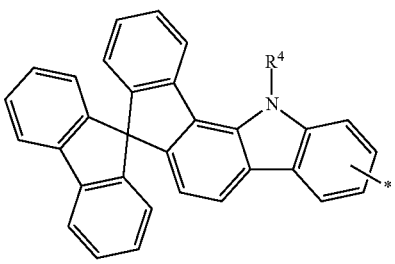
Formula (Ar-15-5-1)
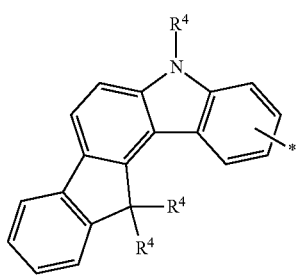
Formula (Ar-15-5-2)
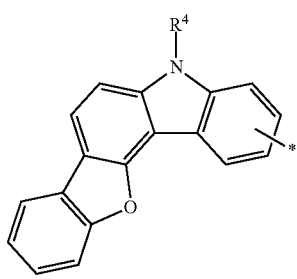
Formula (Ar-15-5-3)
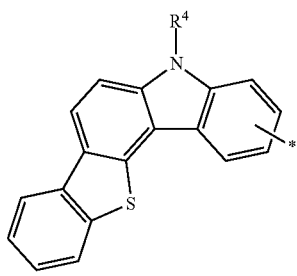

Formula (Ar-15-5-4)
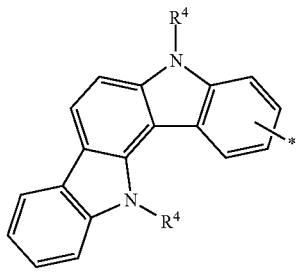
Formula (Ar-15-5-5)
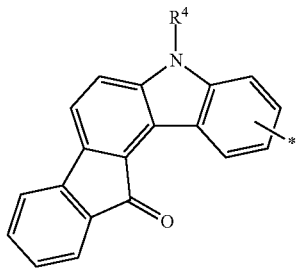
Formula (Ar-15-5-6)
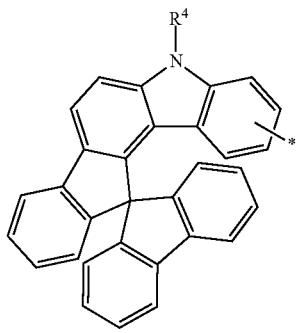
Formula (Ar-15-6-1)
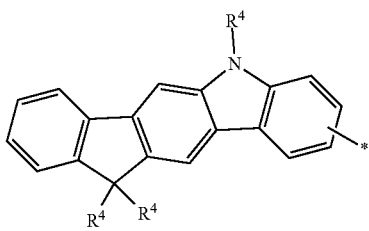
Formula (Ar-15-6-2)
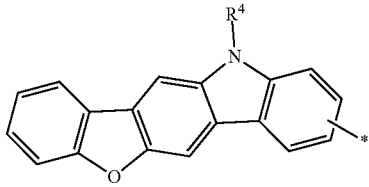
Formula (Ar-15-6-3)
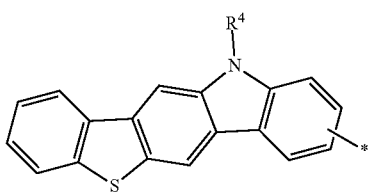
Formula (Ar-15-6-4)
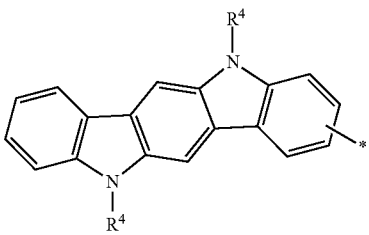
Formula (Ar-15-6-5)
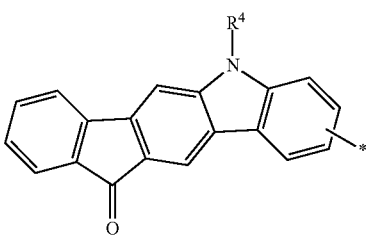
Formula (Ar-15-6-6)
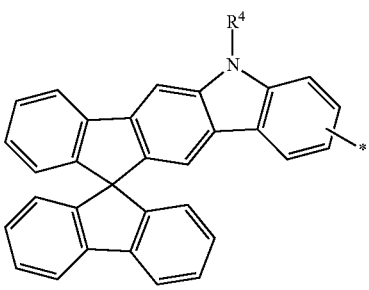
Formula (Ar-15-7-1)
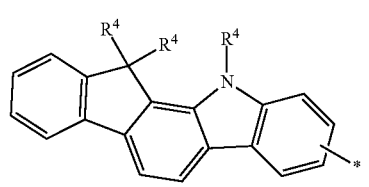
Formula (Ar-15-7-2)
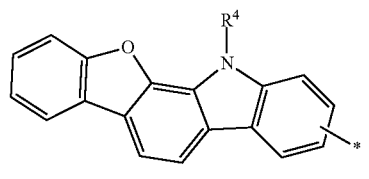
Formula (Ar-15-7-3)
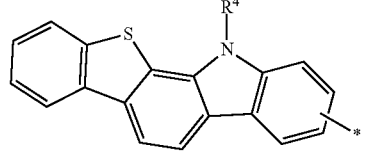
Formula (Ar-15-7-4)
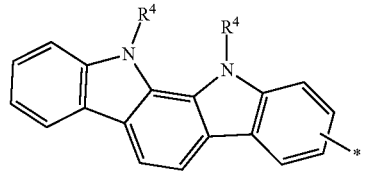

Formula (Ar-15-7-5)
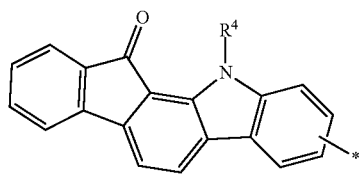
Formula (Ar-15-7-6)
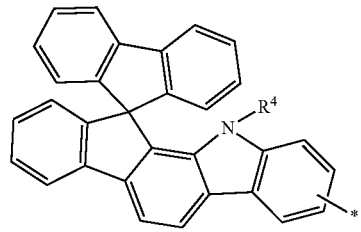
Formula (Ar-16-1)
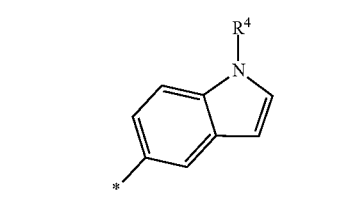
Formula (Ar-17-1)
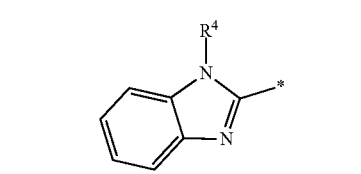
Formula (Ar-18-1)
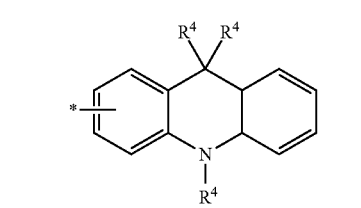
Formula (Ar-18-2)
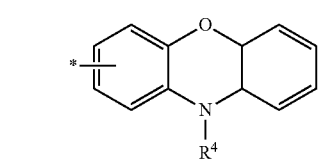
Formula (Ar-18-3)
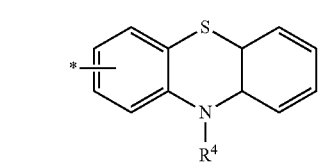
Formula (Ar-18-4)
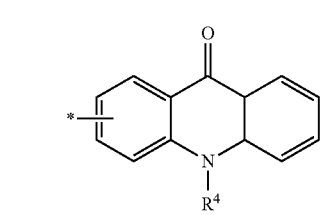
Formula (Ar-19-1)
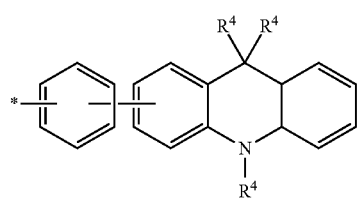
Formula (Ar-19-2)
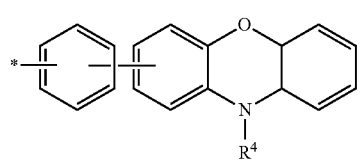
Formula (Ar-19-3)
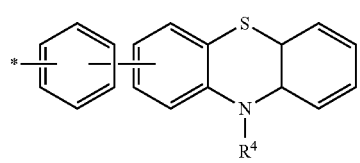
Formula (Ar-19-4)
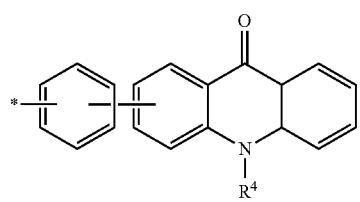
Formula (Ar-20-1)
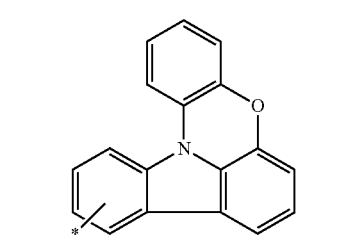
Formula (Ar-20-2)
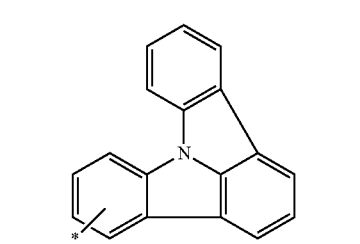
Formula (Ar-21-1)
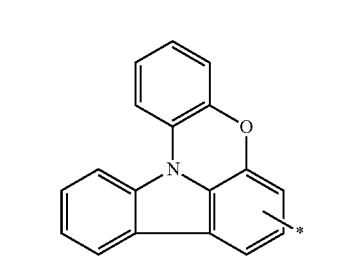

Formula (Ar-23-1)
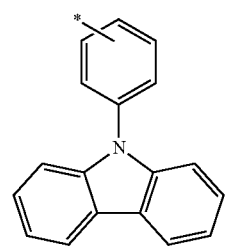
Formula (Ar-24-1)
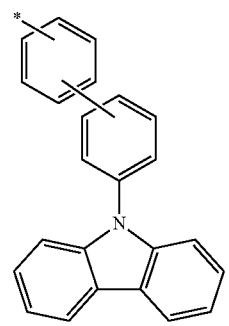
Formula (Ar-25-1)
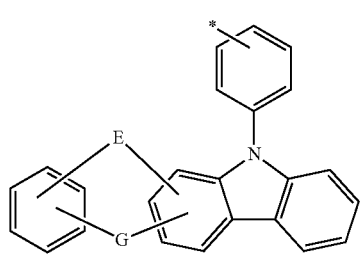
Formula (Ar-25-2)
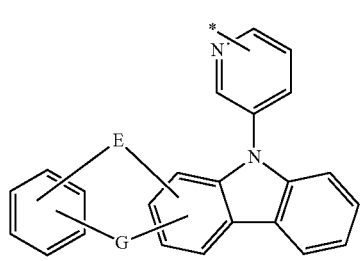
Formula (Ar-26-1)
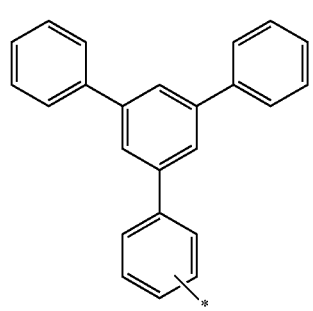
Formula (Ar-26-2)
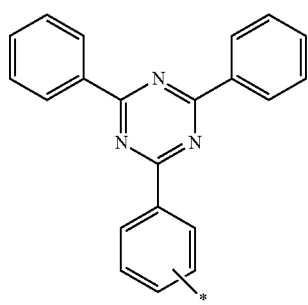
Formula (Ar-26-3)
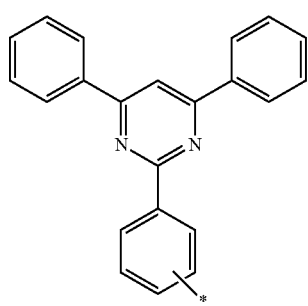
Formula (Ar-26-4)
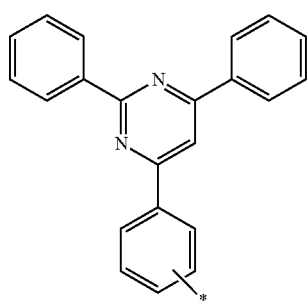
Formula (Ar-26-5)
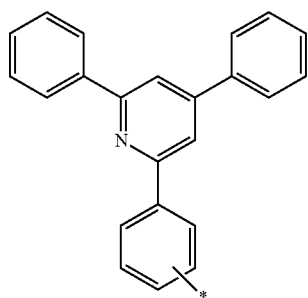
Formula (Ar-26-6)
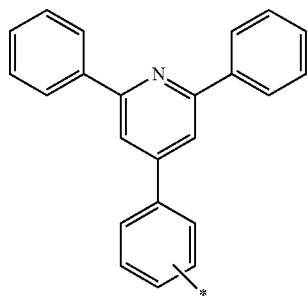

Formula (Ar-27-1)

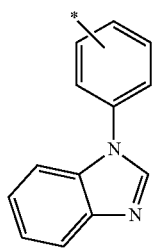

where the symbols correspond to the symbols in formula (Ar-1) to (Ar-26). The formulae may be substituted by $R^4$ at the unoccupied positions.

In a further embodiment of the invention, the $R^2$ and $R^3$ groups are selected from the groups of one of the following formulae (Ar1-1) to (Ar$^1$-7), where the general formulae are replaced by the respective particularly preferred embodiments of one of the following formulae (Ar1-1-1) to (Ar1-6-1) (for example formula (Ar1-1) is replaced by the formulae (Ar1-1-1)):

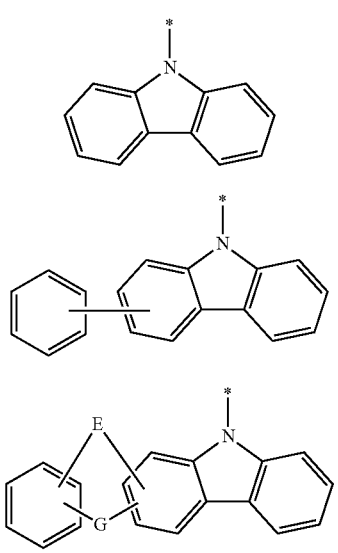

Formula (Ar1-1-1)

Formula (Ar1-2-1)

Formula (Ar1-3-1)

Formula (Ar1-4-1)

Formula (Ar1-4-2)

Formula (Ar1-5-1)

Formula (Ar1-5-2)

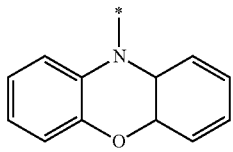

Formula (Ar1-5-3)

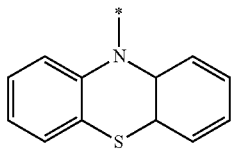

Formula (Ar1-5-4)

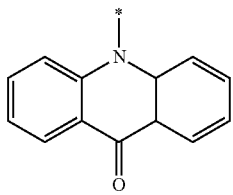

Formula (Ar1-6-1)

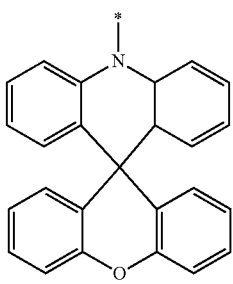

where the symbols correspond to the symbols in the formulae (Ar1-1) to (Ar1-5). The formulae may be substituted by $R^4$ at the unoccupied positions.

In a further embodiment of the invention, the groups of formula (Ar-15) or preferred embodiments thereof are selected from the groups of one of the formulae (Ar-15-1-1a) to (Ar-15-7-6a):

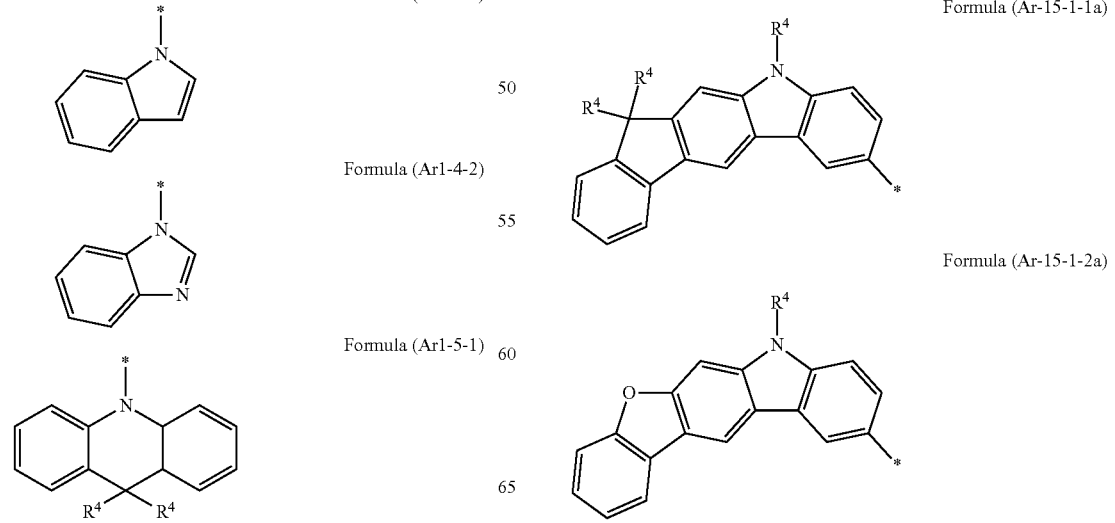

Formula (Ar-15-1-1a)

Formula (Ar-15-1-2a)

Formula (Ar-15-1-3a)
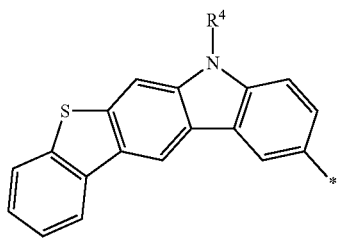
Formula (Ar-15-1-4a)
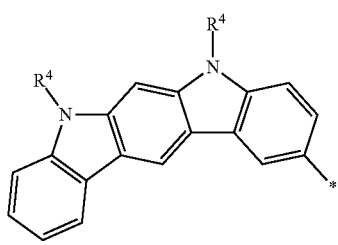
Formula (Ar-15-1-5a)
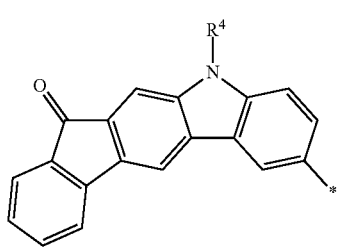
Formula (Ar-15-1-6a)
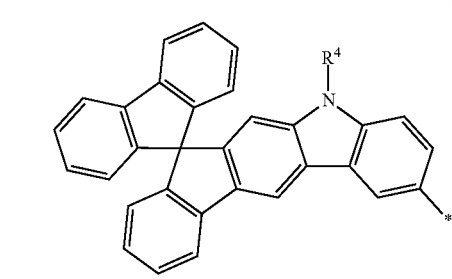
Formula (Ar-15-2-1a)
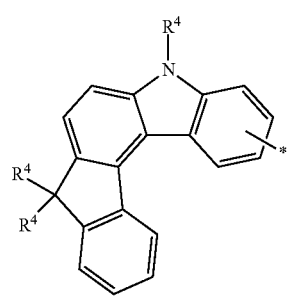
Formula (Ar-15-2-2a)
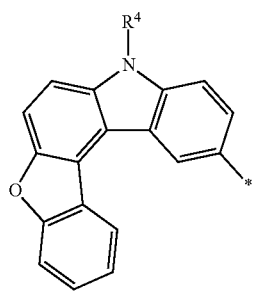
Formula (Ar-15-2-3a)
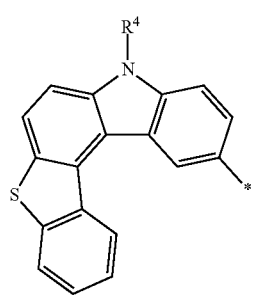
Formula (Ar-15-2-4a)
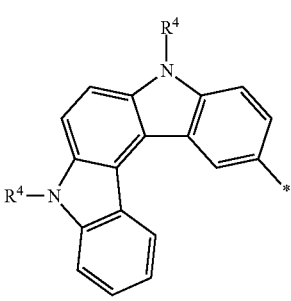
Formula (Ar-15-2-5a)
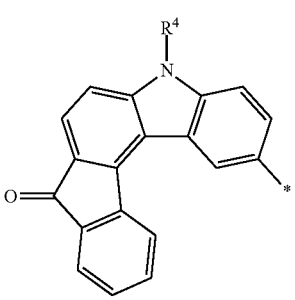
Formula (Ar-15-2-6a)
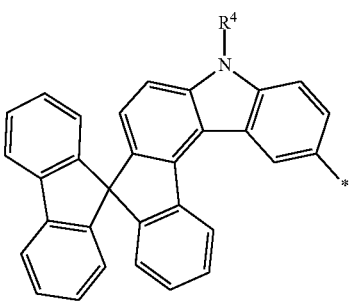

Formula (Ar-15-3-1a)
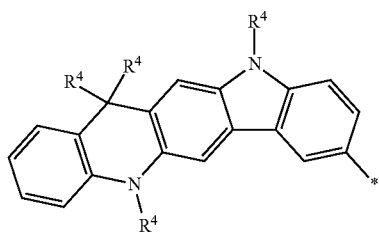
Formula (Ar-15-3-2a)
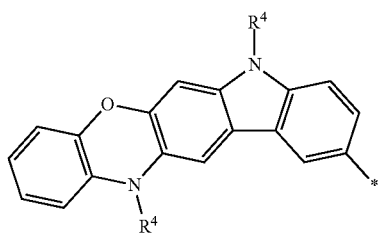
Formula (Ar-15-3-3a)
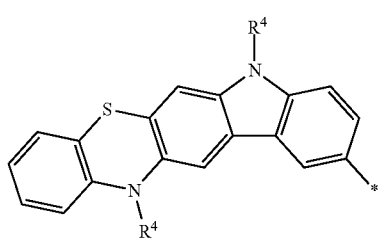
Formula (Ar-15-3-4a)
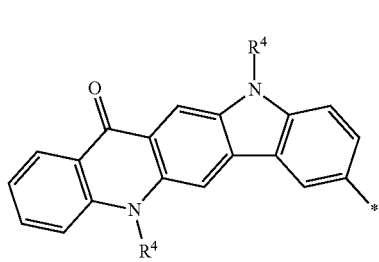
Formula (Ar-15-4-1a)
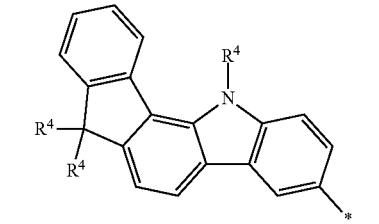
Formula (Ar-15-4-2a)
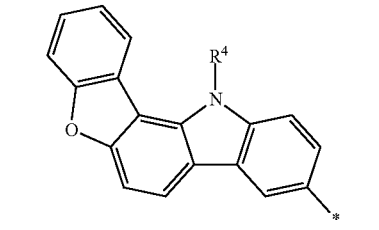
Formula (Ar-15-4-3a)
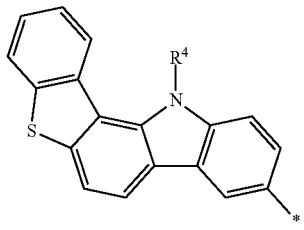
Formula (Ar-15-4-4a)
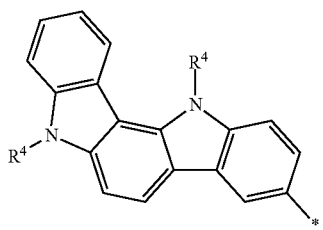
Formula (Ar-15-4-5a)
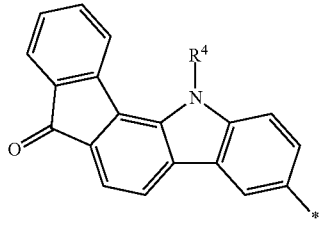
Formula (Ar-15-4-6a)
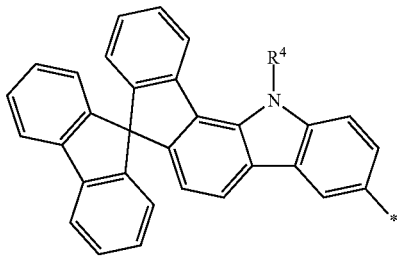
Formula (Ar-15-5-1a)
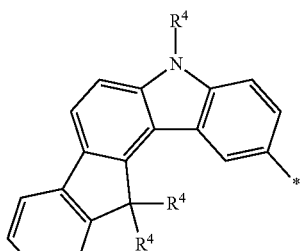
Formula (Ar-15-5-2a)
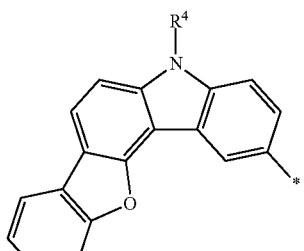

Formula (Ar-15-5-3a)
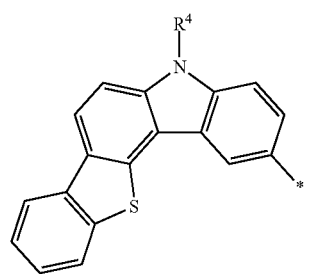
Formula (Ar-15-5-4a)
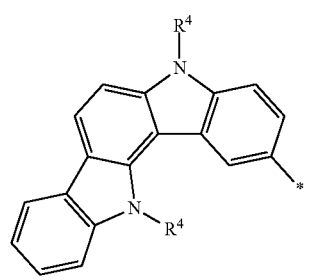
Formula (Ar-15-5-5a)
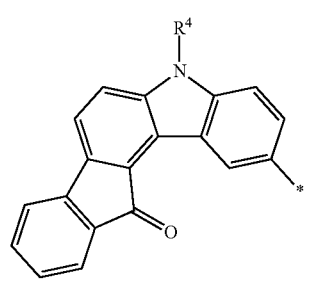
Formula (Ar-15-5-6a)
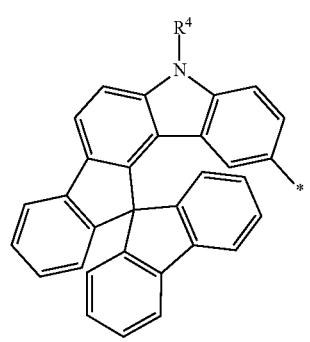
Formula (Ar-15-6-1a)
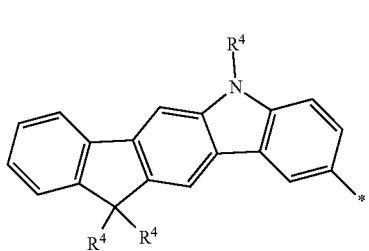
Formula (Ar-15-6-2a)
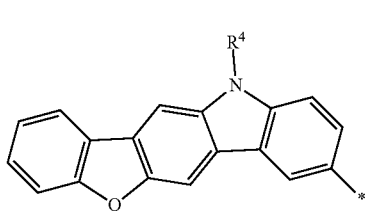
Formula (Ar-15-6-3a)
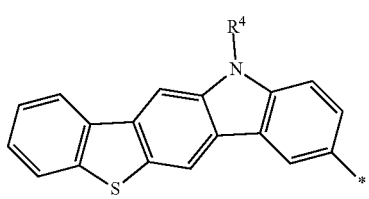
Formula (Ar-15-6-4a)
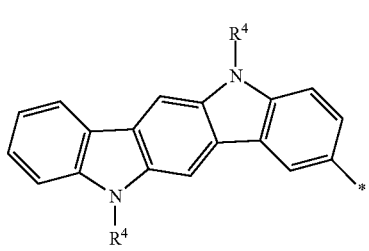
Formula (Ar-15-6-5a)
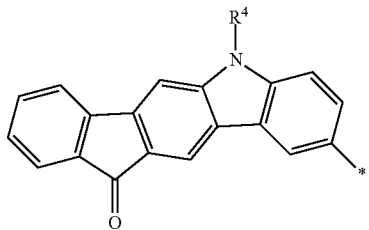
Formula (Ar-15-6-6a)
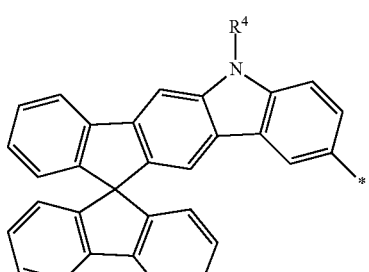
Formula (Ar-15-7-1a)
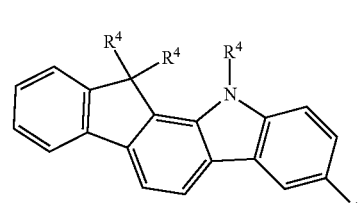
Formula (Ar-15-7-2a)
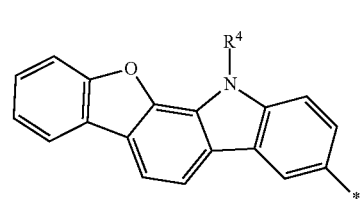
Formula (Ar-15-7-3a)
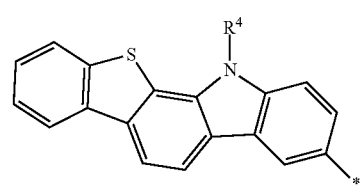

-continued

Formula (Ar-15-7-4a)

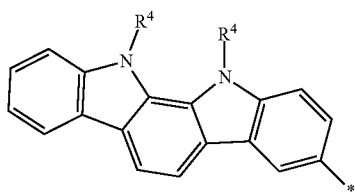

Formula (Ar-15-7-5a)

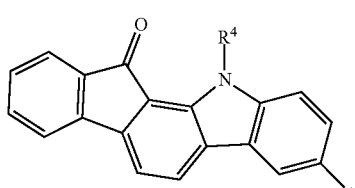

Formula (Ar-15-7-6a)

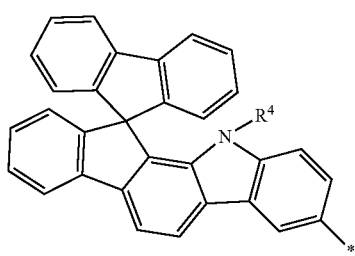

where the symbols correspond to the symbols in formula (Ar-15). The formulae may be substituted by $R^4$ at the unoccupied positions.

In a further embodiment of the invention, the groups of formula (Ar-26-1) or preferred embodiments thereof are selected from the groups of one of the formulae (Ar-26-1-1) to (Ar-26-1-6):

Formula (Ar-26-1-1)

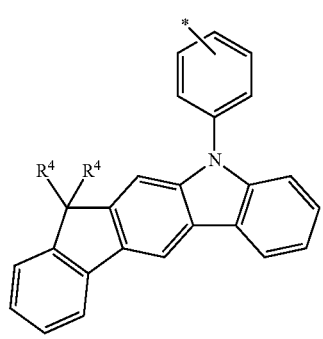

Formula (Ar-26-1-2)

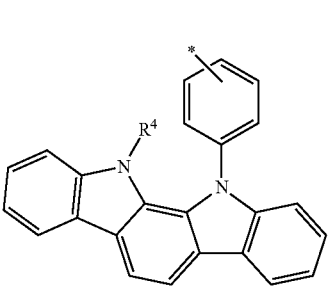

Formula (Ar-26-1-3)

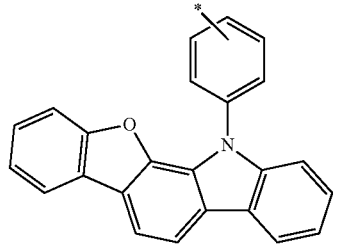

Formula (Ar-26-1-4)

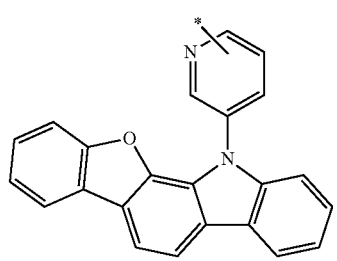

Formula (Ar-26-1-5)

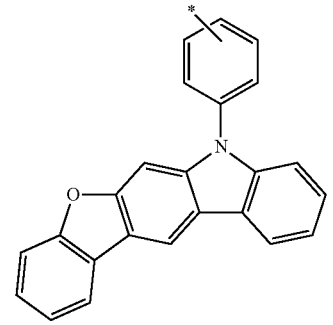

Formula (Ar-26-1-6)

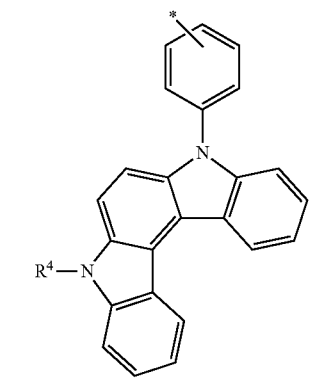

where the symbols correspond to the symbols in formula (Ar-26). The formulae may be substituted by $R^4$ at the unoccupied positions.

If present, L is the same or different at each instance and is preferably a multivalent aromatic or heteroaromatic ring system having 6 to 60 aromatic ring atoms. Preferred L groups comprise one or more structures selected from the group comprising ortho-, meta- or para-benzene, ortho-, meta- or para-biphenyl, terphenyl, especially ortho-, meta- or para-terphenyl, quaterphenyl, especially ortho-, meta- or para-quaterphenyl, fluorene, 9,9'-spirobifluorene, furan, benzofuran, dibenzofuran, dibenzothiophene, pyrrole, indole or carbazole, or combinations of these groups which may be joined to one another by one or more single bonds and/or heteroatoms, preferably selected from N, O and S. These groups may be substituted by one or more $R^4$ radicals, but are preferably unsubstituted.

In a preferred embodiment, L comprises one or more structures selected from the following formulae (Ar2-1) to (Ar2-15):

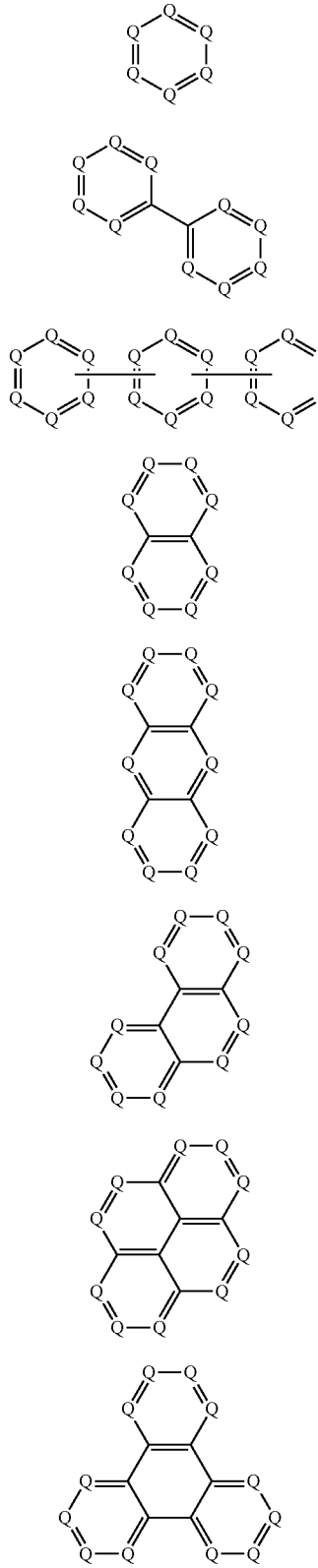

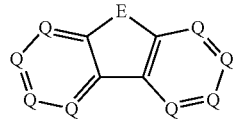
Formula (Ar2-9)

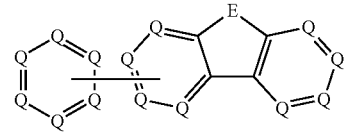
Formula (Ar2-10)

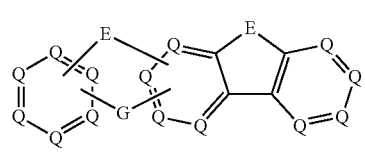
Formula (Ar2-11)

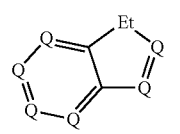
Formula (Ar2-12)

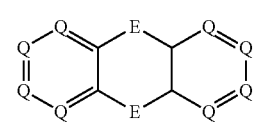
Formula (Ar2-13)

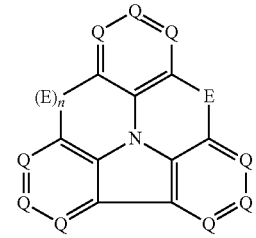
Formula (Ar2-14)

Formula Ar2-15)

where the symbols and indices correspond to the symbols and indices of formula (2) and, in addition:

Q is the same or different at each instance and is $CR^4$ or N, where not more than 3 Q symbols per cycle are N;

E is the same or different at each instance and is $(CR^4)_2$, $NR^4$, O, S or C=O;

G at each instance is a single bond, $(CR^4)_2$, $NR^4$, O, S or C=O;

n is 0 or 1, where n=0 means that no E group is bonded at this position and $R^4$ radicals are bonded to the corresponding carbon atoms instead;

$Ar^2$ is the same or different at each instance and is a bivalent aromatic or heteroaromatic ring system which has 5 to 40 aromatic ring atoms and may be substituted by one or more $R^4$ radicals;

$Ar^1$ are the same or different at each instance and are an aromatic or heteroaromatic ring system which has 6 to 60 aromatic ring atoms and may in each case also be substituted by one or more $R^4$ radicals; where the two $Ar^1$ may be joined and/or $Ar^1$ may be joined to $Ar^2$ via at least one bridge K in each case;

K is the same or different at each instance and is a single bond or a divalent bridge selected from $N(R^4)$, $B(R^4)$, O, C=O, $C(R^4)_2$, $Si(R^4)_2$ and S; and where, if two or more structures are present, the individual structures are joined to one another by one or more single bonds, NR$^4$, O or S; and where L has, at n+m positions, a single bond to the quinazolinone base skeleton according to the formula (2).

Preferably, this single bond to the quinazolinone base skeleton replaces a substitution by R$^4$ at the respective position.

In a preferred embodiment, L comprises 1, 2, 3, 4, 5, 6, 7, 8 or 9 structures selected from the formulae (Ar2-1) to (Ar2-15).

In a preferred embodiment, L comprises 1, 2 or 3 structures selected from the formulae (Ar2-1) to (Ar2-10).

In a preferred embodiment of the invention, m+n is a value of 2 to 6, preferably of 2 to 5, more preferably of 2 to 4.

In a further embodiment of the invention, the formulae (Ar2-1) to (Ar2-15) are replaced by their preferred embodiments from the formulae (Ar2-1-1) to (Ar2-9-5):

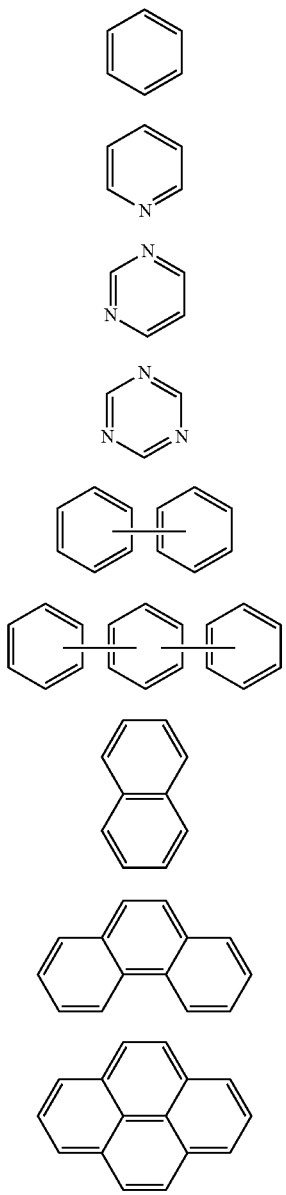

Formula (Ar2-1-1)

Formula (Ar2-1-2)

Formula (Ar2-1-3)

Formula (Ar2-1-4)

Formula (Ar2-2-1)

Formula (Ar2-3-1)

Formula (Ar2-4-1)

Formula (Ar2-6-1)

Formula (Ar2-7-1)

-continued

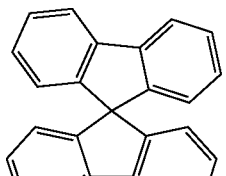

Formula (Ar2-9-1)

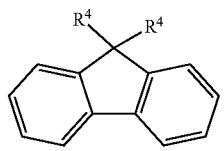

Formula (Ar2-9-2)

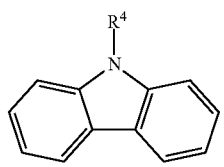

Formula (Ar2-9-3)

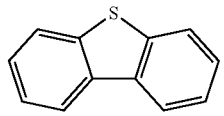

Formula (Ar2-9-4)

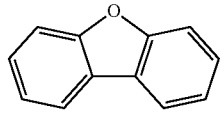

Formula (Ar2-9-5)

where the symbols used correspond to the symbols for the formulae (Ar2-1) to (Ar2-15). The groups may be substituted by R$^4$ at the unoccupied positions. They are preferably unsubstituted. The groups have, at n+m positions, a single bond to the quinazolinone base skeleton. At the same time, m+n must not exceed the number of substitutable positions of L. For instance, the formula (Ar2-1-4) has up to three unoccupied positions.

In a further embodiment of the invention, the Ar$^2$ group in formula (Ar-22) comprises one or more of the structures of the formulae (Ar2-1) to (Ar2-15), preferably (Ar2-1) to (Ar2-14), or the preferred embodiments thereof, where the symbols and indices correspond to the symbols and indices of the formulae (Ar2-1) to (Ar2-15), and, in the case of two or more structures, these are joined to one another via one or more single bonds or heteroatoms, such as O, NR$^4$ or S. The structures may be substituted by R$^4$ at unoccupied positions. Ar$^2$ is a divalent group. This means that it has a single bond to the quinazolinone base skeleton and a bond to the N of the formula (Ar-22). The bond to the N of the formula (Ar-22) is preferably a C—N single bond.

In a further embodiment of the invention, the Ar$^1$ groups in formula (Ar-22) are selected from one of the structures of the formula (Ar-1) to (Ar-25) or the preferred embodiments thereof, where the symbols and indices correspond to the symbols and indices of the formulae (Ar-1) to (Ar-25), and, in addition, * represents the bond to the N of the formula (Ar-22).

In a further embodiment of the invention, R$^1$ and R$^2$ are the same or different at each instance and are a straight-chain alkyl, alkoxy or thioalkoxy group having 1 to 40 carbon atoms or a branched or cyclic alkyl, alkoxy or thioalkoxy group having 3 to 40 carbon atoms, each of which may be substituted by one or more $R^4$ radicals, where one or more nonadjacent $CH_2$ groups may be replaced by C≡C, $Si(R^4)_2$, $Ge(R^4)_2$, $Sn(R^4)_2$, C=O, C=S, C=Se, P(=O)($R^4$), SO, $SO_2$, O, S or $CONR^4$ and where one or more hydrogen atoms may be replaced by D, F, Cl, Br, I, CN or $NO_2$, or an aromatic or heteroaromatic ring system which has 5 to 60 aromatic ring atoms, each of which may be substituted by one or more $R^4$ radicals, or an aryloxy or heteroaryloxy group which has 5 to 60 aromatic ring atoms and may be substituted by one or more $R^4$ radicals, or a combination of these systems; at the same time, two or more $R^1$ substituents may also form a mono- or polycyclic, aliphatic or aromatic ring system with one another;

In a preferred embodiment of the invention, $R^1$ and $R^2$ are the same or different at each instance and are an aromatic or heteroaromatic ring system which has 5 to 60 aromatic ring atoms and may be substituted in each case by one or more $R^4$ radicals, or an aryloxy or heteroaryloxy group which has 5 to 60 aromatic ring atoms and may be substituted by one or more $R^4$ radicals, or a combination of these systems; at the same time, two or more $R^1$ substituents together may also form a mono- or polycyclic, aliphatic or aromatic ring system.

In a preferred embodiment of the invention, $R^1$ is the same or different at each instance and is a structure selected from the formulae (Ar-1) to (Ar-27) or the preferred embodiments thereof and $R^2$ is the same or different at each instance and is a structure selected from the formulae (Ar-1) to (Ar-27) and (Ar1-1) to (Ar1-7) or the respective preferred embodiments.

In a preferred embodiment of the invention, $R^3$ is the same or different at each instance and is selected from the group consisting of H, D, F, $Si(R^4)_3$, CN, a straight-chain alkyl or alkoxy group having 1 to 10 carbon atoms or a branched or cyclic alkyl or alkoxy group having 3 to 10 carbon atoms, each of which may be substituted by one or more $R^3$ radicals, where one or more nonadjacent $CH_2$ groups may be replaced by O and where one or more hydrogen atoms may be replaced by D or F, an aromatic or heteroaromatic ring system which has 6 to 60 aromatic ring atoms and may be substituted in each case by one or more $R^4$ radicals, where two or more adjacent $R^3$ substituents may optionally form a mono- or polycyclic aliphatic ring system which may be substituted by one or more $R^4$ radicals.

In a particularly preferred embodiment of the invention, $R^3$ is the same or different at each instance and is selected from the group consisting of H, D, F, a straight-chain alkyl group having 1 to 10 carbon atoms or a branched or cyclic alkyl group having 3 to 10 carbon atoms, each of which may be substituted by one or more $R^4$ radicals, an aromatic or heteroaromatic ring system which has 6 to 60 carbon atoms and may be substituted in each case by one or more $R^4$ radicals, where two or more adjacent $R^3$ substituents may optionally form a mono- or polycyclic, aliphatic ring system which may be substituted by one or more $R^4$ radicals.

In a preferred embodiment, $R^3$ in the case of an aromatic or heteroaromatic ring system is a structure selected from the formulae (Ar-1) to (Ar-27) and (Ar1-1) to (Ar1-7) or the respective preferred embodiments.

In a preferred embodiment of the invention, $R^4$ in the case of an aromatic or heteroaromatic ring system is a structure selected from the formulae (Ar-1) to (Ar-27) and (Ar1-1) to (Ar1-7) or the respective preferred embodiments, where, in addition:

Q is the same or different at each instance and is $CR^5$ or N, where not more than 3 Q symbols per cycle are N;

E is the same or different at each instance and is $(CR^5)_2$, $NR^5$, O, S or C=O;

G at each instance is a single bond, $(CR^5)_2$, $NR^5$, O, S or C=O;

n is 0 or 1, where n=0 means that no E group is bonded at this position and $R^5$ radicals are bonded to the corresponding carbon atoms instead;

$Ar^2$ is the same or different at each instance and is a divalent aromatic or heteroaromatic ring system which has 5 to 60 aromatic ring atoms and may be substituted by one or more $R^5$ radicals;

$Ar^1$ are the same or different at each instance and are an aromatic or heteroaromatic ring system which has 6 to 60 aromatic ring atoms and may in each case also be substituted by one or more $R^5$ radicals; where the two $Ar^1$ may be joined and/or $Ar^1$ may be joined to $Ar^2$ via at least one bridge K in each case;

K is the same or different at each instance and is a single bond or a divalent bridge selected from $N(R^5)$, $B(R^5)$, O, C=O, $C(R^5)_2$, $Si(R^5)_2$ and S; and

* represents the bond to the substituted position.

In a further preferred embodiment, $R^4$ which binds to a carbon bridge in an aromatic or heteroaromatic ring system, as, for example, in the formulae (Ar-12-1), (Ar-12-2), (Ar-12-3), (Ar-12-4), (Ar-13-1), (Ar-13-2), (Ar-13-3), (Ar-13-4), (Ar1-1-5-1), (Ar-15-3-1a) or (Ar2-9-2), is the same or different at each instance and is selected from the group consisting of a straight-chain alkyl group having 1 to 10 carbon atoms, a branched or cyclic alkyl group having 3 to 10 carbon atoms or an aromatic ring system having 6 to 30 carbon atoms which is as defined above and which may be substituted by one or more $R^5$ radicals. At the same time, the two $R^4$ groups may also form a ring system with one another, which may be aliphatic or, in addition to the definition of $R^4$ given above, may also be aromatic. Ring formation forms a Spiro system.

In a further preferred embodiment, $R^4$ which binds to a nitrogen atom is selected from the group consisting of a straight-chain alkyl group having 1 to 10 carbon atoms, a branched or cyclic alkyl group having 3 to 10 carbon atoms or an aromatic ring system having 6 to 60 carbon atoms, especially an aromatic ring system having 6 to 60 carbon atoms which is as defined above and which may be substituted by one or more $R^5$ radicals.

In a further preferred embodiment of the invention, the bonds from L to the quinazolinone base skeletons are the same or different at each instance and are each selected from the group comprising a C—C, C—N or N—C bond.

Preferred combinations of the $R^1$ and $R^2$ radicals for the formulae (1) and (2) are given by the following table:

| Compound | $R^1$ | $R^2$ |
| --- | --- | --- |
| 1-1 | (Ar-1) | (Ar-4) |
| 1-2 | (Ar-4) | (Ar-1) |
| 1-3 | (Ar-12) | (Ar-1) |
| 1-4 | (Ar-1) | (Ar-12) |
| 1-5 | (Ar-2) | (Ar-12) |
| 1-6 | (Ar-12) | (Ar-2) |
| 1-7 | (Ar-2) | (Ar-1) |
| 1-8 | (Ar-1) | (Ar-2) |
| 1-9 | (Ar-11) | (Ar-1) |
| 1-10 | (Ar-1) | (Ar-11) |
| 1-11 | (Ar-1) | (Ar-1) |
| 1-12 | (Ar-2) | (Ar-2) |
| 1-13 | (Ar-12) | (Ar-12) |
| 1-14 | (Ar-8) | (Ar-1) |
| 1-15 | (Ar-1) | (Ar-8) |

-continued

| Compound | R¹ | R² |
|---|---|---|
| 1-16 | (Ar-1) | (Ar-13) |
| 1-17 | (Ar-13) | (Ar-1) |
| 1-18 | (Ar-23) | (Ar-1) |
| 1-19 | (Ar-1) | (Ar-23) |
| 1-20 | (Ar-23) | (Ar-23) |
| 1-21 | (Ar-24) | (Ar-24) |
| 1-22 | (Ar-25) | (Ar-25) |
| 1-23 | (Ar-23) | (Ar-25) |
| 1-24 | (Ar-25) | (Ar-23) |
| 1-25 | (Ar-24) | (Ar-25) |
| 1-26 | (Ar-25) | (Ar-24) |
| 1-27 | (Ar-13) | (Ar-13) |
| 1-28 | (Ar-1) | (Ar-25) |
| 1-29 | (Ar-25) | (Ar-1) |
| 1-30 | (Ar-24) | (Ar-1) |
| 1-31 | (Ar-1) | (Ar-24) |
| 1-32 | (Ar-22) | (Ar-1) |
| 1-33 | (Ar-1) | (Ar-22) |

For compounds of the formula (2), preference is given to the following combinations:

| Compound | L | m | n |
|---|---|---|---|
| 2-1 | (Ar2-2) | 2 | 0 |
| 2-2 | (Ar2-2) | 0 | 2 |
| 2-3 | (Ar2-2) | 1 | 1 |
| 2-4 | (Ar2-9) | 2 | 0 |
| 2-5 | (Ar2-9) | 0 | 2 |
| 2-6 | (Ar2-9) | 1 | 1 |
| 2-7 | (Ar2-1) | 0 | 3 |
| 2-8 | (Ar2-1) | 3 | 0 |

The abovementioned embodiments may be combined with one another as desired. More particularly, it is preferable to combine the preferred embodiments detailed above with one another.

Examples of preferred compounds of the above-detailed embodiments as usable with preference in organic electronic devices are the following compounds:

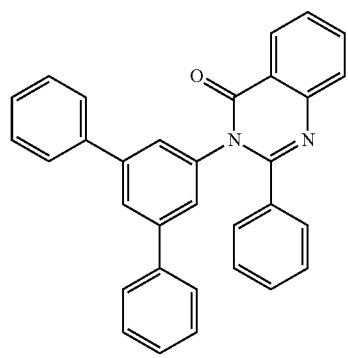

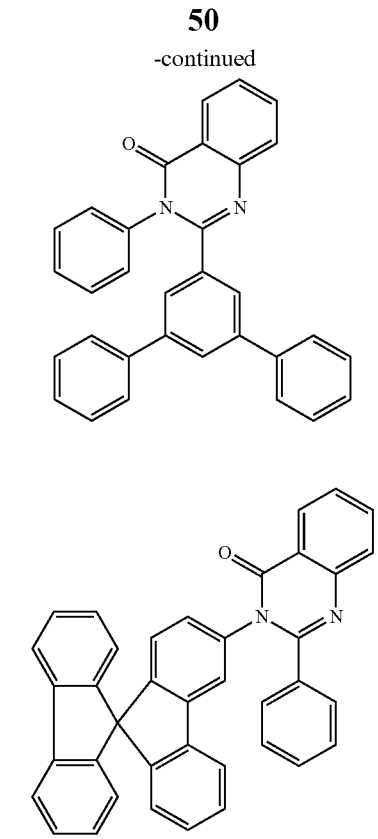

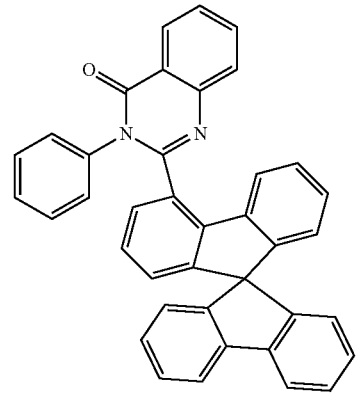

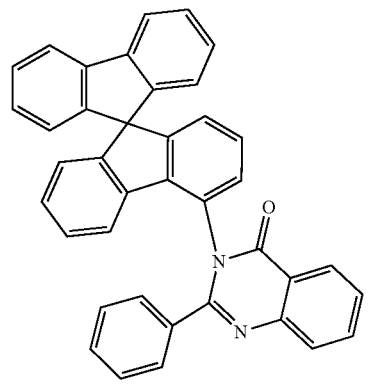

51
-continued
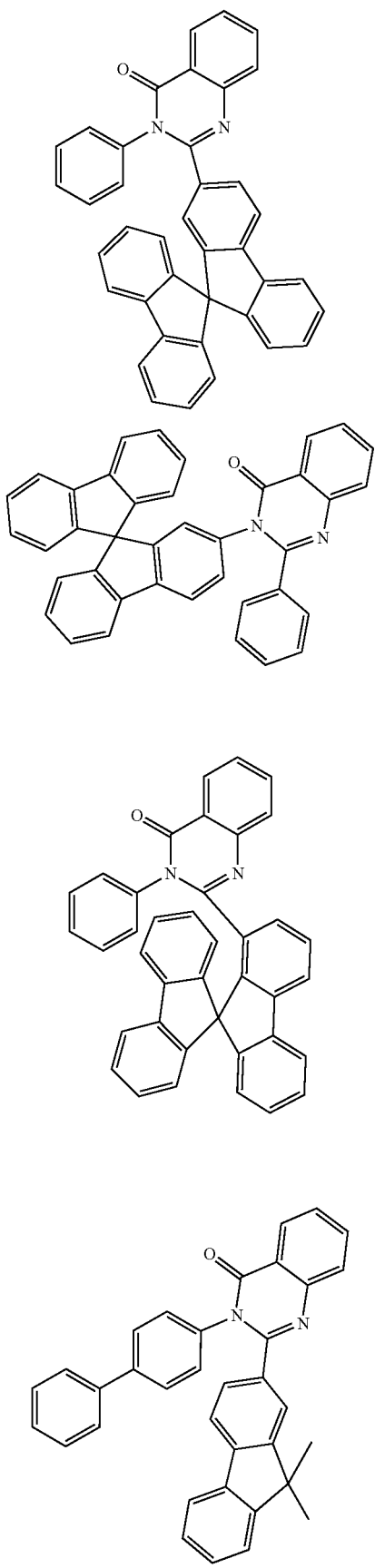
52
-continued
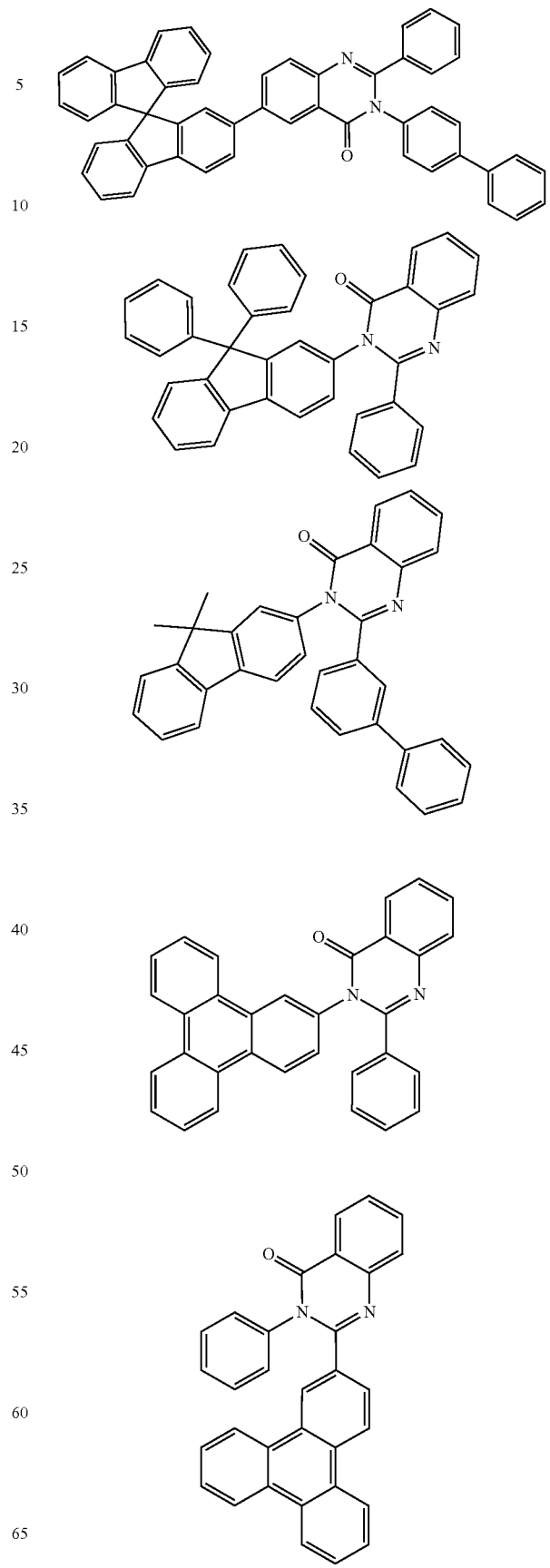

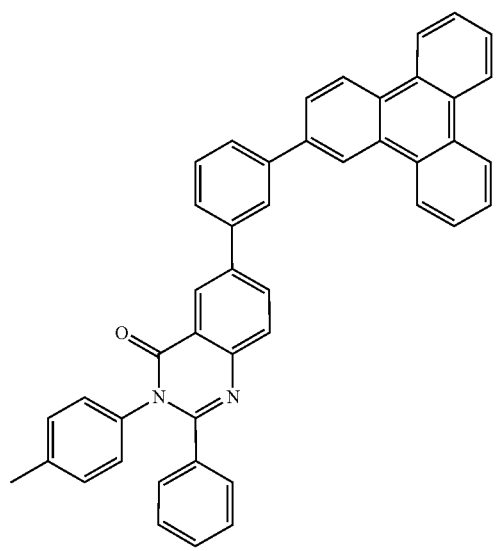
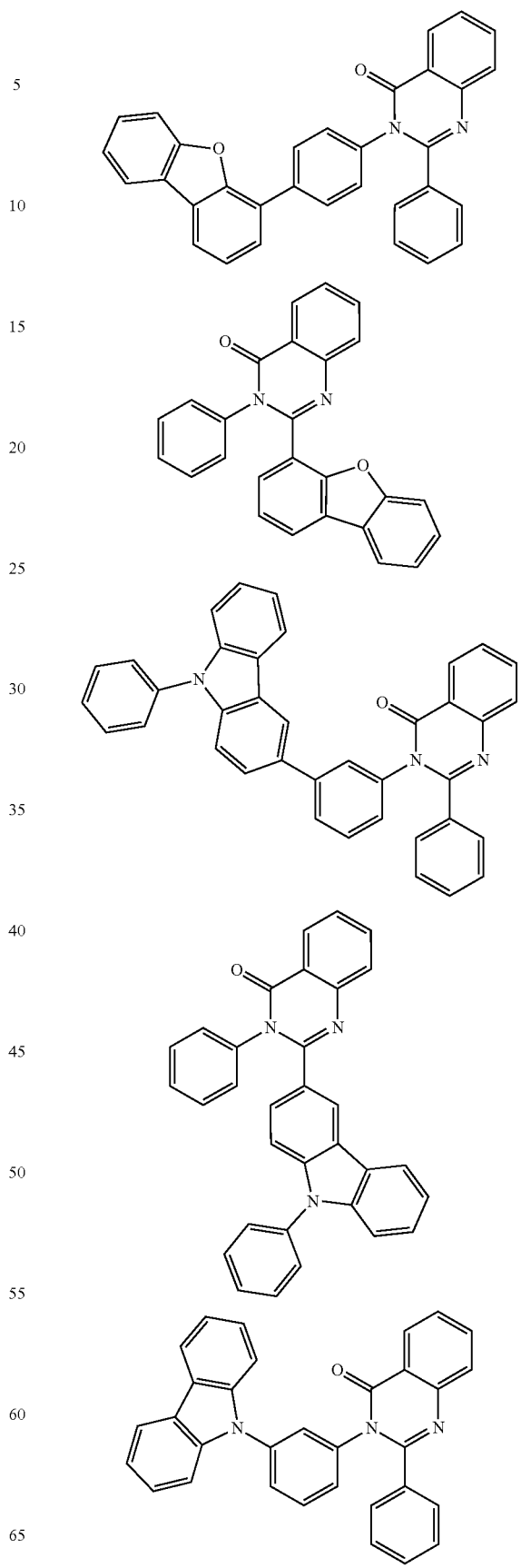

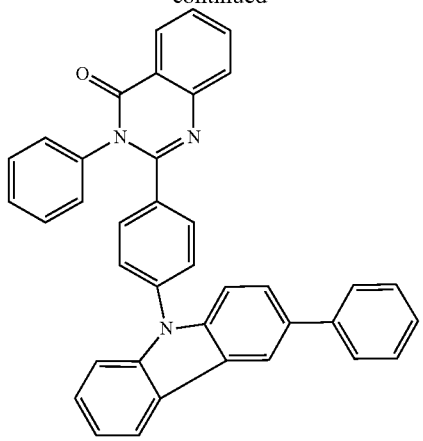
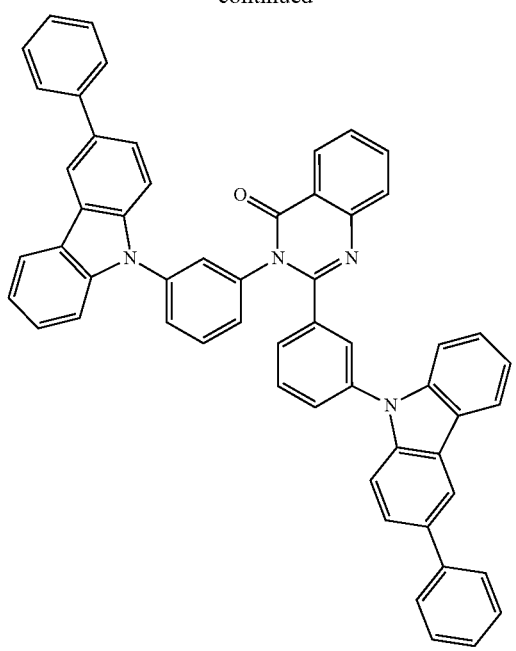
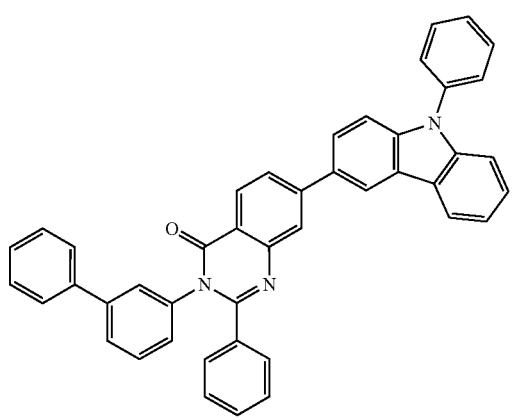
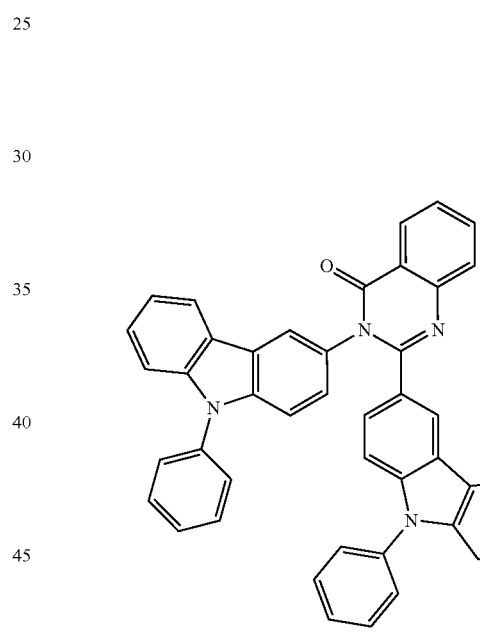
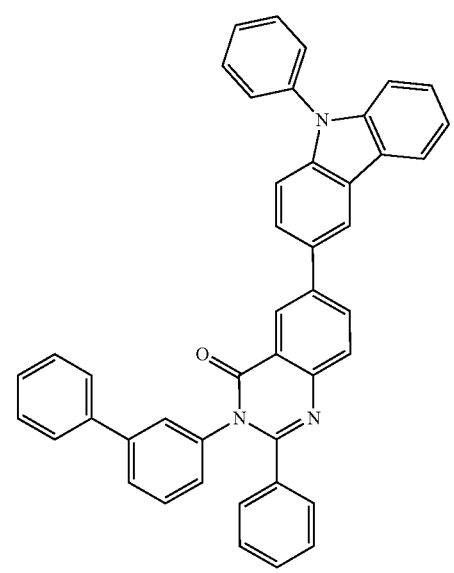
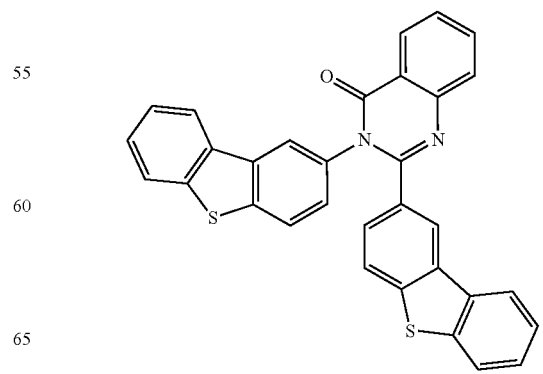

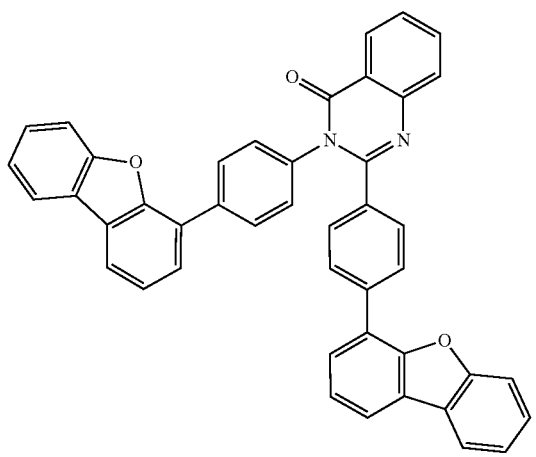
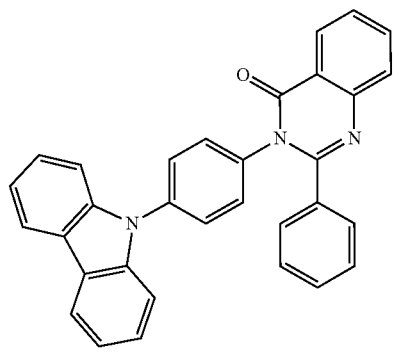
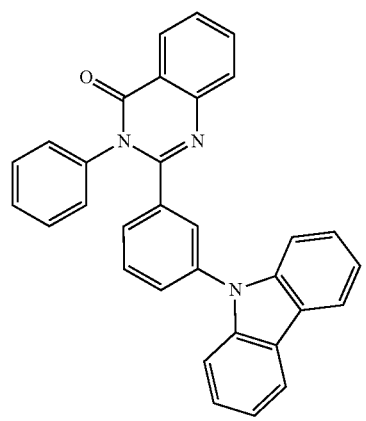
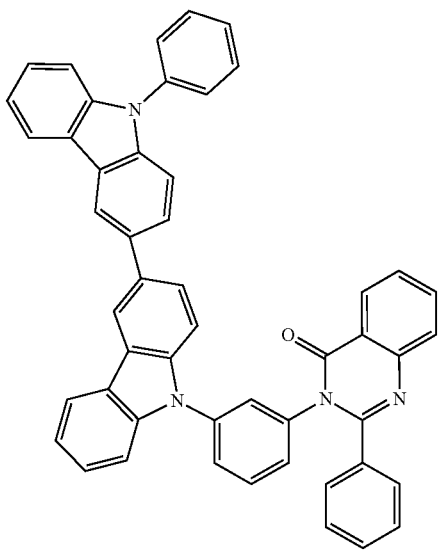
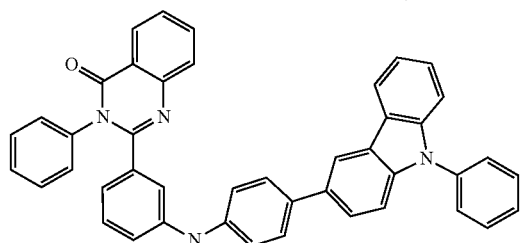
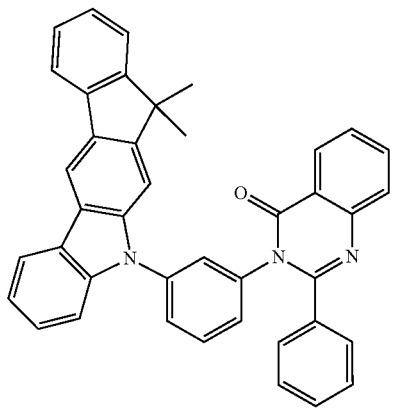
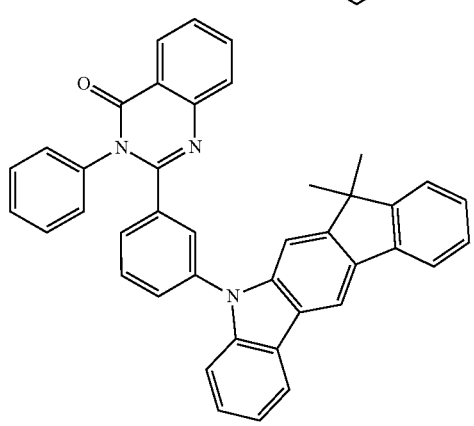

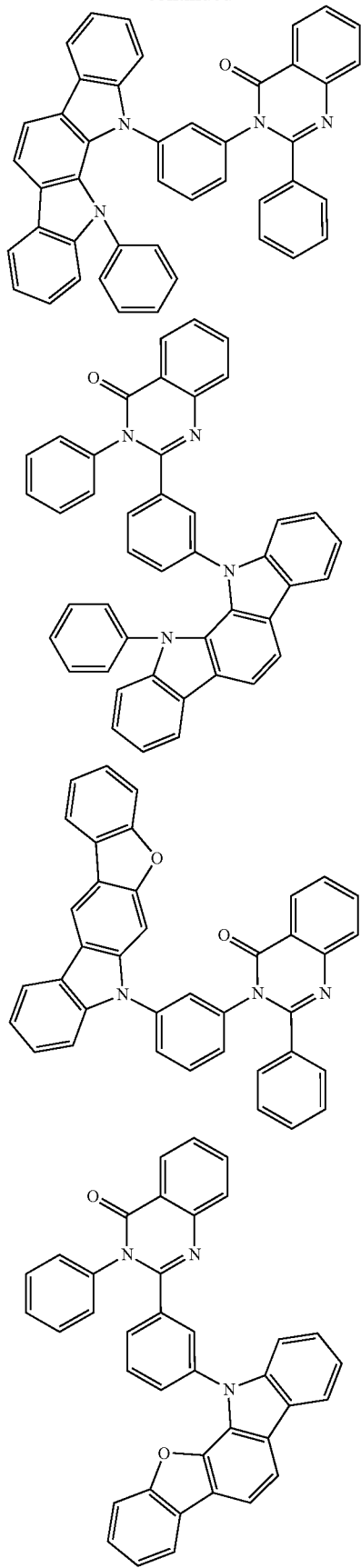
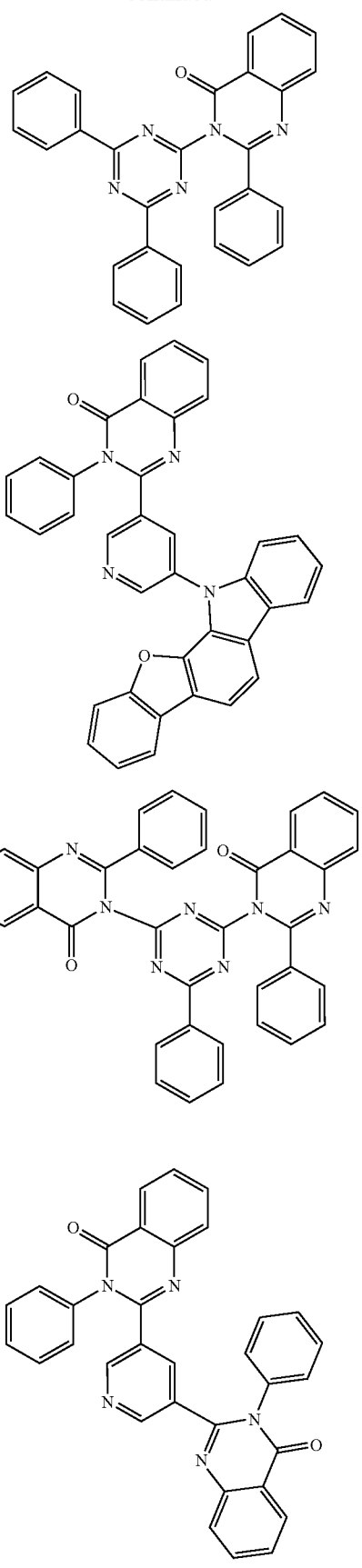

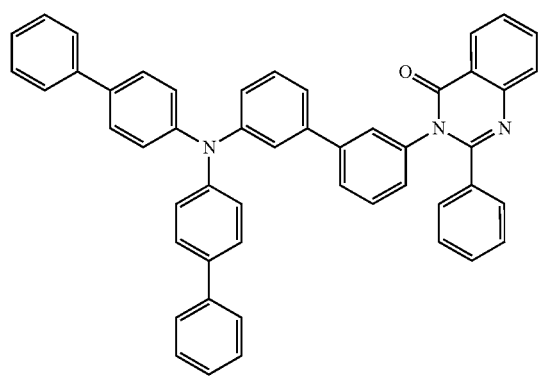
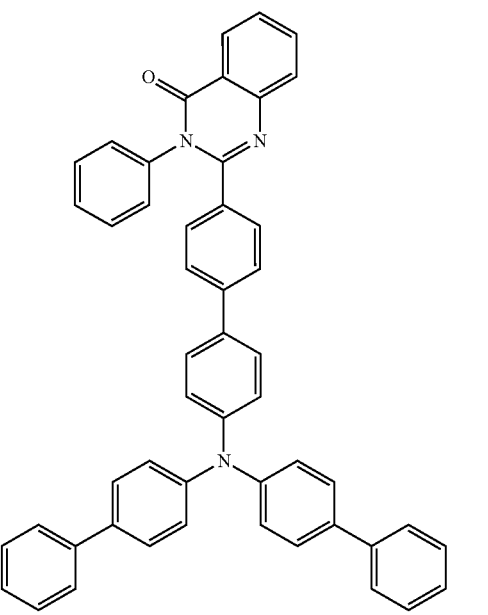
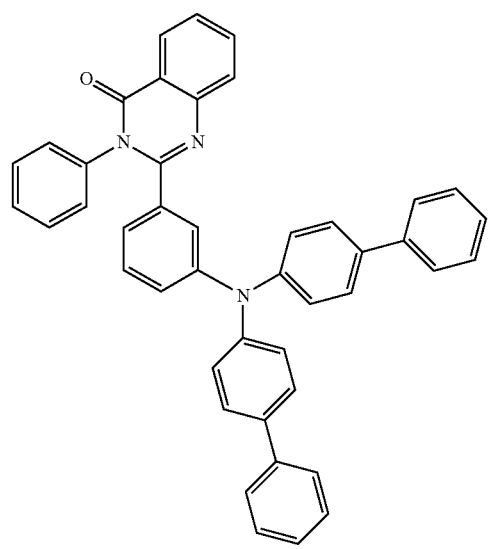
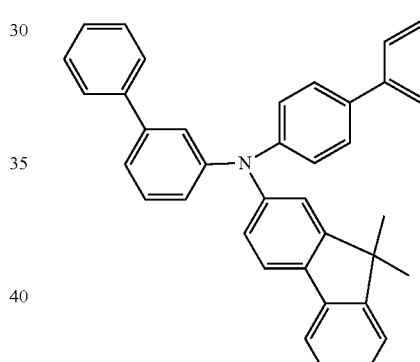
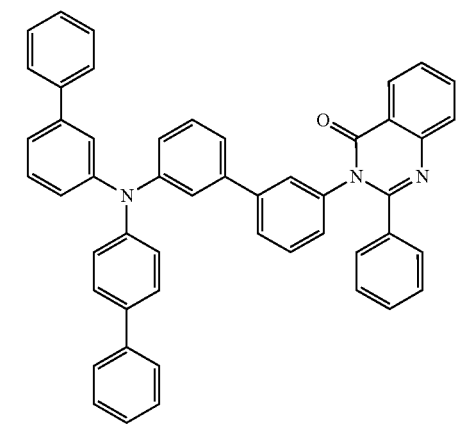
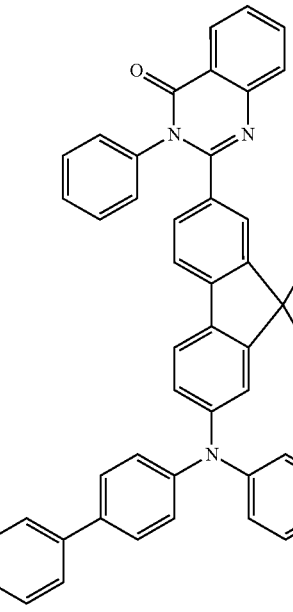

-continued
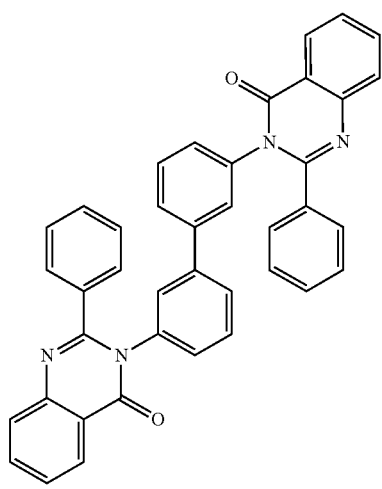
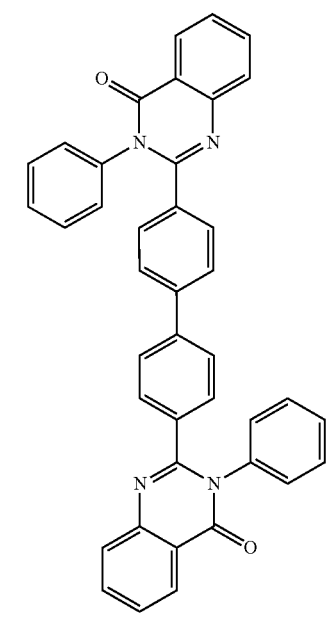
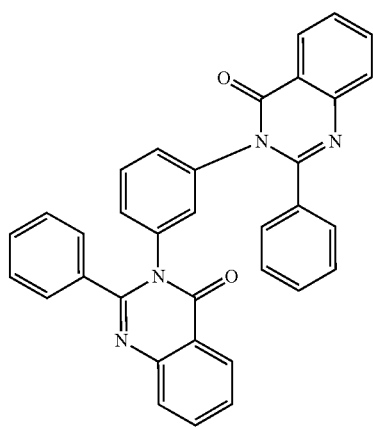
-continued
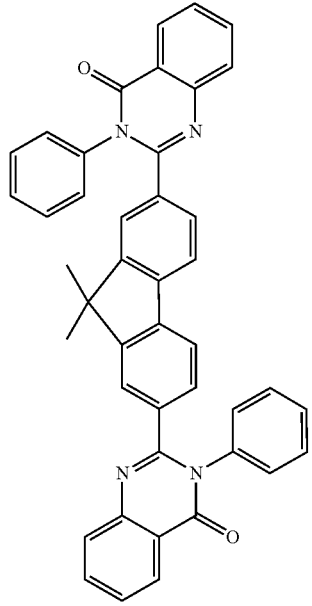
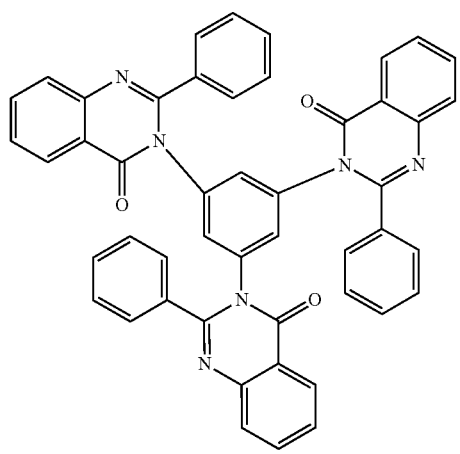
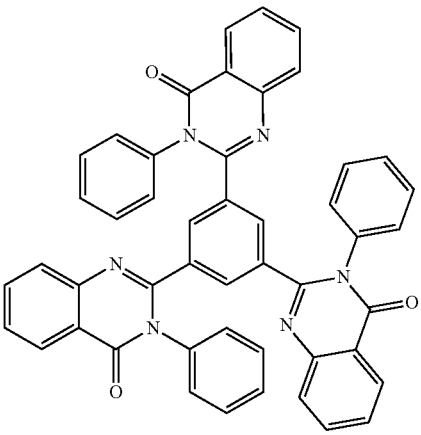

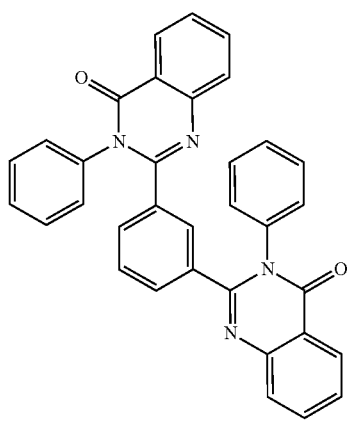
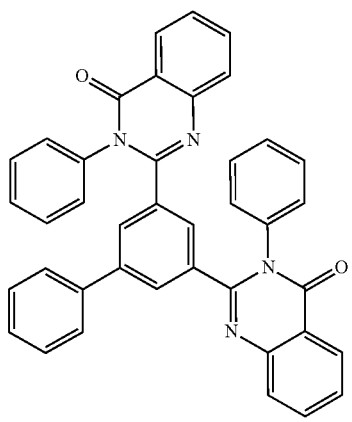
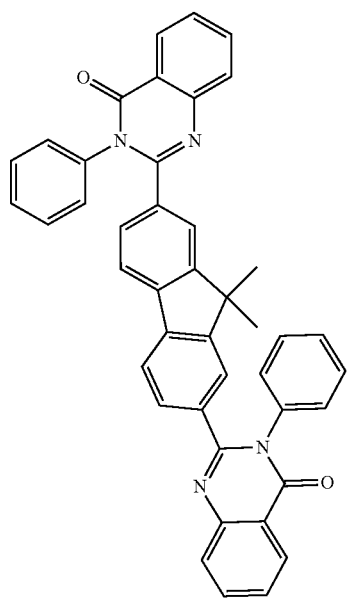
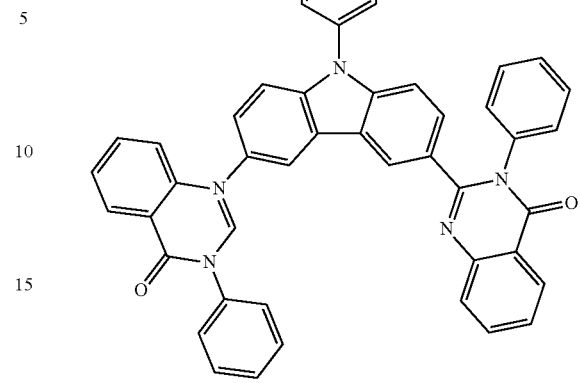
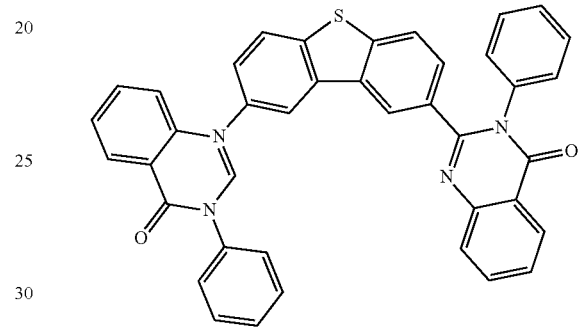
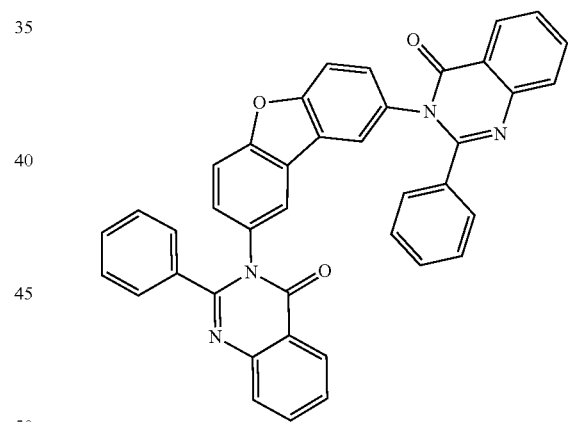
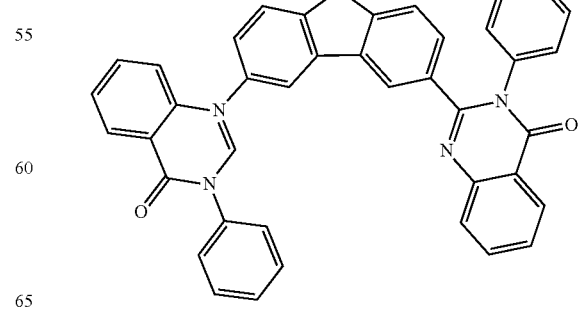

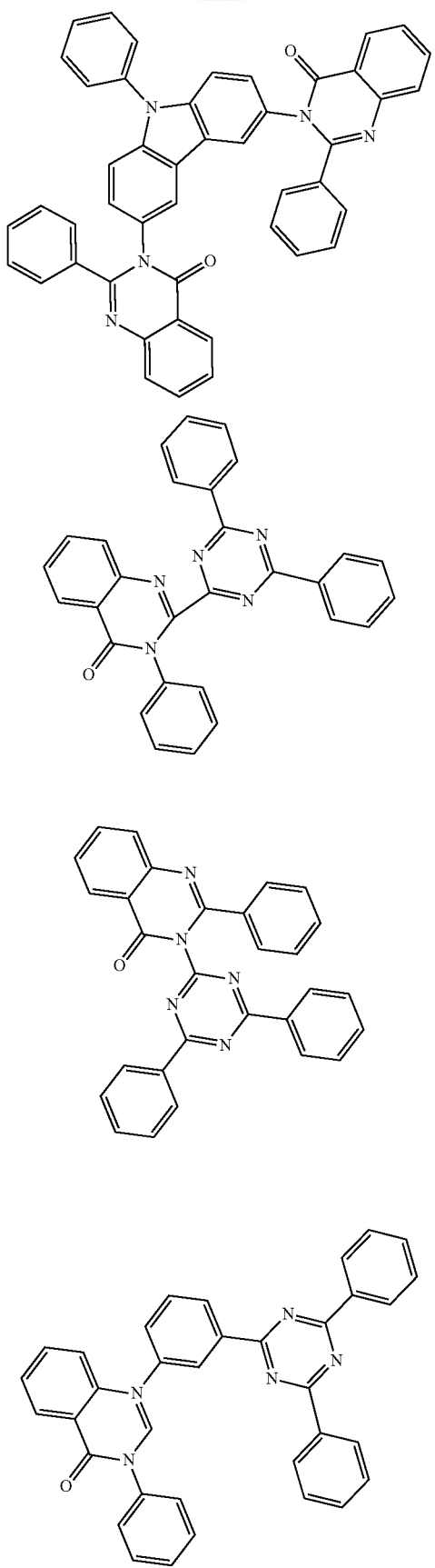
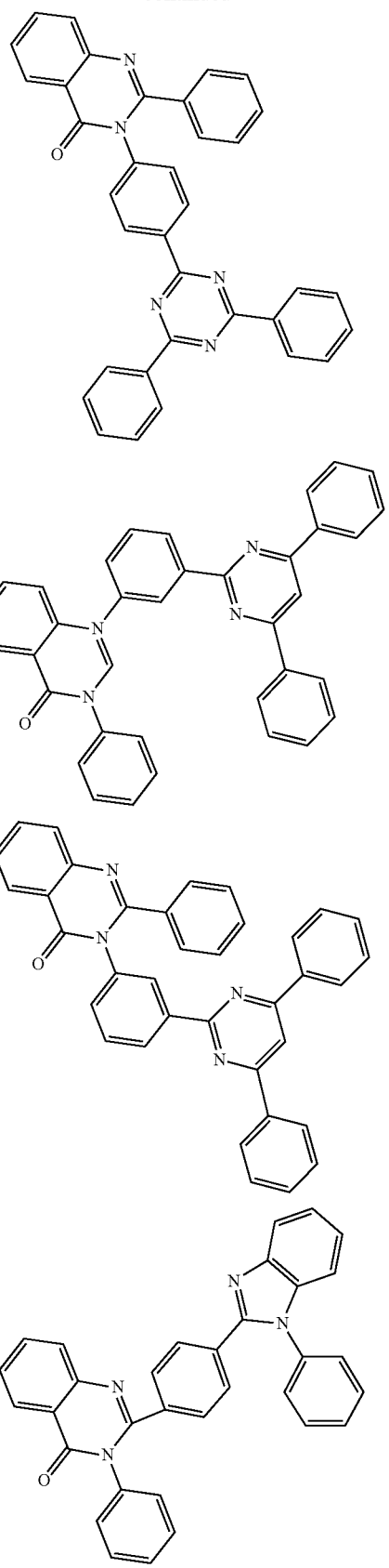

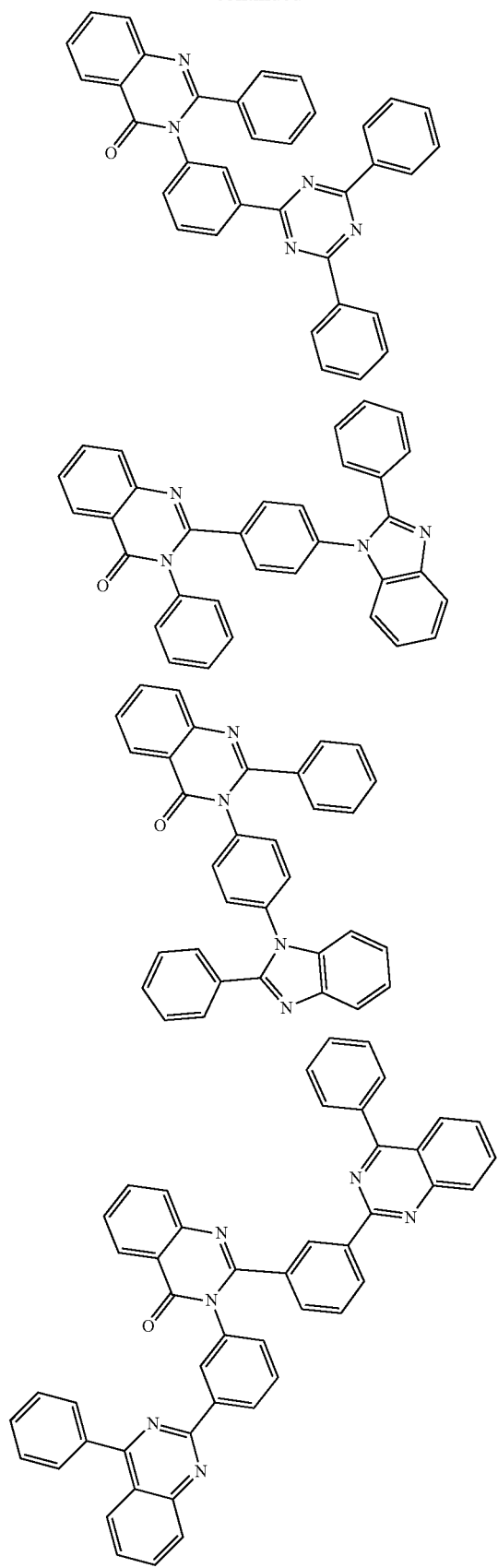
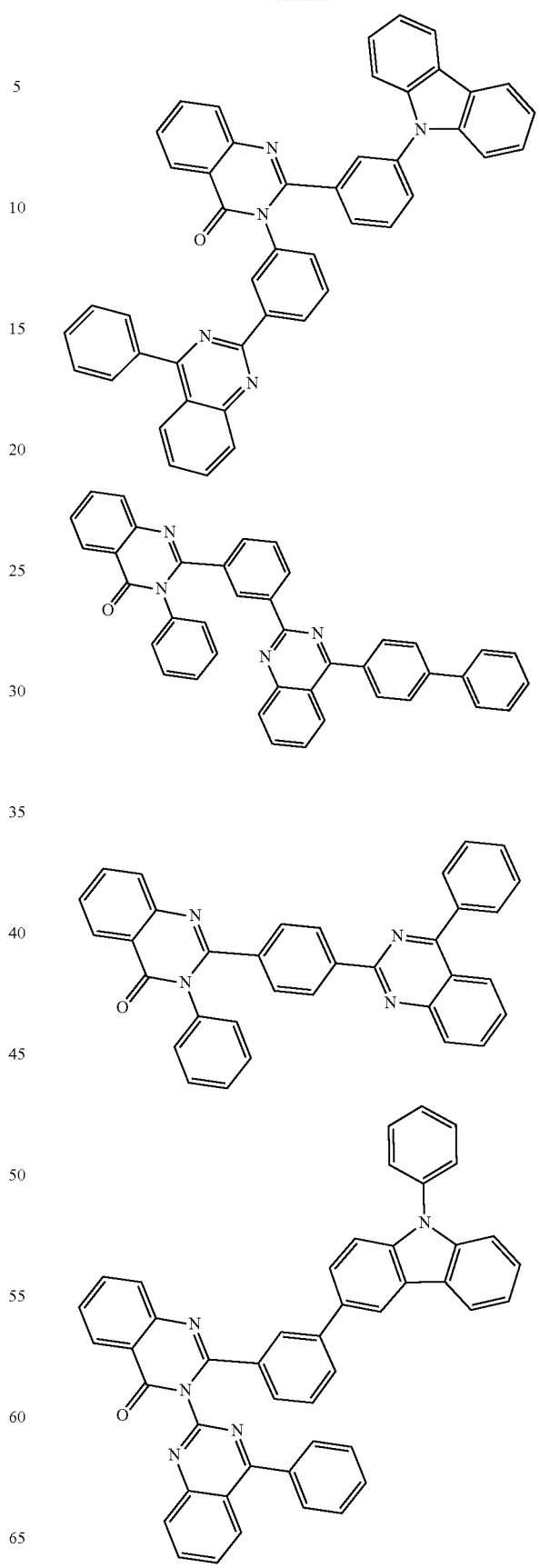

71
-continued
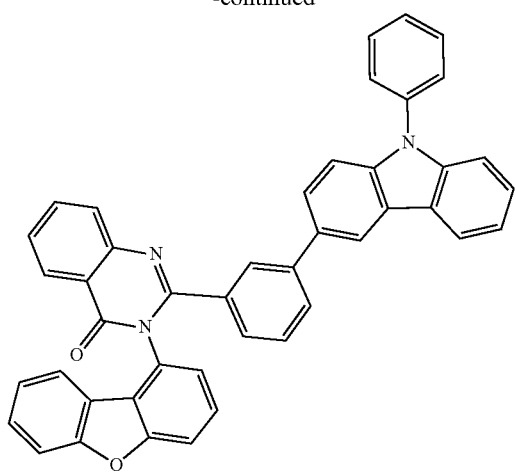
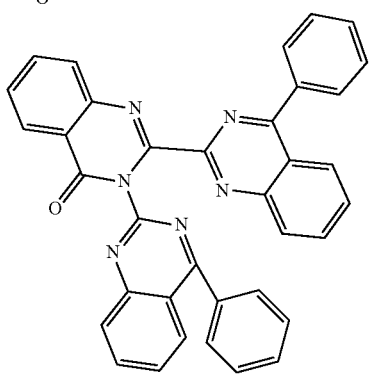
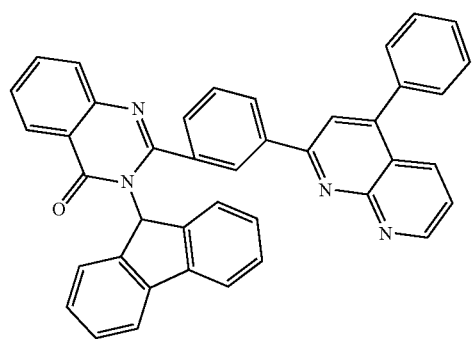
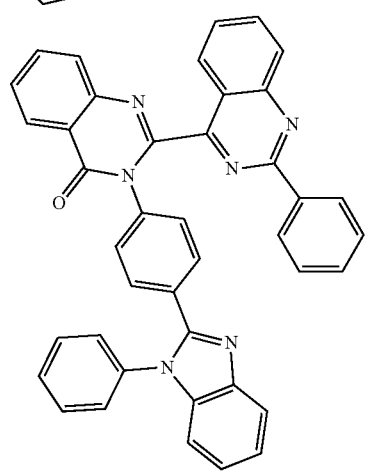
72
-continued
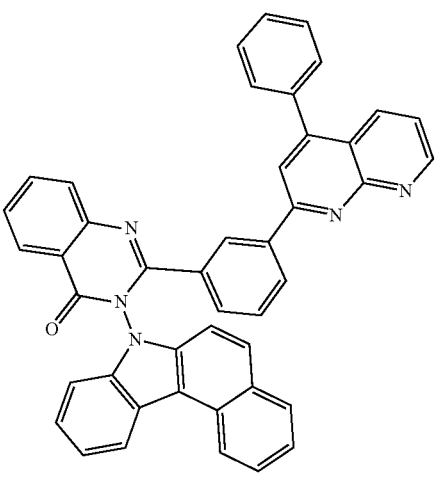
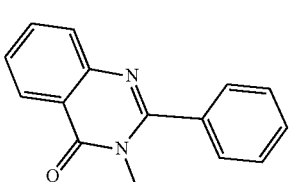
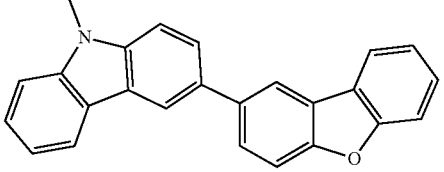
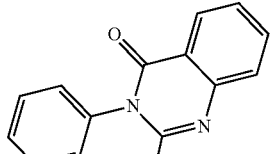
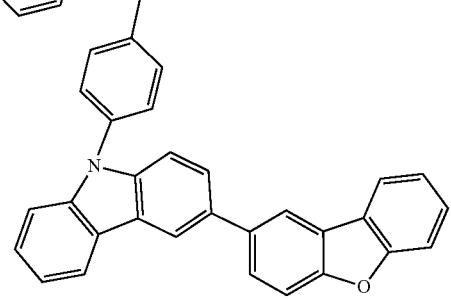

73
-continued
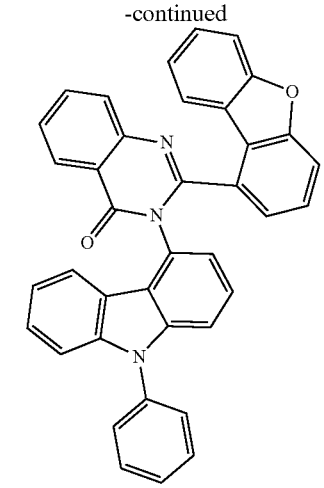
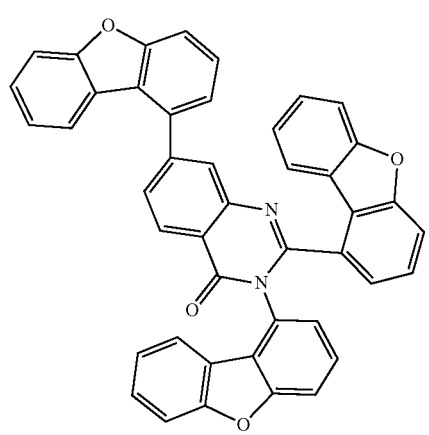
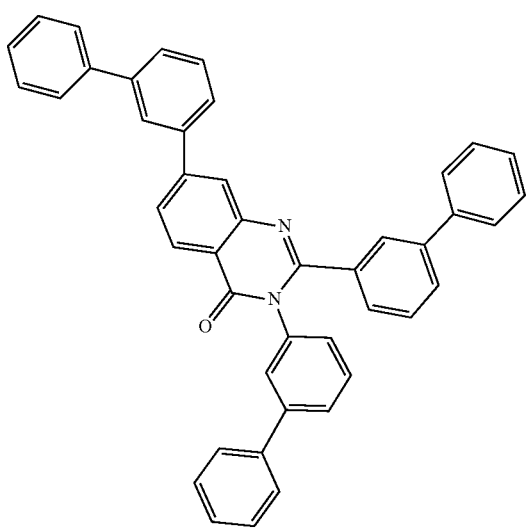
74
-continued
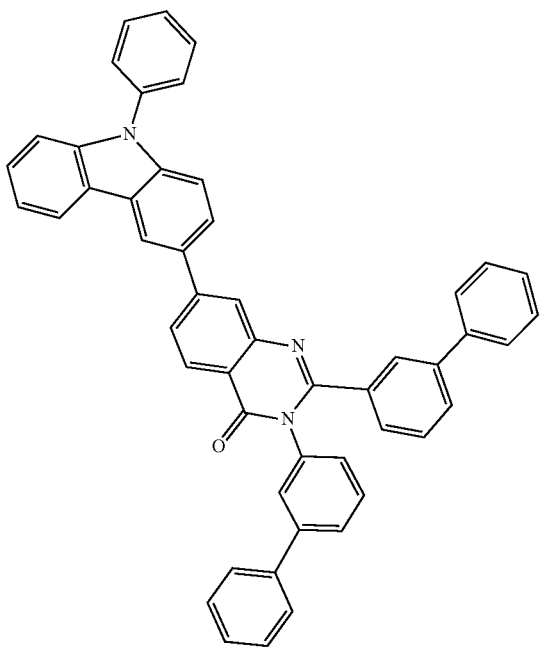
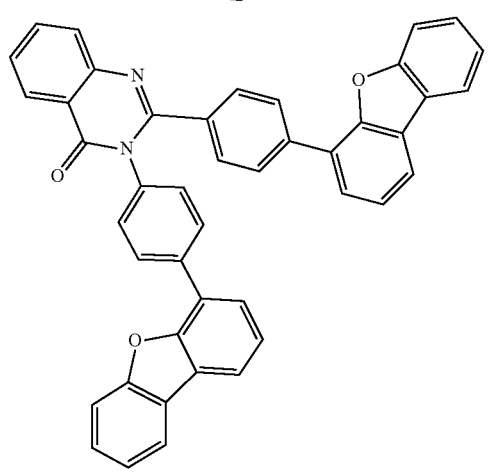
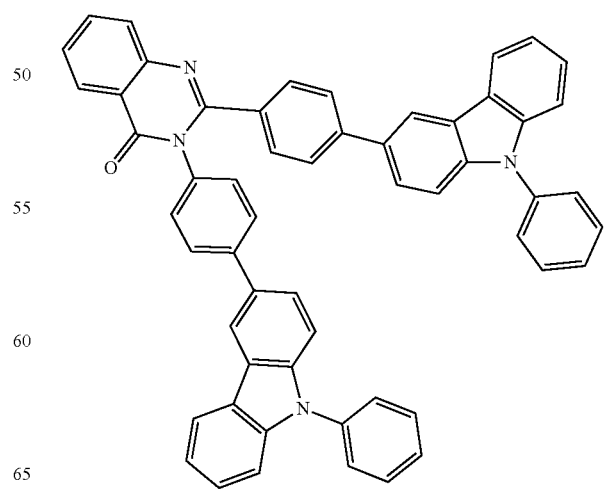

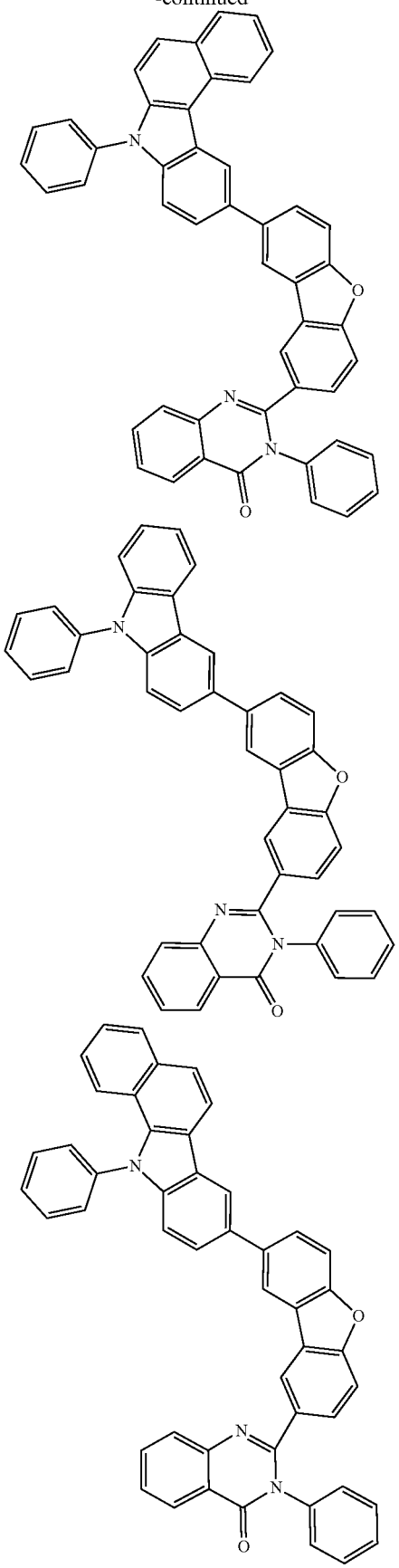

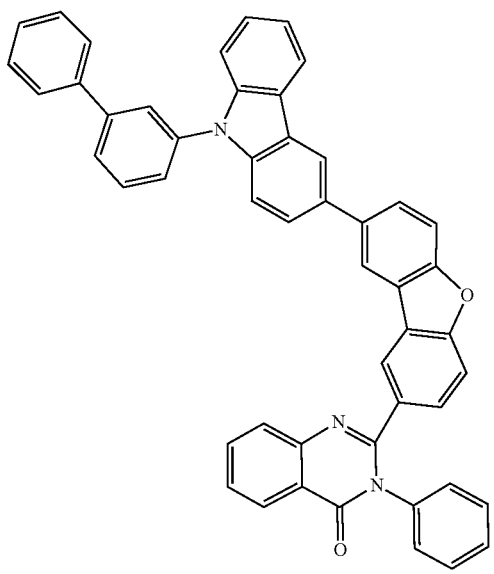
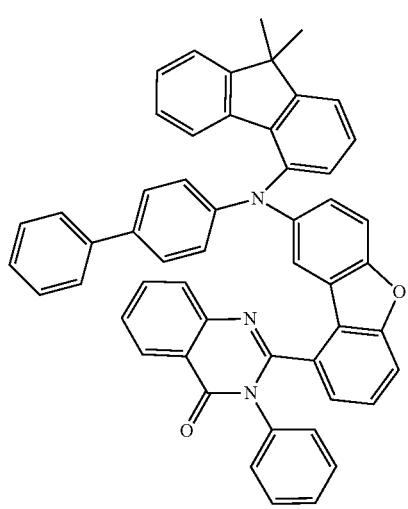
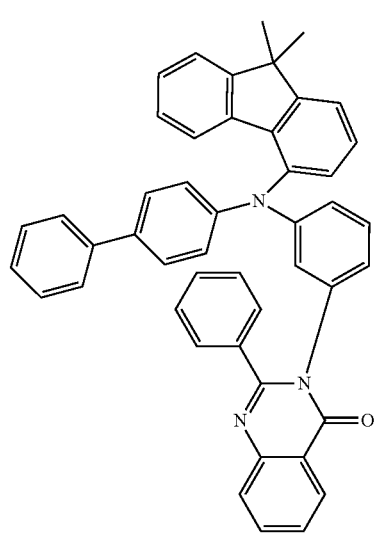
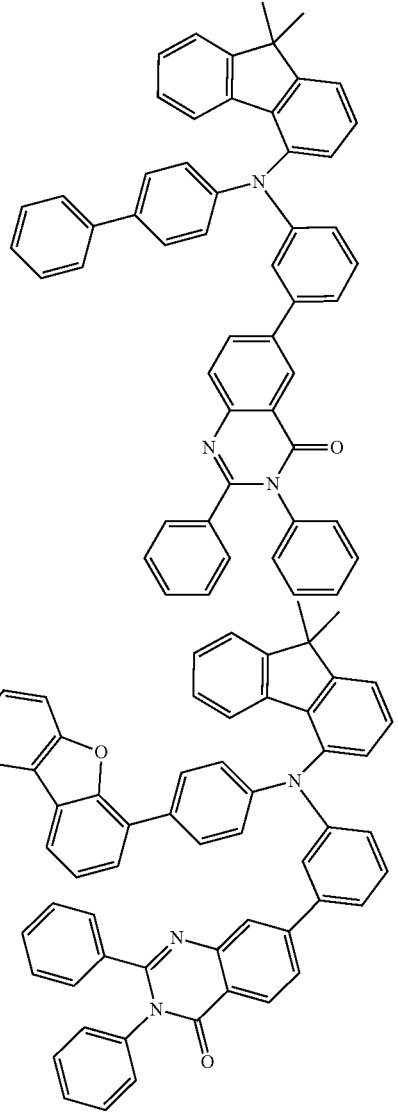

The compounds of the invention can be prepared by synthesis steps known to those skilled in the art, for example bromination, Suzuki coupling, Ullmann coupling, Hartwig-Buchwald coupling, etc.

The preparation of the quinazolinone base skeleton proceeds, for example, from 4H-3,1-benzoxazine-2,4(1H)-dione by reaction with an amine and an aldehyde, preferably with an aromatic amine and an aromatic aldehyde. This is followed by oxidation of the compound to give the quinazolinone base skeleton. This can be accomplished with standard oxidizing agents, such as iodine or potassium permanganate. In the case of use of a group having more than one amino and/or aldehyde group, compounds of the formula (2) can be obtained.

When the compounds used have further suitable groups, compounds of one of the formulae (1) and (2) can be formed by one or more coupling reactions, rearrangements and/or cyclizations.

The present invention therefore further provides a process for preparing a compound of formula (1) or formula (2), wherein the compound of the formula (1) or formula (2) is formed by one or more coupling reactions, rearrangements and/or cyclizations.

The synthesis methods shown above are of illustrative character and can be modified in a suitable manner by the person skilled in the art in the field of organic synthesis if this is advantageous for the synthesis of particular embodiments of compounds of the invention.

The above-described compounds of the invention, especially compounds substituted by reactive leaving groups, such as bromine, iodine, chlorine, boronic acid or boronic ester, may find use as monomers for production of corresponding oligomers, dendrimers or polymers. Suitable reactive leaving groups are, for example, bromine, iodine, chlorine, boronic acids, boronic esters, amines, alkenyl or alkynyl groups having a terminal C—C double bond or C—C triple bond, oxiranes, oxetanes, groups which enter into a cycloaddition, for example a 1,3-dipolar cycloaddition, for example dienes or azides, carboxylic acid derivatives, alcohols and silanes.

The invention therefore further provides oligomers, polymers or dendrimers containing one or more compounds of formula (1) and/or formula (2), wherein the bond(s) to the polymer, oligomer or dendrimer may be localized at any unoccupied positions in formula (1) or formula (2). According to the linkage of the compound of the invention, the compound is part of a side chain of the oligomer or polymer or part of the main chain.

An oligomer in the context of this invention is understood to mean a compound formed from at least three monomer units. A polymer in the context of the invention is understood to mean a compound formed from at least ten monomer units.

The polymers, oligomers or dendrimers of the invention may be conjugated, partly conjugated or nonconjugated. The oligomers or polymers of the invention may be linear, branched or dendritic.

In the structures having linear linkage, the units of formula (1) and/or formula (2) may be joined directly to one another, or they may be joined to one another via a divalent group, for example via a substituted or unsubstituted alkylene group, via a heteroatom or via a divalent aromatic or heteroaromatic group.

In branched and dendritic structures, it is possible, for example, for 3, 5 or more units of formula (1) and/or formula (2) to be joined via a trivalent or higher-valency group, for example via a trivalent or higher-valency aromatic or heteroaromatic group, to give a branched or dendritic oligomer or polymer.

For the repeat units of formula (1) and/or formula (2) in oligomers, dendrimers and polymers, the same preferences apply as described above for the compounds of the invention.

For preparation of the oligomers or polymers, the monomers of the invention are homopolymerized or copolymerized with further monomers. Suitable and preferred comonomers are chosen from fluorenes (for example according to EP 842208 or WO 2000/22026), spirobifluorenes (for example according to EP 707020, EP 894107 or WO 2006/061181), paraphenylenes (for example according to WO 1992/18552), carbazoles (for example according to WO 2004/070772 or WO 2004/113468), thiophenes (for example according to EP 1028136), dihydrophenanthrenes (for example according to WO 2005/014689 or WO 2007/006383), cis- and trans-indenofluorenes (for example according to WO 2004/041901 or WO 2004/113412), ketones (for example according to WO2005/040302), phenanthrenes (for example according to WO 2005/104264 or WO 2007/017066) or else a plurality of these units. The polymers, oligomers and dendrimers typically contain still further units, for example emitting (fluorescent or phosphorescent) units, for example vinyltriarylamines (for example according to WO 2007/068325) or phosphorescent metal complexes (for example according to WO 2006/003000), and/or charge transport units, especially those based on triarylamines.

The polymers, oligomers and dendrimers of the invention have advantageous properties, especially high lifetimes, high efficiencies and good colour coordinates.

The polymers and oligomers of the invention are generally prepared by polymerization of one or more monomer types, of which at least one monomer leads to repeat units of the formula (1) and/or formula (2) in the polymer. Suitable polymerization reactions are known to those skilled in the art and are described in the literature. Particularly suitable and preferred polymerization reactions which lead to C—C and C—N bonds are as follows;

(A) SUZUKI polymerization
(B) YAMAMOTO polymerization
(C) STILLE polymerization and
(D) HARTWIG-BUCHWALD polymerization.

How the polymerization can be conducted by these methods and how the polymers can then be separated from the reaction medium and purified is known to those skilled in the art and is described in detail in the literature, for example in WO 2003/048225, WO 2004/037887 and WO 2004/037887.

The present invention thus also provides a process for preparing the polymers, oligomers and dendrimers of the invention, which is characterized in that they are prepared by polymerization according to SUZUKI, polymerization according to YAMAMOTO, polymerization according to STILLE or polymerization according to HARTWIG-BUCHWALD. The dendrimers of the invention can be prepared by processes known to those skilled in the art or in analogy thereto. Suitable processes are described in the literature, for example in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6; WO 2002/067343 A1 and WO 2005/026144 A1.

For the processing of the compounds of the invention from a liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, or mixtures of these solvents.

The invention therefore further provides a formulation, especially a solution, dispersion or emulsion, comprising at least one compound of formula (1) and/or formula (2) or at least one polymer, oligomer or dendrimer containing at least one unit of formula (1) and/or formula (2), and at least one phosphorescent dopant and at least one solvent, preferably an organic solvent. The way in which such solutions can be prepared is known to those skilled in the art and is described, for example, in WO 2002/072714, WO 2003/019694 and the literature cited therein.

The mixtures of the invention are suitable for use in an electronic device. An electronic device is understood to mean a device containing at least one layer containing at least one organic compound. The component may also comprise inorganic materials or else layers formed entirely from inorganic materials.

The present invention therefore further provides for the use of the mixtures of the invention in an electronic device, especially in an organic electroluminescent device.

The present invention still further provides an electronic device comprising at least one of the above-detailed mixtures of the invention. In this case, the preferences detailed above for the compound also apply to the electronic devices.

The electronic device is preferably selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic dye-sensitized solar cells, organic optical detectors, organic photoreceptors, organic field-quench devices (O-FQDs), light-emitting electrochemical cells (LECs), organic laser diodes (O-lasers) and organic plasmon emitting devices (D. M. Koller et al., *Nature Photonics* 2008, 1-4), preferably from organic electroluminescent devices (OLEDs, PLEDs), especially phosphorescent OLEDs.

The organic electroluminescent device comprises cathode, anode and at least one emitting layer. Apart from these layers, it may also comprise further layers, for example in each case one or more hole injection layers, hole transport layers, hole blocker layers, electron transport layers, electron injection layers, exciton blocker layers, electron blocker layers and/or charge generation layers. It is likewise possible for interlayers having an exciton-blocking function, for example, to be introduced between two emitting layers. However, it should be pointed out that not necessarily every one of these layers need be present. In this case, it is possible for the organic electroluminescent device to contain an emitting layer, or for it to contain a plurality of emitting layers. If a plurality of emission layers are present, these preferably have several emission maxima between 380 nm and 750 mm overall, such that the overall result is white emission; in other words, various emitting compounds which may fluoresce or phosphoresce are used in the emitting layers. Especially preferred are systems having three emitting layers, where the three layers show blue, green and orange or red emission (for the basic construction, see, for example, WO 2005/011013). These may be fluorescent or phosphorescent emission layers or else hybrid systems in which fluorescent and phosphorescent emission layers are combined with one another.

The mixture of the invention according to the above-detailed embodiments may be used in different layers, according to the exact structure. Preference is given to an organic electroluminescent device comprising a mixture of the invention or a compound of formula (1) and/or formula (2) or according to the preferred embodiments as matrix material for phosphorescent emitters. In this context, the above-detailed preferred embodiments also apply to the use of the materials in organic electronic devices.

In a preferred embodiment of the invention, the compound of formula (1) and/or formula (2) or according to the preferred embodiments is used as matrix material for a phosphorescent compound in an emitting layer. In this case, the organic electroluminescent device may contain an emitting layer, or it may contain a plurality of emitting layers, where at least one emitting layer contains at least one mixture of the invention or a compound of formula (1) and/or formula (2) as matrix material for a phosphorescent compound.

A further preferred embodiment of the present invention is the use of the compound of formula (1) or formula (2) or according to the preferred embodiments as matrix material for a phosphorescent emitter in combination with a further matrix material. Particularly suitable matrix materials which can be used in combination with the compounds of formula (1) or formula (2) or according to the preferred embodiments are aromatic ketones, aromatic phosphine oxides or aromatic sulphoxides or sulphones, for example according to WO 2004/013080, WO 2004/093207, WO 2006/005627 or WO 2010/006680, triarylamines, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109 and WO 2011/000455, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, or lactams, for example according to WO 2011/116865 or WO 2011/137951. It is likewise possible for a further phosphorescent emitter which emits at a shorter wavelength than the actual emitter to be present as co-host in the mixture.

The mixture of the compound of formula (1) or according to the preferred embodiments and the emitting compound contains between 99% and 1% by volume, preferably between 98% and 10% by volume, more preferably between 97% and 60% by volume and especially between 95% and 80% by volume of the compound of formula (1) or according to the preferred embodiments, based on the overall mixture of emitter and matrix material. Correspondingly, the mixture contains between 1% and 99% by volume, preferably between 2% and 90% by volume, more preferably between 3% and 40% by volume and especially between 5% and 20% by volume of the emitter, based on the overall mixture of emitter and matrix material.

The term "phosphorescent dopant" (emitter) typically encompasses compounds where light is emitted via a spin-forbidden transition. These are compounds which, at room temperature, exhibit luminescence from an excited state with spin multiplicity >1, for example via a transition from an excited triplet state or a state with a higher spin quantum number, for example a quintet state. Suitable phosphorescent dopants are especially compounds which, when suitably excited, emit light, preferably in the visible region, and also contain at least one atom of atomic number greater than 20, preferably greater than 38, and less than 84, more preferably greater than 56 and less than 80. Preference is given to using, as phosphorescent dopants, compounds containing copper, molybdenum, tungsten, rhenium, ruthenium, osmium, rhodium, iridium, palladium, platinum, silver, gold and/or europium, especially compounds containing iridium, platinum or copper.

In the context of the present invention, all luminescent iridium, platinum or copper complexes are considered to be phosphorescent compounds.

Particularly preferred phosphorescent dopants are compounds selected from the formulae (D-1) to (D-6)

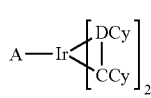  Formula (D-1)

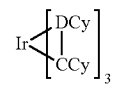  Formula (D-2)

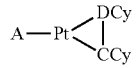  Formula (D-3)

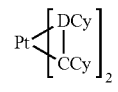  Formula (D-4)

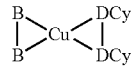  Formula (D-5)

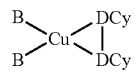  Formula (D-6)

where $R^4$ has the same definition as described above for formula (1), and the further symbols used are as follows:

DCy is the same or different at each instance and is a cyclic group which contains at least one donor atom, preferably nitrogen, carbon in the form of a carbene or phosphorus, or bears it as a substituent via which the cyclic group is bonded to the metal, and which may in turn bear one or more $R^4$ substituents; the DCy and CCy groups are joined to one another via a covalent bond;

CCy is the same or different at each instance and is a cyclic group which contains a carbon atom via which the cyclic group is bonded to the metal, and which may in turn bear one or more $R^4$ substituents;

A is the same or different at each instance and is a monoanionic ligand with bidentate chelation, preferably a diketonate ligand;

B is the same or different at each instance and is a compound comprising at least one donor atom, preferably nitrogen, carbon in the form of a carbene or phosphorus, which binds to the metal.

At the same time, through formation of ring systems between two or more $R^4$ radicals, a bridge may also be present between the DCy and CCy groups. In addition, through formation of ring systems between two or more $R^4$ radicals, a bridge may also be present between two or three CCy-DCy ligands or between one or two CCy-DCy ligands and the A ligand, or the two DCy-DCy ligands or DCy-DCy and DCy are present, such that the system is a polydentate or polypodal ligand system. This is especially preferred in the case of the Pt complexes of the formula (D-4), where the bridge between the two CCy-DCy ligands is preferably selected from $NR^4$ and $C(R^4)_2$.

Preferably, B is a phosphanyl or arsanyl radical ($P(R^4)_2$ or $As(R^4)_2$).

Preference is given to compounds of one of the formulae (D-1) to (D-4).

The phosphorescent dopants may take the form of an individual compound or may be bonded to polymers or oligomers.

Examples of phosphorescent dopants can be found in applications WO 2000/70655, WO 2001/41512, WO 2002/02714, WO 2002/15645, EP 1191613, EP 1191612, EP 1191614, WO 2004/081017, WO 2005/033244, WO 2005/042550, WO 2005/113563, WO 2006/008069, WO 2006/061182, WO 2006/081973, WO 2009/146770, WO 2005/019373 and US 2005/0258742. Examples of phosphorescent dopants comprising copper can be found in WO 2013/007707. In general, all phosphorescent complexes as used for phosphorescent OLEDs according to the prior art and as known to those skilled in the art in the field of organic electroluminescent devices are suitable for use in the devices of the invention. It is also possible for the person skilled in the art, without exercising inventive skill, to use further phosphorescent complexes in combination with the compounds of the invention in OLEDs.

Examples of suitable phosphorescent dopants are listed in the following table:

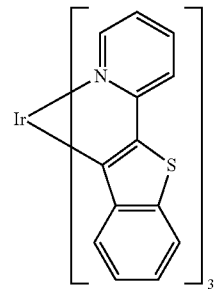

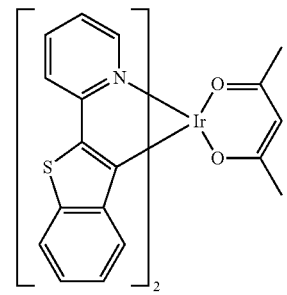

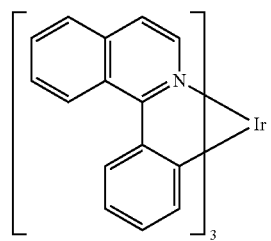
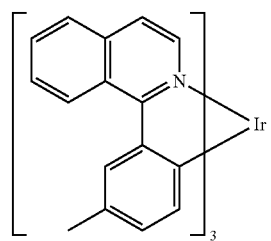
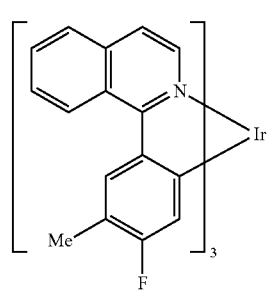
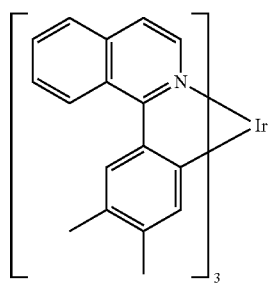
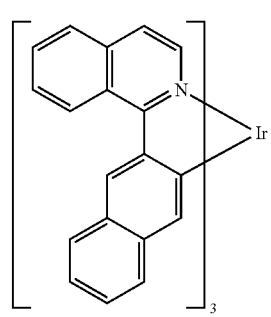
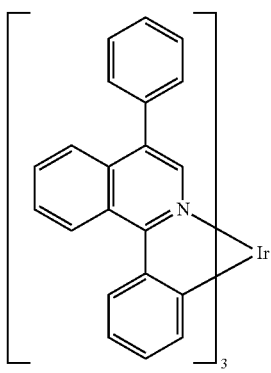
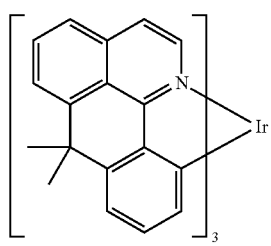
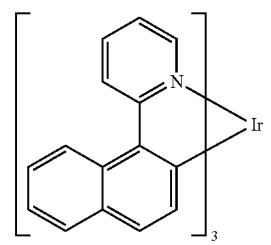
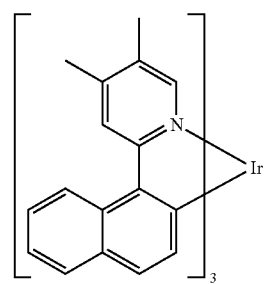
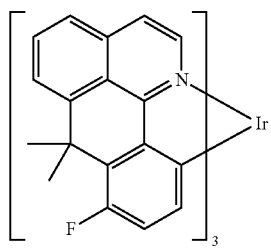

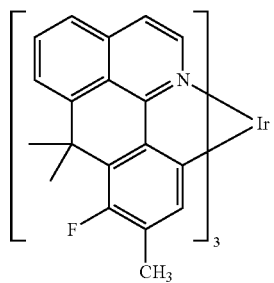
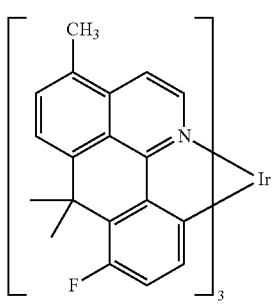
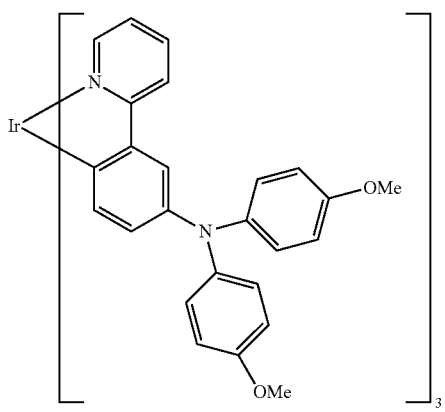
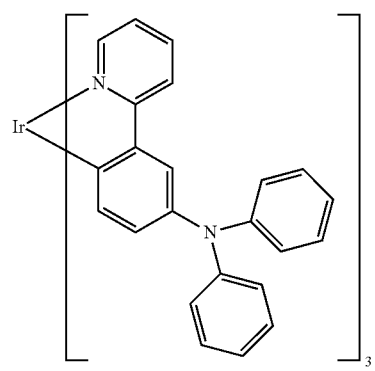
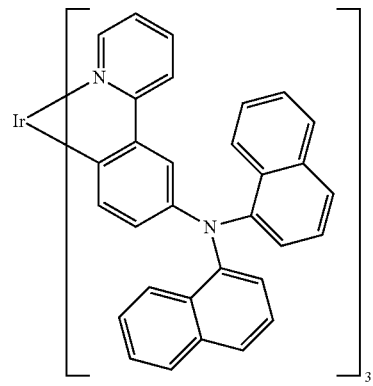
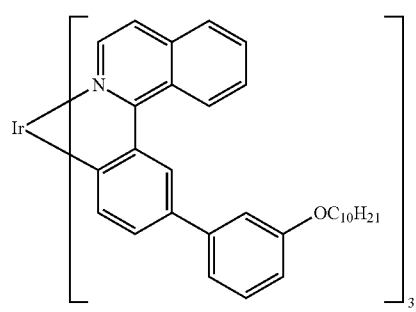
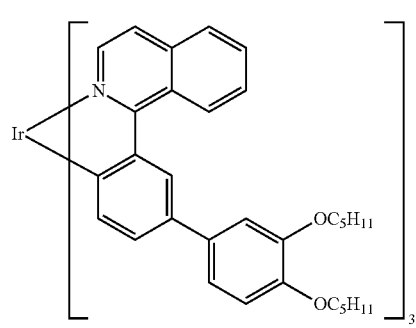
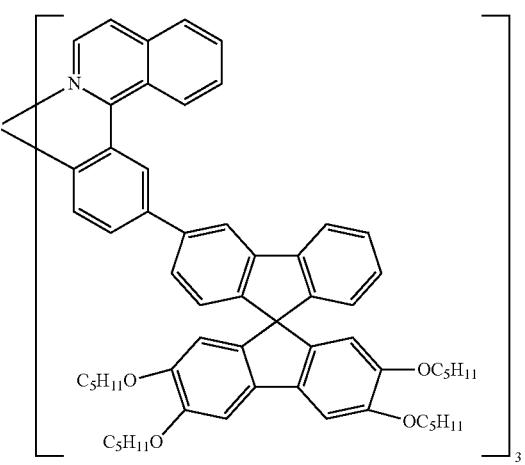

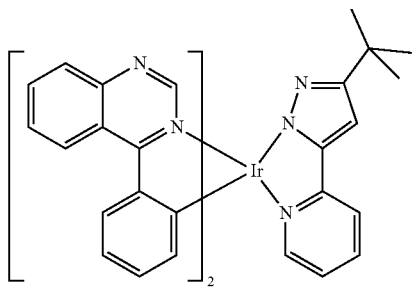
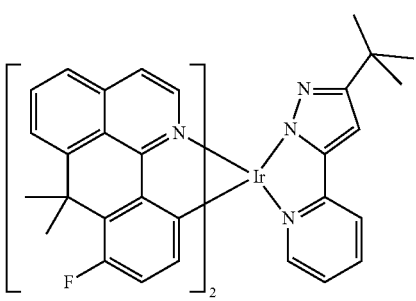
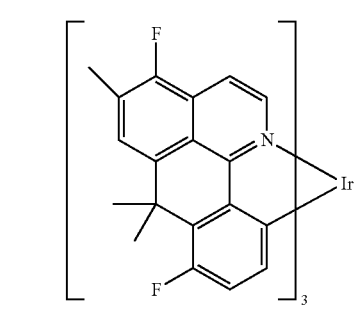
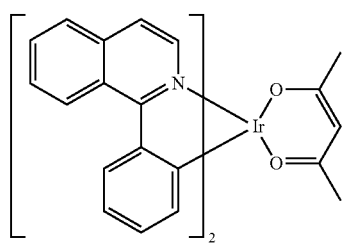
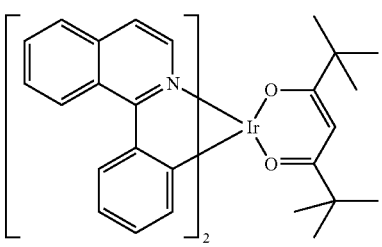
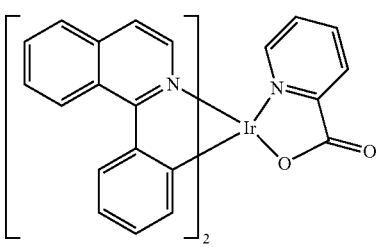
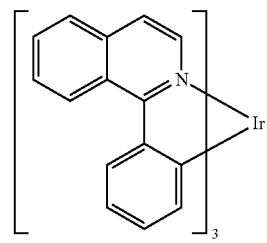
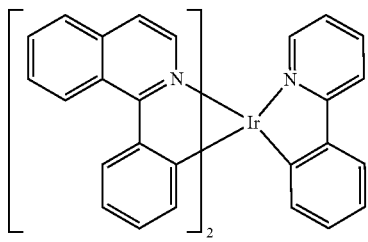
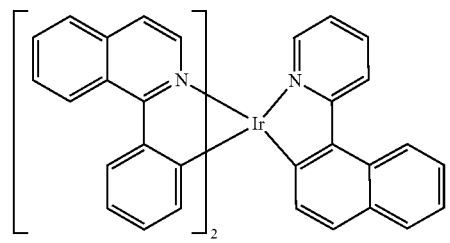
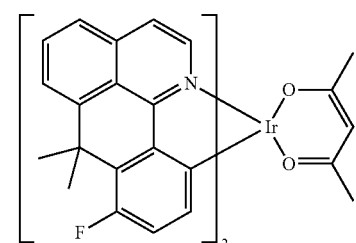
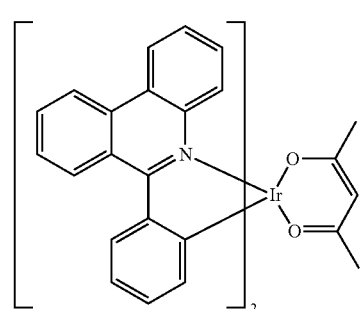
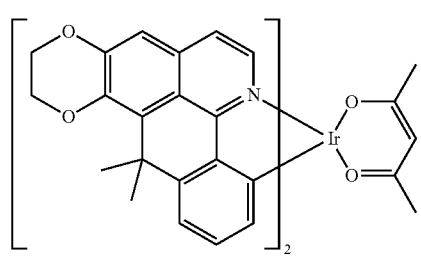

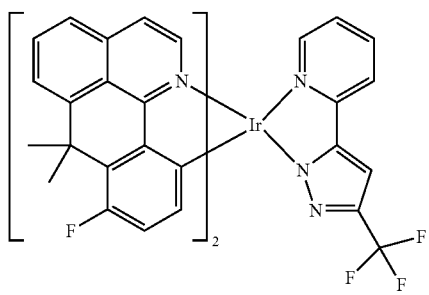
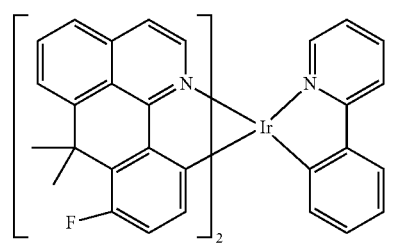
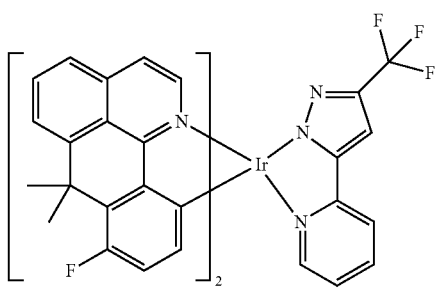
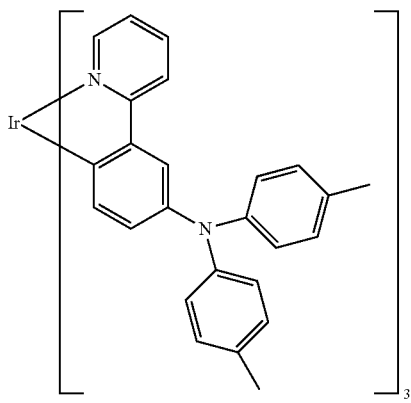
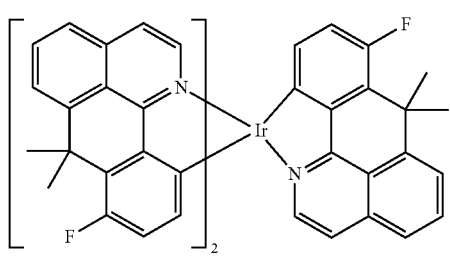
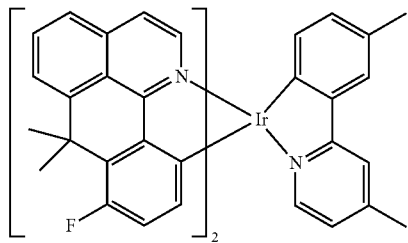
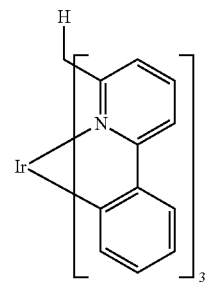
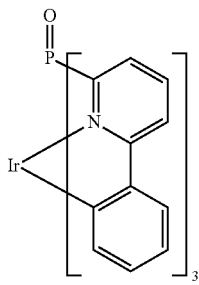
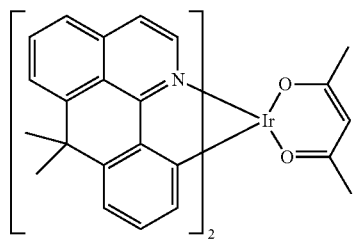
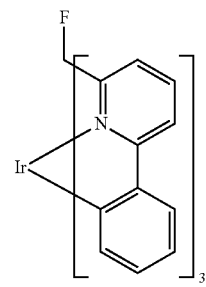
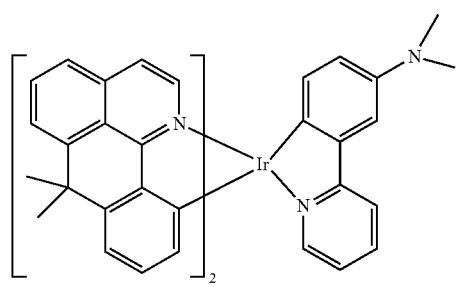

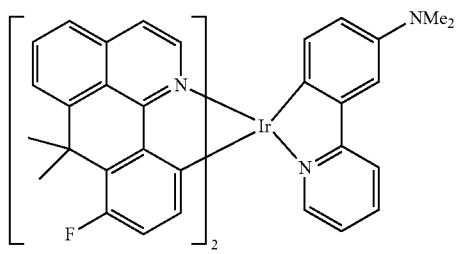
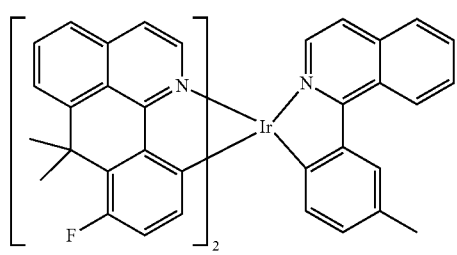
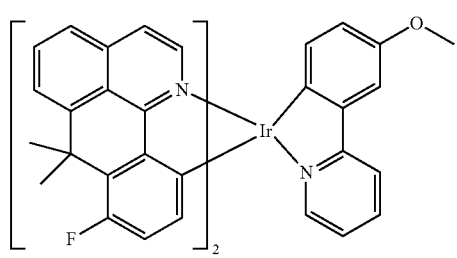
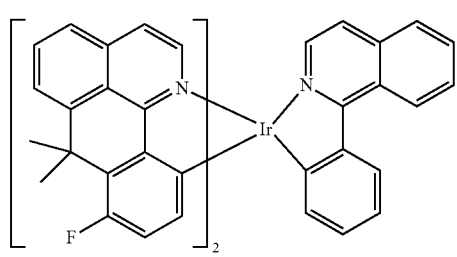
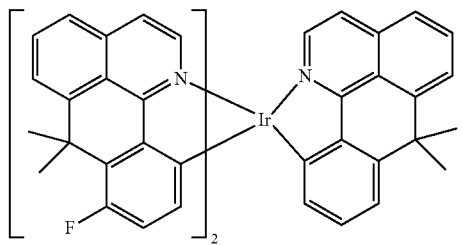
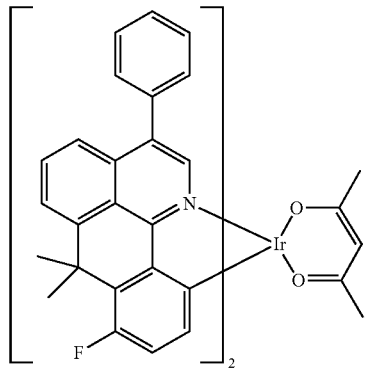
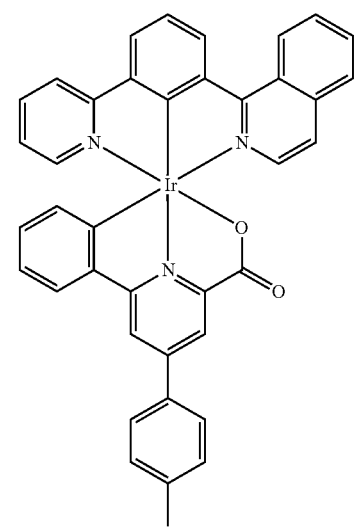
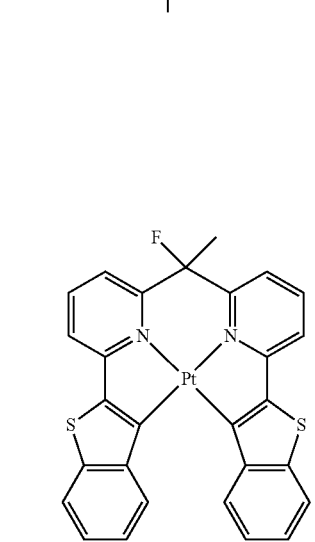

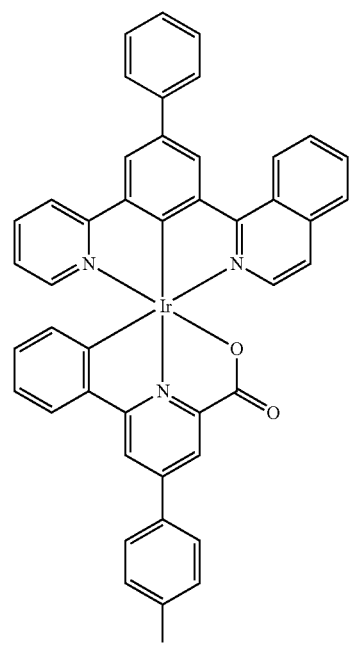
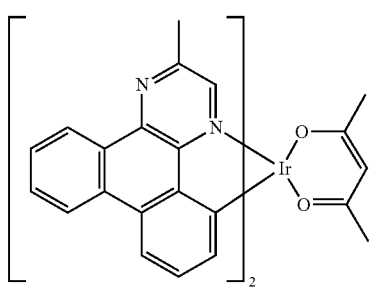
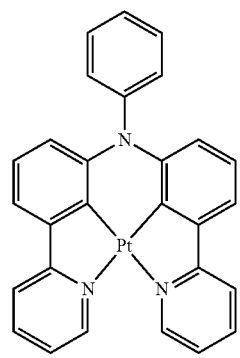
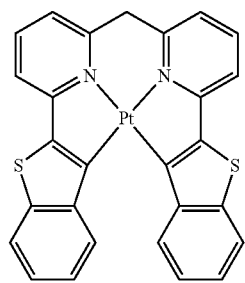
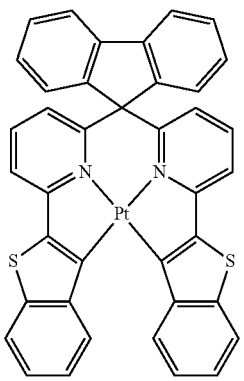
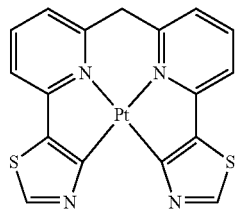
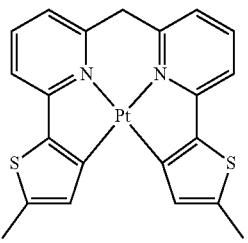
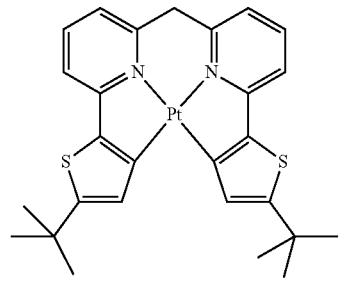
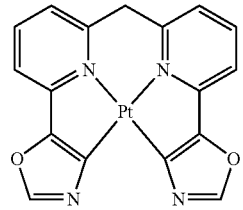
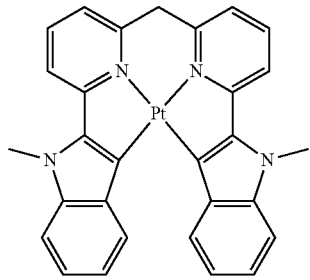

97
-continued
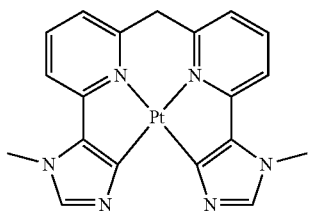
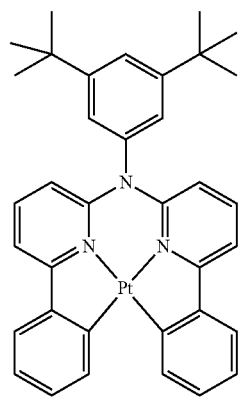
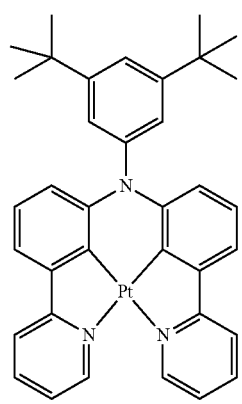
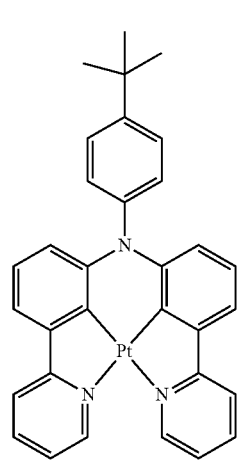
98
-continued
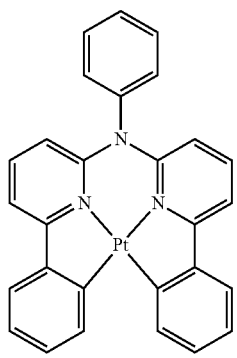
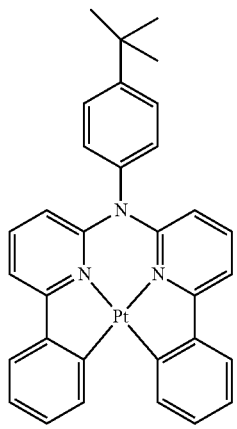
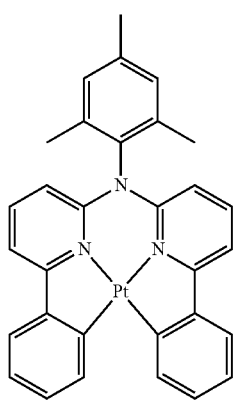
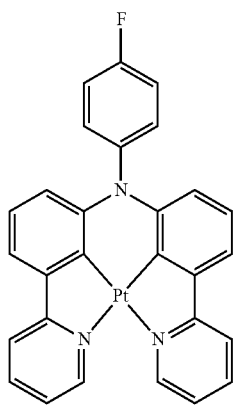

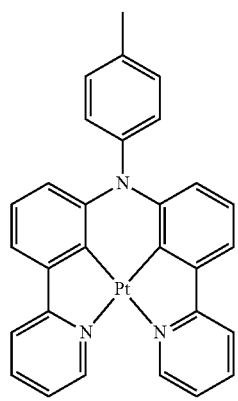
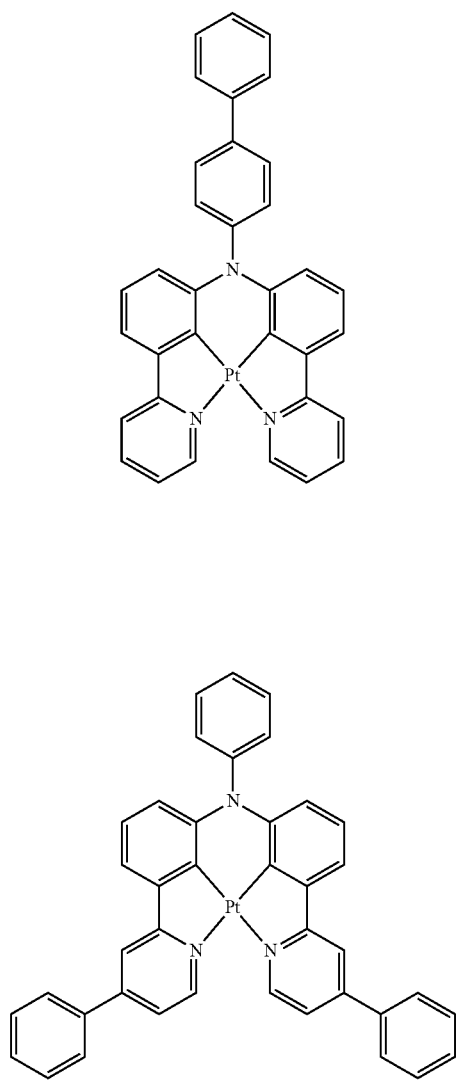
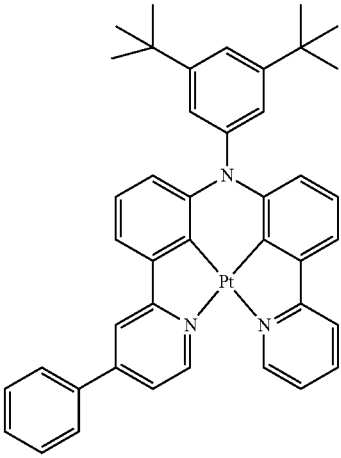
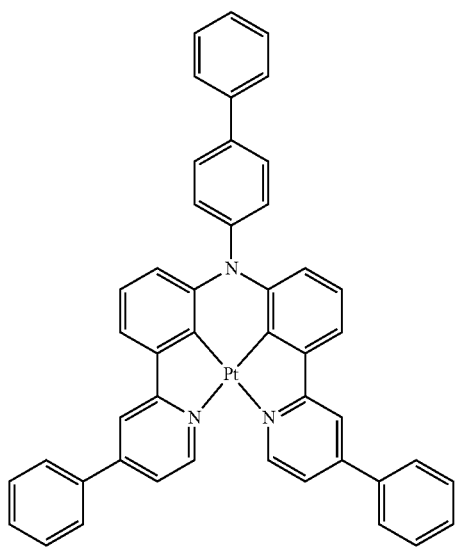
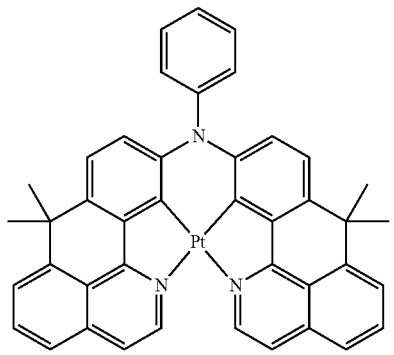

| 101 -continued | 102 -continued |
|---|---|
| 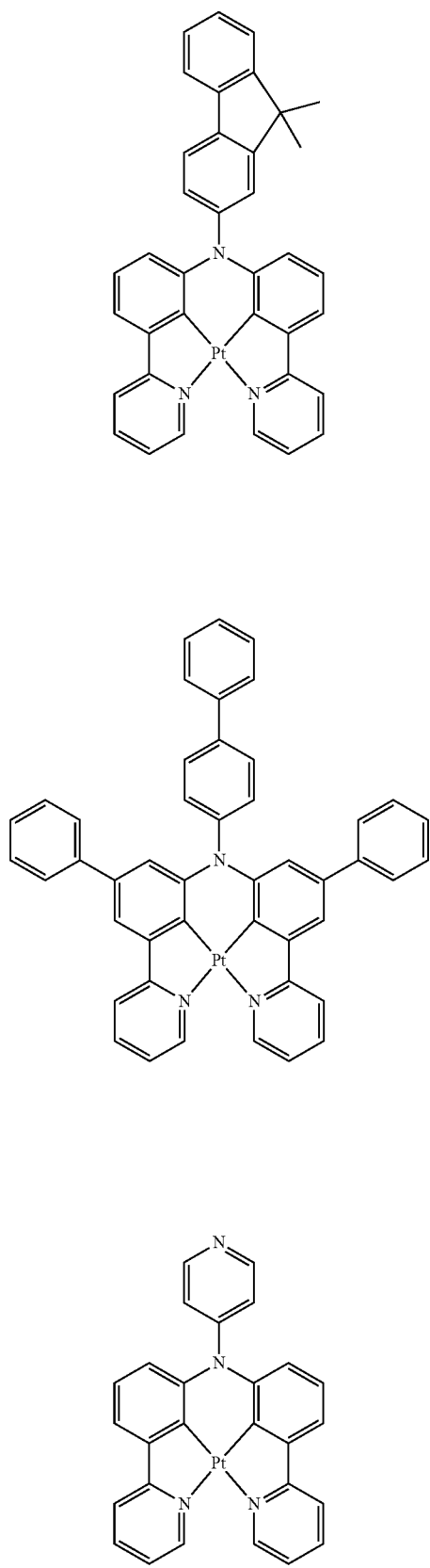 | 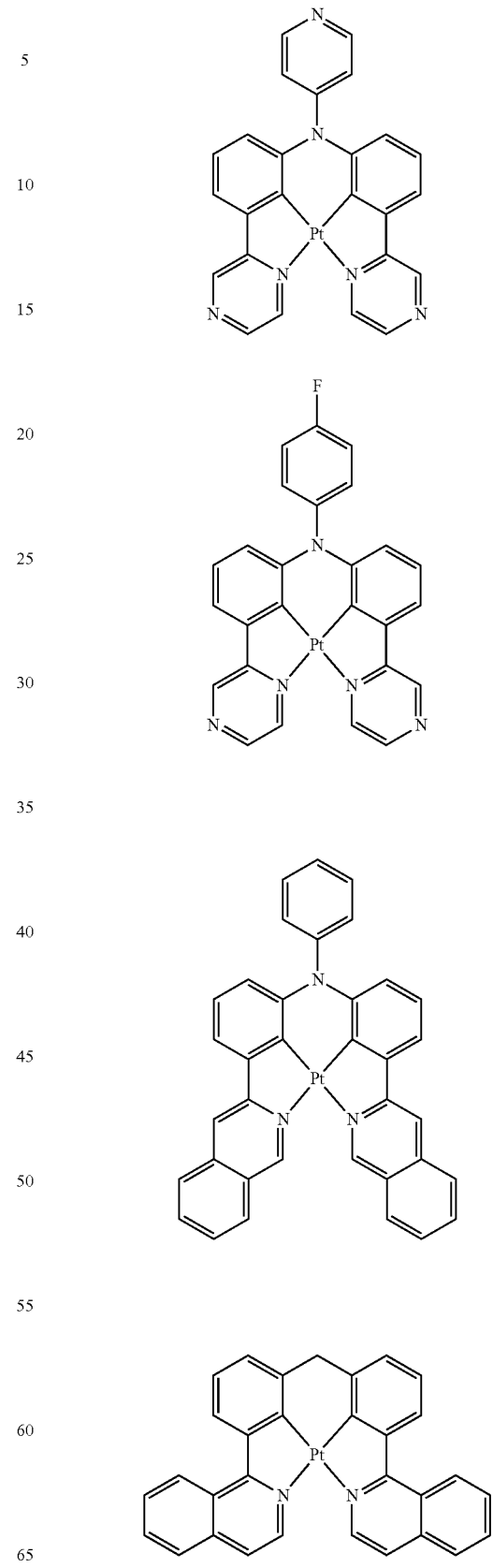 |

103
-continued
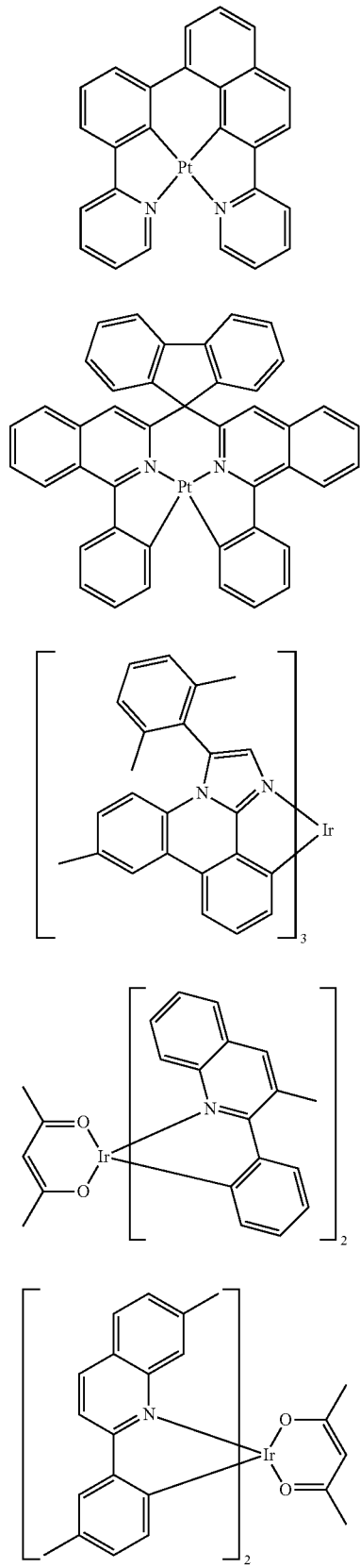
104
-continued
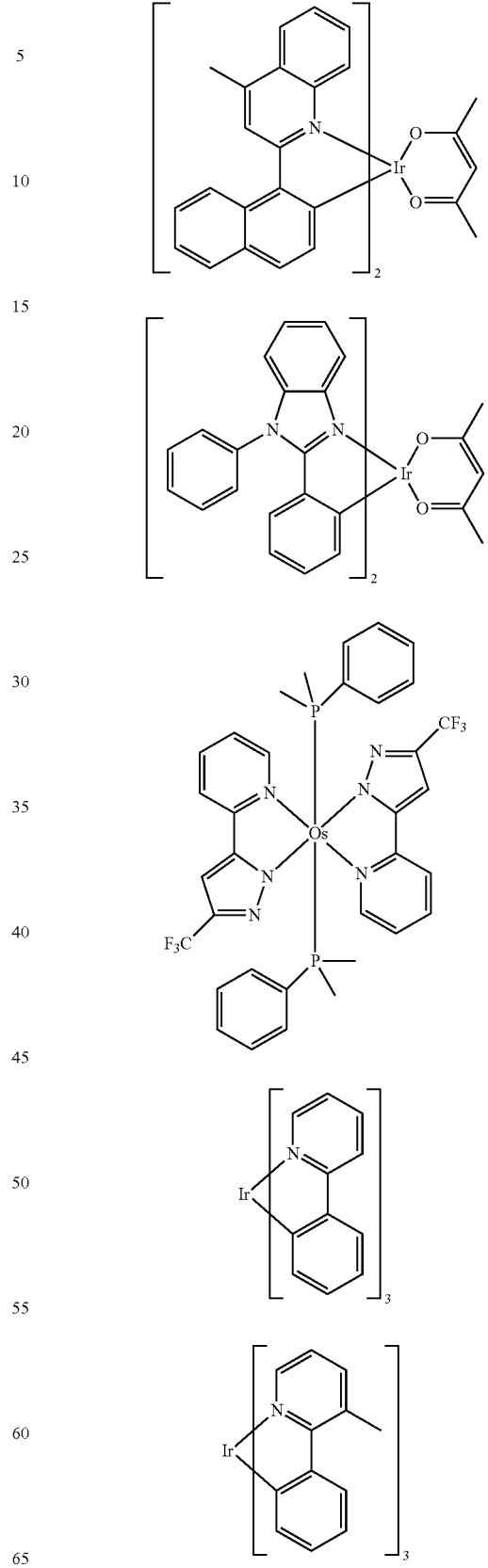

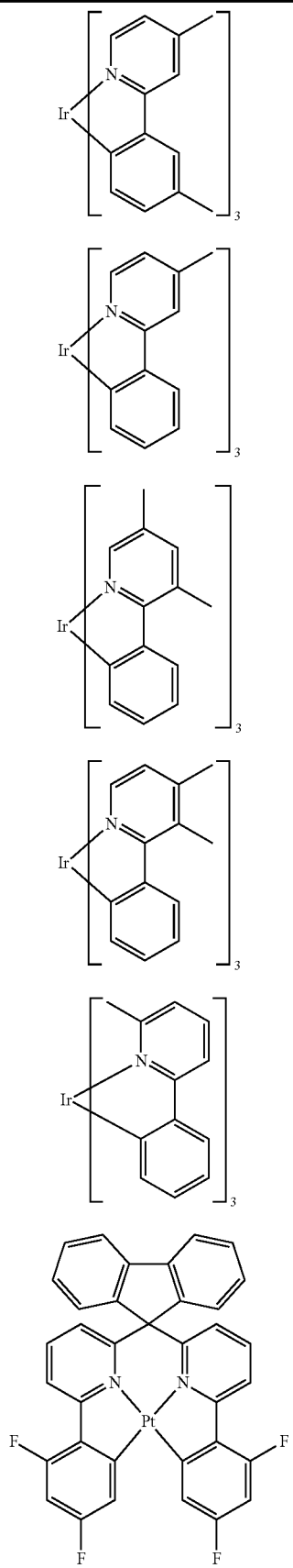
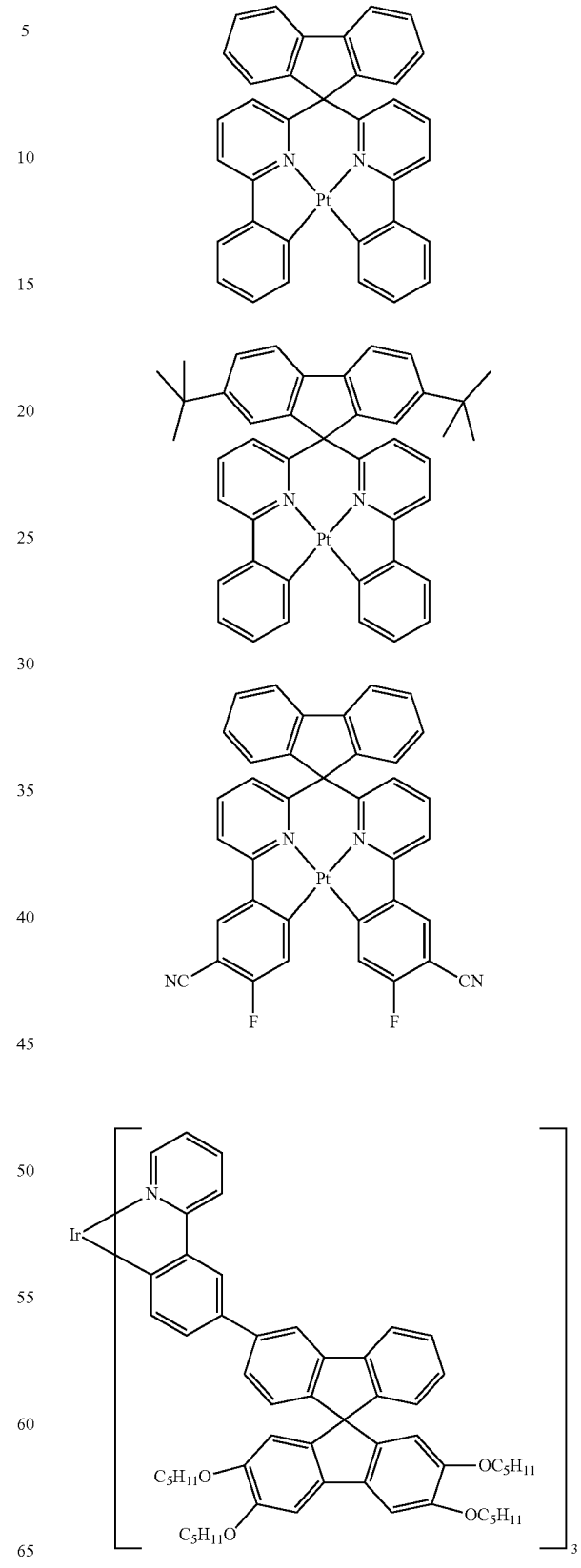

107
-continued
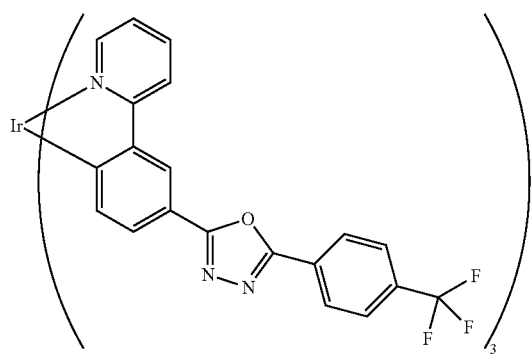
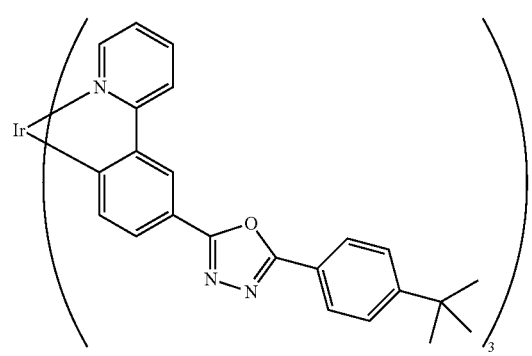
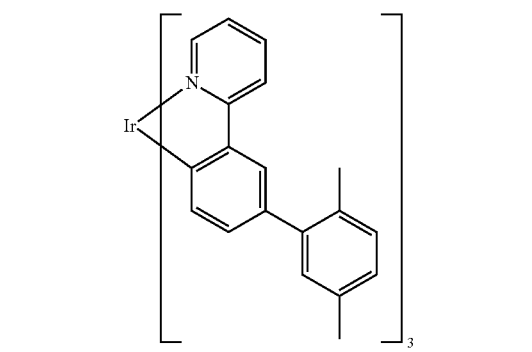
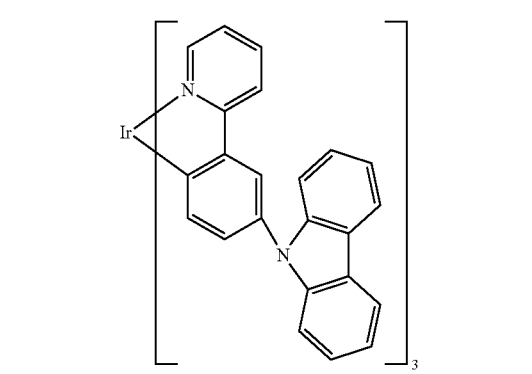
108
-continued
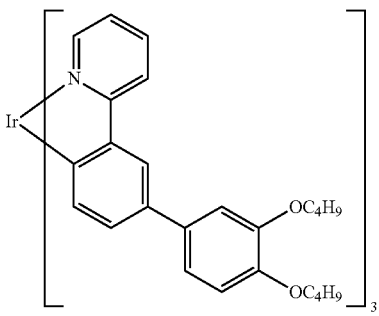
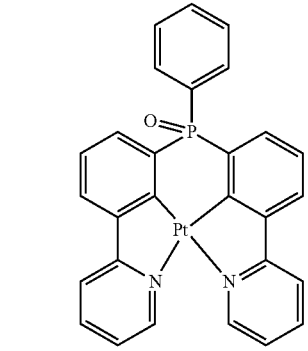
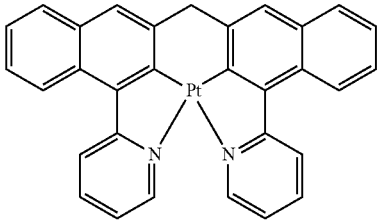
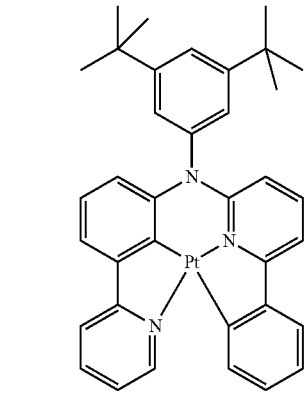
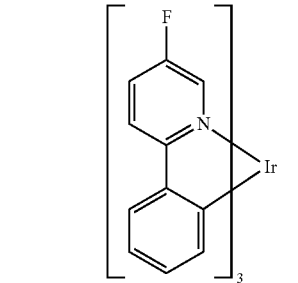

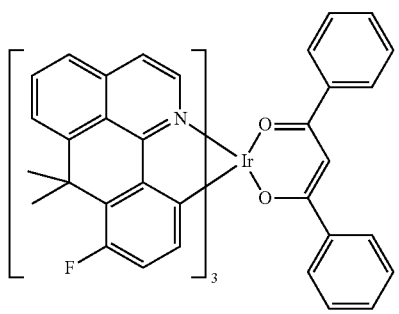
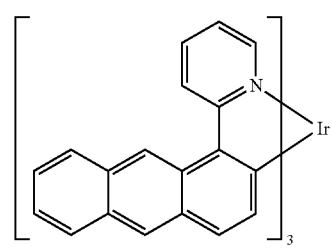
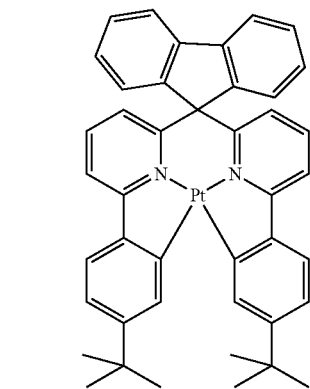
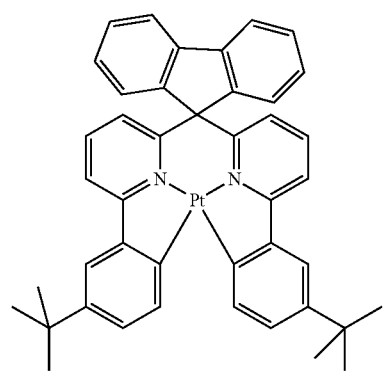
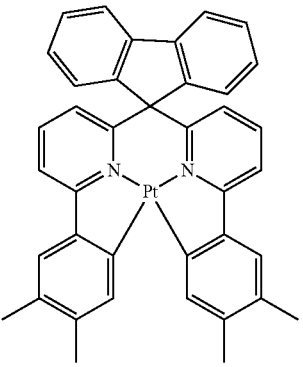
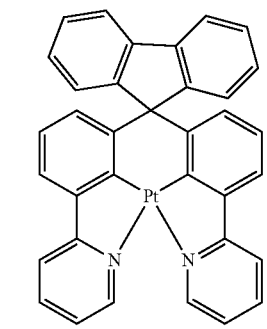
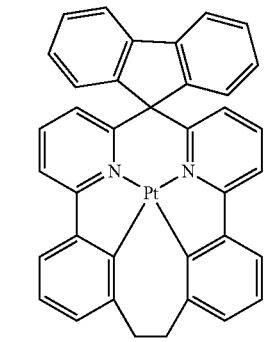
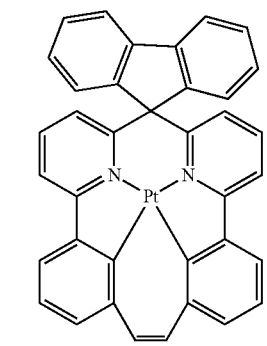

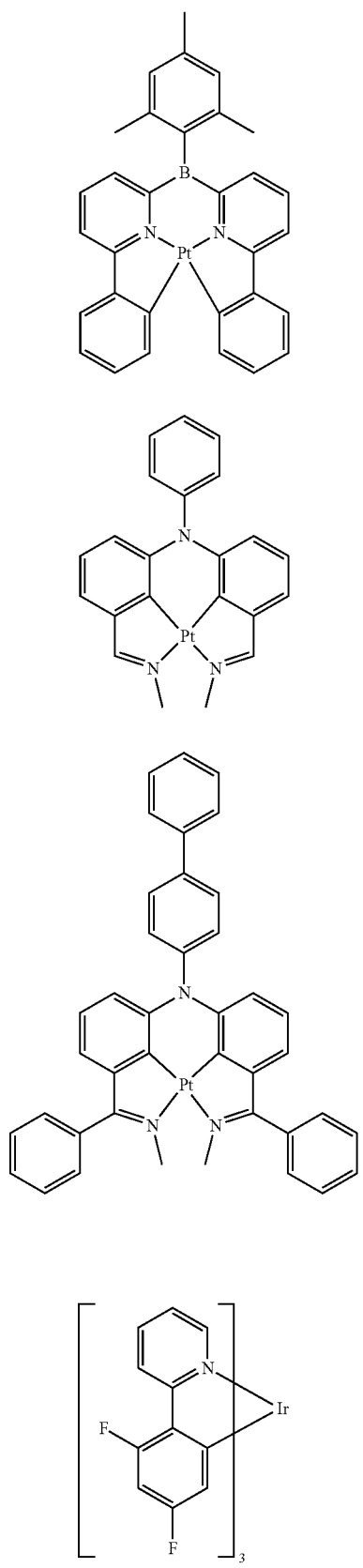

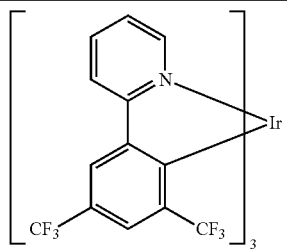
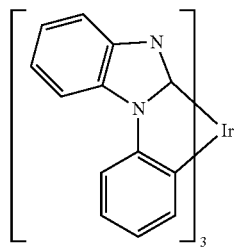
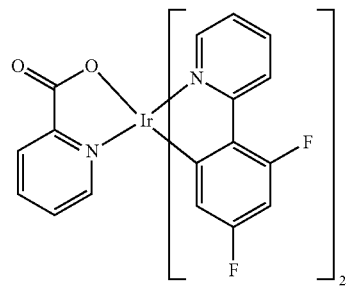
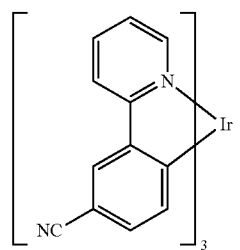
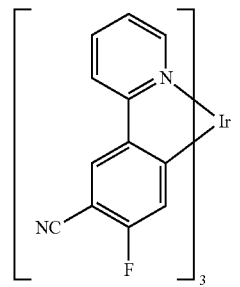
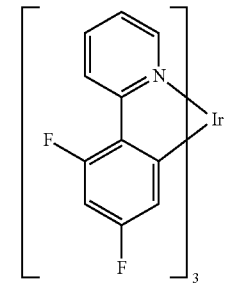
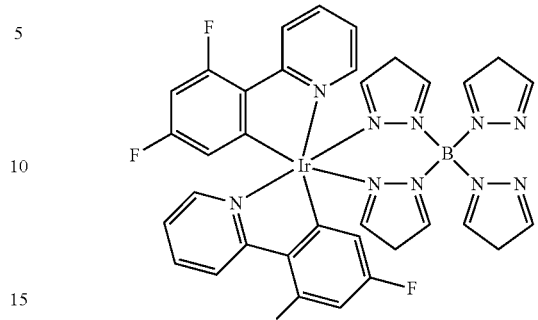
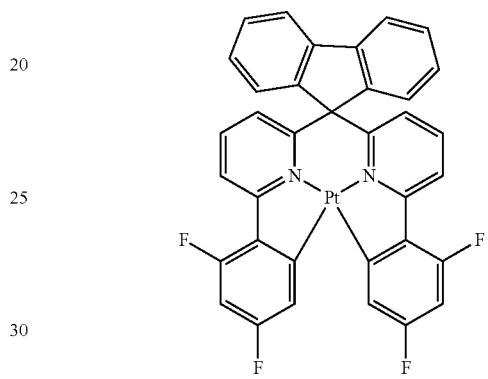
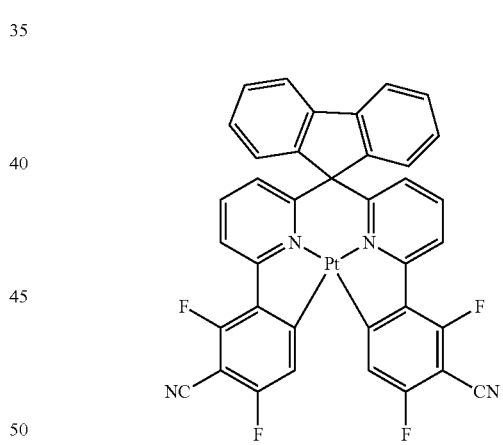
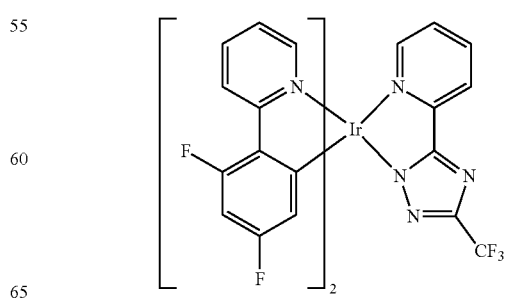

115
-continued
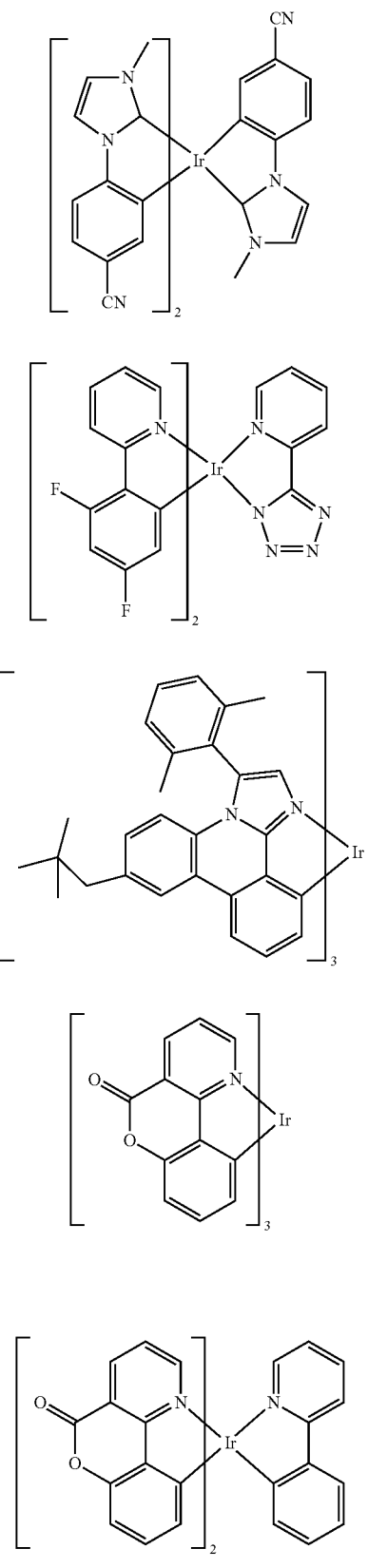
116
-continued
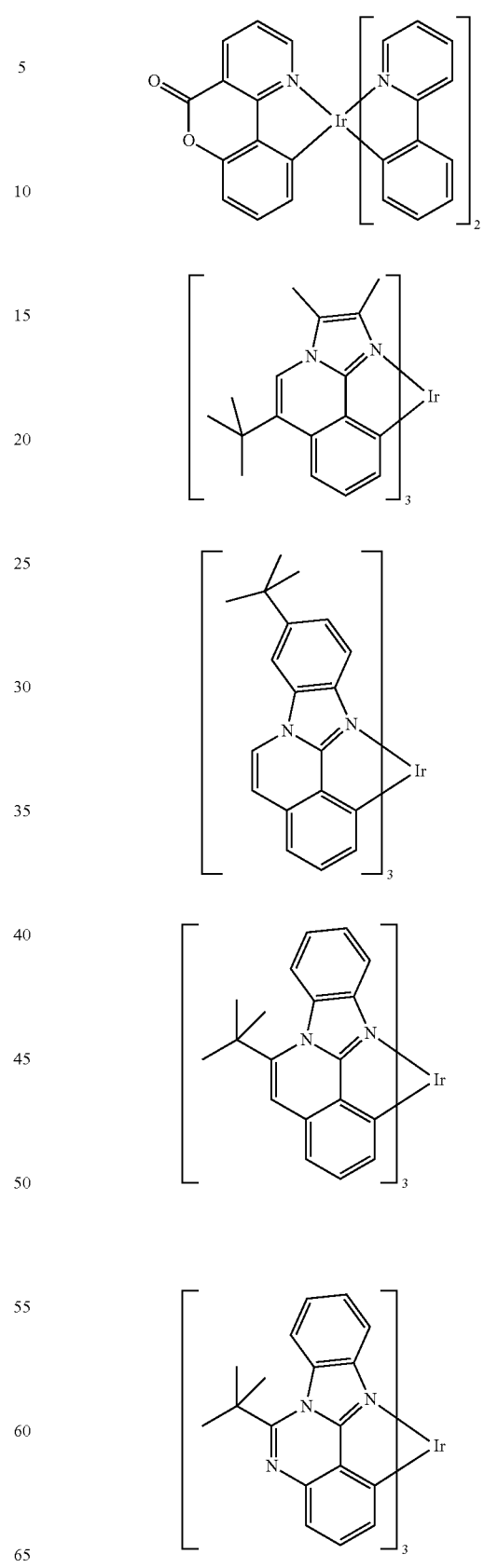

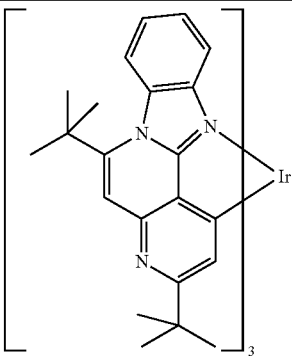

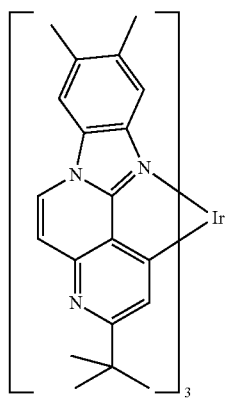

In a further embodiment of the invention, the organic electroluminescent device of the invention does not contain any separate hole injection layer and/or hole transport layer and/or hole blocker layer and/or electron transport layer, meaning that the emitting layer directly adjoins the hole injection layer or the anode, and/or the emitting layer directly adjoins the electron transport layer or the electron injection layer or the cathode, as described, for example, in WO 2005/053051. It is additionally possible to use a metal complex identical or similar to the metal complex in the emitting layer as hole transport or hole injection material directly adjoining the emitting layer, as described, for example, in WO 2009/030981.

In the further layers of the organic electroluminescent device of the invention, it is possible to use any materials as typically used according to the prior art. The person skilled in the art is therefore able, without exercising inventive skill, to use any materials known for organic electroluminescent devices in combination with the inventive mixtures comprising the compounds of formula (1) or formula (2) or according to the preferred embodiments.

Additionally preferred is an organic electroluminescent device, characterized in that one or more layers are coated by a sublimation process. In this case, the materials are applied by vapour deposition in vacuum sublimation systems at an initial pressure of less than $10^{-5}$ mbar, preferably less than $10^{-6}$ mbar. It is also possible that the initial pressure is even lower or higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example inkjet printing, LITI (light-induced thermal imaging, thermal transfer printing), screen printing, flexographic printing, offset printing or nozzle printing. For this purpose, soluble compounds are needed, which are obtained, for example, through suitable substitution. These methods are especially also suitable for oligomers, dendrimers and polymers.

In addition, hybrid methods are possible, in which, for example, one or more layers are applied from solution and one or more further layers are applied by vapour deposition. For example, it is possible to apply the emitting layer from solution and to apply the electron transport layer by vapour deposition.

These methods are known in general terms to those skilled in the art and can be applied by those skilled in the art without exercising inventive skill to organic electroluminescent devices comprising the compounds of the invention.

The mixtures of the invention, when used in organic electroluminescent devices, have one or more of the following surprising advantages over the prior art:

1. Higher power efficiency of corresponding devices compared to systems according to the prior art.
2. Higher stability of corresponding devices compared to systems according to the prior art, which is manifested particularly in a much longer lifetime.
3. The organic electroluminescent devices of the invention have a reduced operating voltage.
4. When the compounds of the invention are used as matrix material for phosphorescent emitters, it is already possible to achieve very good results with only a low emitter concentration in the region of less than 10% by volume.
5. The compounds of the invention have a very good thermal stability.

The invention is now illustrated in detail by the examples which follow, without any intention of restricting it thereby.

WORKING EXAMPLES

Scheme 1

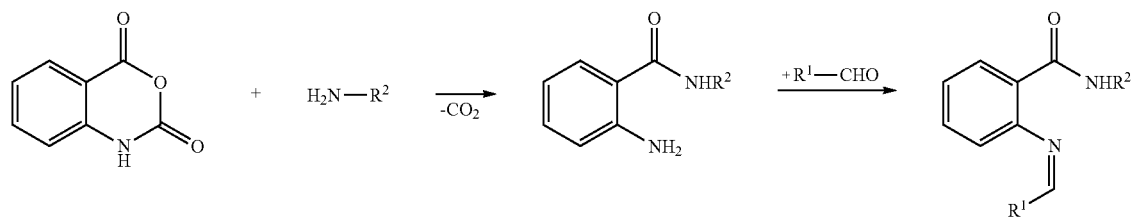

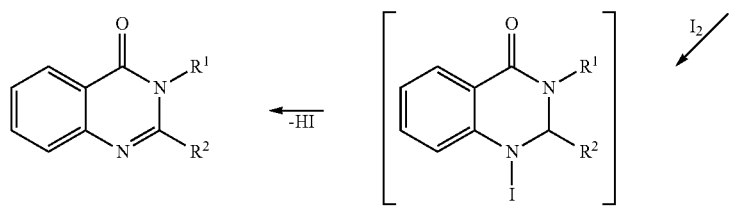

Scheme 1 shows a synthesis of the base skeleton in analogy to Monatshefte fuer Chemie, 141(8), 877-881; 2010.

A second option for the synthesis is shown by Schemes 2a, 2b and 2c:

Scheme 2a:

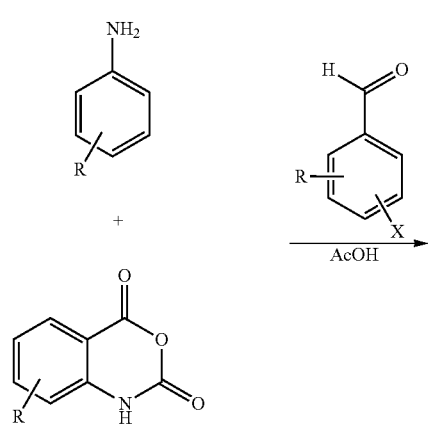

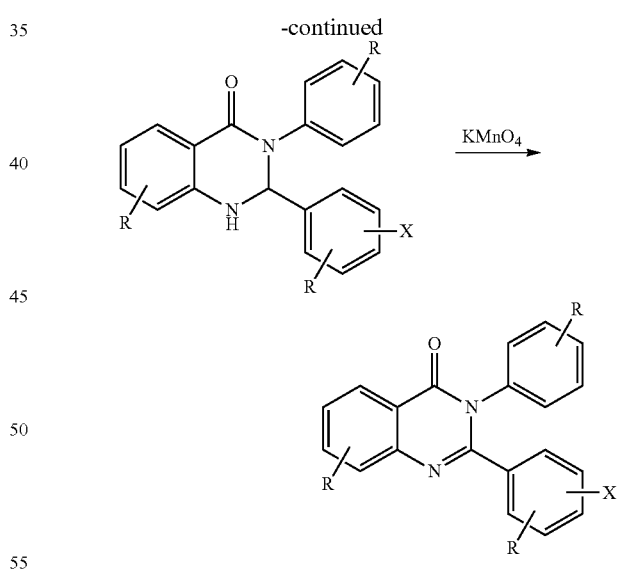

In this scheme, R is any radical and X is a leaving group, for example a halide or tosylate.

First of all, a 4H-3,1-benzoxazine-2,4(1H)-dione is reacted with an amine and an aldehyde under acid catalysis. The corresponding 2,3-dihydro-1H-quinazolin-4-one is obtained. The latter can be oxidized with potassium permanganate to the quinazolinone base skeleton. Because of the mild reaction conditions, it is possible to use substituted aromatics. In this way, it is possible in a simple manner to introduce groups which allow further coupling reactions.

Scheme 2b:

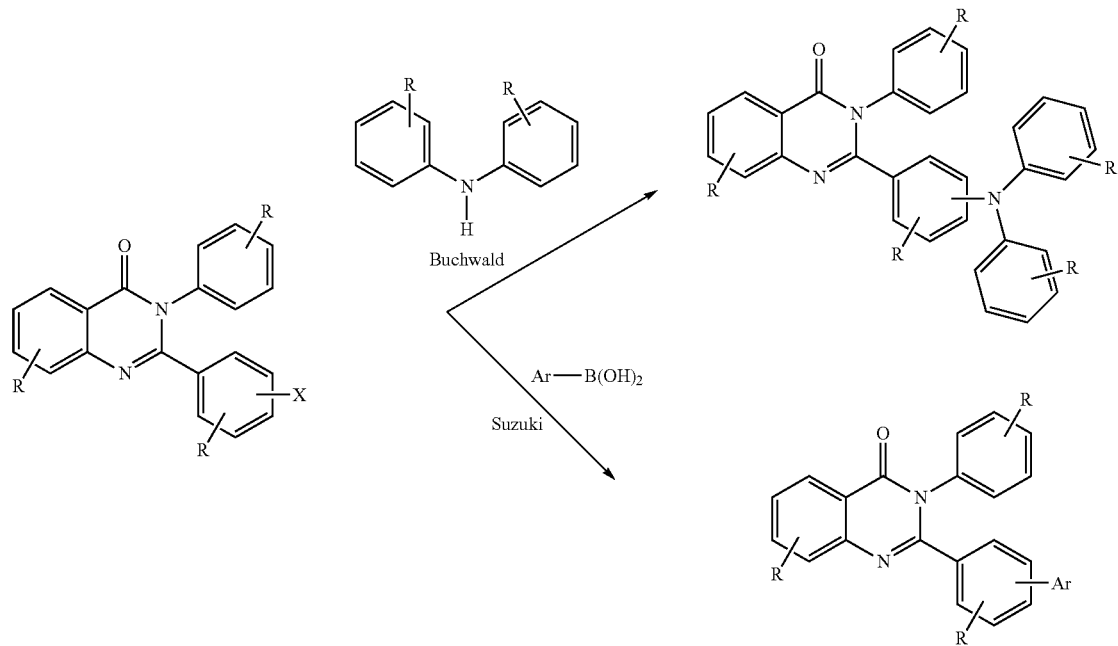

The leaving groups introduced can be converted, for example, by organometallic coupling reactions. Scheme 2b cites, as an example, a Buchwald coupling or a Suzuki coupling.

By multiple coupling reactions, it is possible to form the compounds of the formula (2).

Scheme 2c:

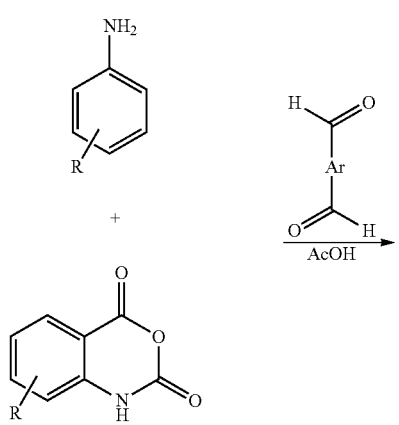

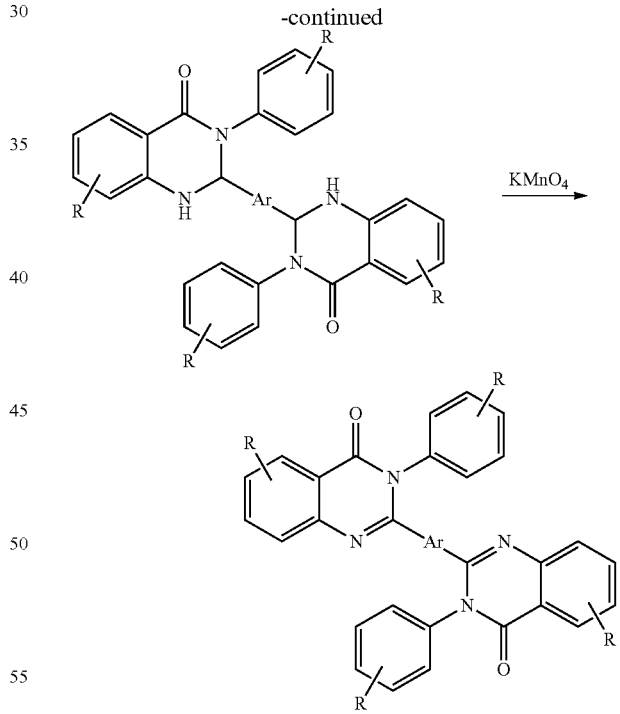

The formation of compounds of the formula (2) is also possible by the method shown in Scheme 2c. This involves, in analogy to Scheme 2a, reacting a 4H-3,1-benzoxazine-2,4(1H)-dione derivative with an amine and an aldehyde under acid catalysis, where the amine and/or the aldehyde has at least one further amino and/or aldehyde group. Preference is given to amino or aldehyde groups bonded to aromatic or heteroaromatic ring systems. In this way, two or more 4H-3,1-benzoxazine-2,4(1H)-dione derivatives are joined to one another. The compound obtained can be oxidized with potassium permanganate to the compound of formula (2).

Example 1: 2-(4-Bromophenyl)-3-phenyl-2,3-dihydro-1H-quinazolin-4-one

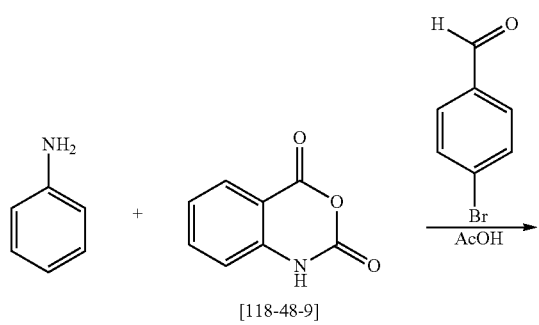

[118-48-9]

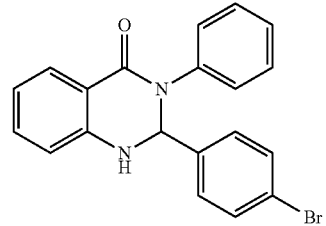

11 ml (121 mmol) of phenylamine and 18 g (110 mmol) of 4H-3,1-benzoxazine-2,4(1H)-dione are refluxed in 500 ml of acetic acid. After 45 min, 22.4 g (121 mmol) of 4-bromobenzaldehyde dissolved in acetic acid are added and stirring of the mixture is continued under reflux overnight.

After cooling, the solution is diluted with water/ice and filtered with suction. The residue is subjected to extraction by stirring with heptane and ethanol. The yield is 36 g (95 mmol), 86% of theory.

In an analogous manner, it is possible to obtain the following compounds:

| Ex. | Reactant 1 | Reactant 2 | Reactant 3 | Product | [%] |
|---|---|---|---|---|---|
| 1a | [4692-98-2] | | | | 82 |
| 1b | [76561-16-5] | | [2243-47-2] | | 86 |
| 1c | [4692-98-2] | [1204-60-0] | | | 74 |
| 1d | [103588-91-6] | [3132-99-8] | | | 70 |

-continued
| Ex. | Reactant 1 | Reactant 2 | Reactant 3 | Product | [%] |
|---|---|---|---|---|---|
| 1e | 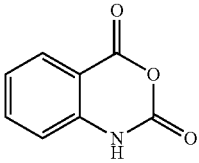 [118-48-9] | 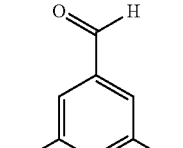 [56990-02-4] | 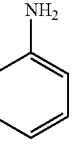 | 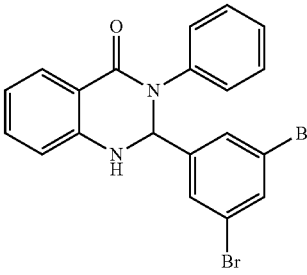 | 80 |
| 1f | 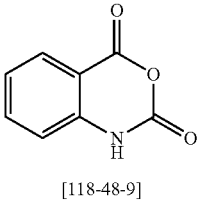 [SMILES: O=c1[nH]c2ccccc2c(=O)o1] [118-48-9] | 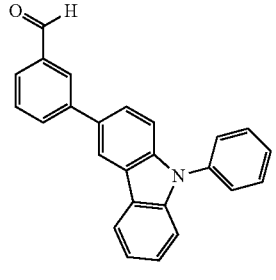 [1448192-89-2] | 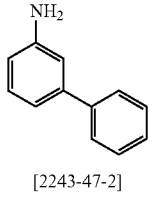 [SMILES: Nc1cccc(-c2ccccc2)c1] [2243-47-2] | 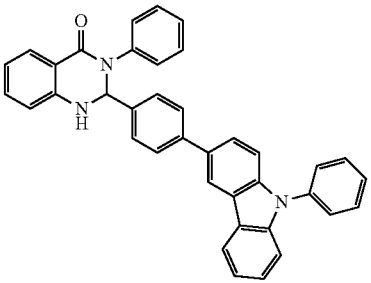 [SMILES: O=C1c2ccccc2NC(c2ccc(-c3ccc4c(c3)c3ccccc3n4-c3ccccc3)cc2)N1c1ccccc1] | 68 |
| 1g | 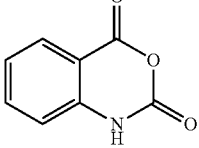 [118-48-9] | 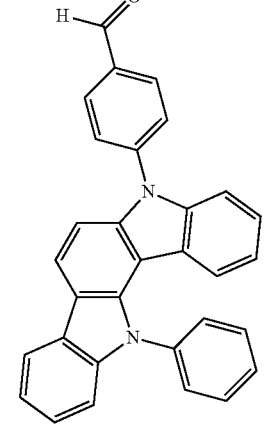 [1332708-33-4] | 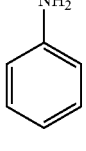 | 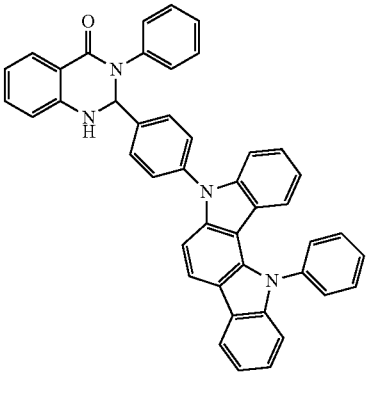 [SMILES: O=C1c2ccccc2NC(c2ccc(-n3c4ccccc4c4c3ccc3c5ccccc5n(-c5ccccc5)c34)cc2)N1c1ccccc1] | 79 |
| 1h | 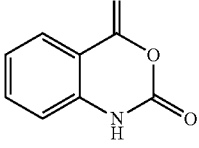 [118-48-9] | 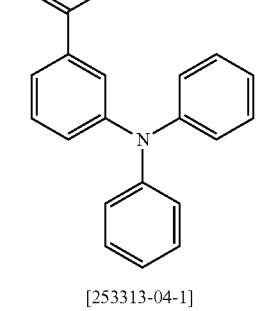 [253313-04-1] | 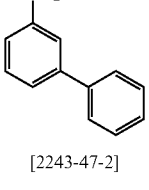 [2243-47-2] | 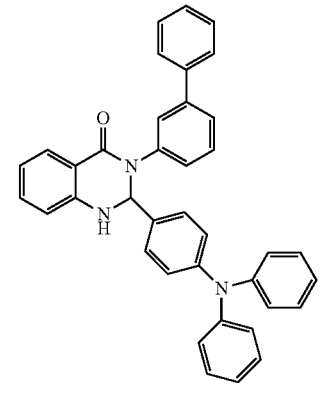 [SMILES: O=C1c2ccccc2NC(c2ccc(N(c3ccccc3)c3ccccc3)cc2)N1c1cccc(-c2ccccc2)c1] | 84 |

-continued
| Ex. | Reactant 1 | Reactant 2 | Reactant 3 | Product | [%] |
|---|---|---|---|---|---|
| 1j | 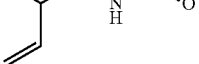 [1340026-89-2] | 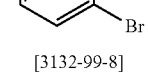 [3132-99-8] |  | 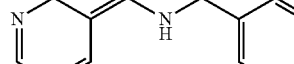 | 78 |
| 1i | 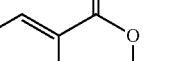 [1342440-41-8] | 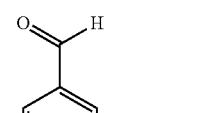 [1204-60-0] | 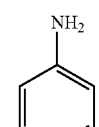 | 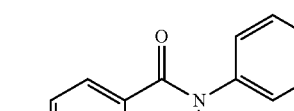 | 81 |
| 1k |  [195984-36-2] | 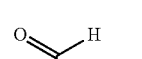 [3132-99-8] | 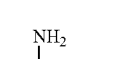 [2243-47-2] |  | 76 |
| 1l |  [195984-36-2] |  |  |  | 76 |
| 1m | 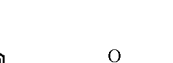 [195984-36-2] | 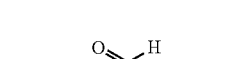 [220955-80-6] |  | 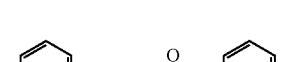 | 65 |
| 1n | 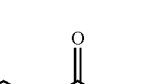 [118-48-9] | 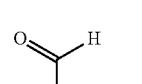 [3132-99-8] |  | 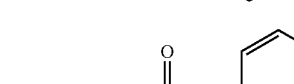 | 70 |

-continued
| Ex. | Reactant 1 | Reactant 2 | Reactant 3 | Product | [%] |
|---|---|---|---|---|---|
| 1o | 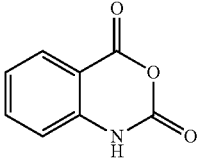 [118-48-9] | 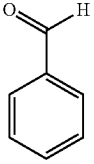 | 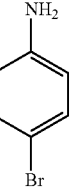 | 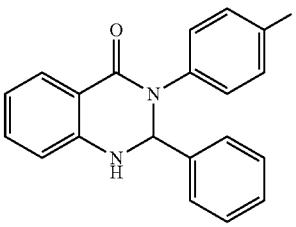 | 87 |
In analogy, the following compounds can be obtained when bifunctional groups are used:
| Ex. | Reactant 1 | Reactant 2 | Reactant 3 | Product | Yield [%] |
|---|---|---|---|---|---|
| 1p | 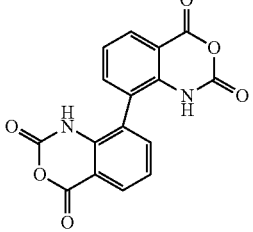 [859931-26-3] | 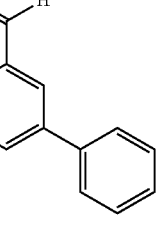 [1204-60-0] | 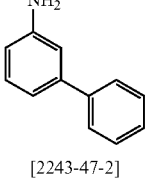 [2243-47-2] | 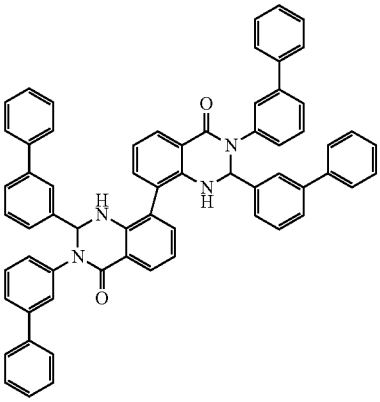 [SMILES: O=C1c2cccc(-c3cccc4c3NC(c3cccc(-c5ccccc5)c3)N(c3cccc(-c5ccccc5)c3)C4=O)c2NC(c2cccc(-c3ccccc3)c2)N1c1cccc(-c2ccccc2)c1] | 67 |
| 1q | 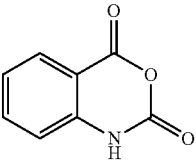 [118-48-9] | 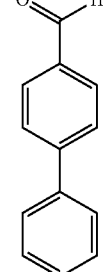 [66-98-8] | 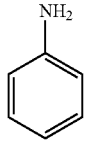 | 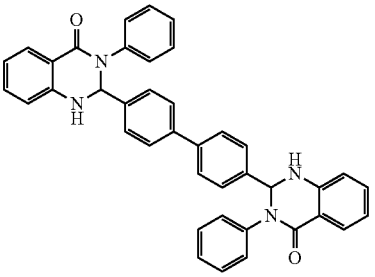 [SMILES: O=C1c2ccccc2NC(c2ccc(-c3ccc(C4Nc5ccccc5C(=O)N4c4ccccc4)cc3)cc2)N1c1ccccc1] | 61 |
| 1r | 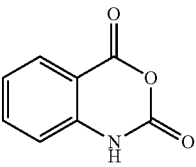 [118-48-9] | 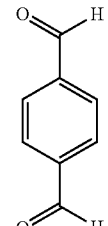 [623-27-8] | 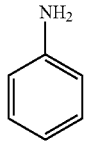 | 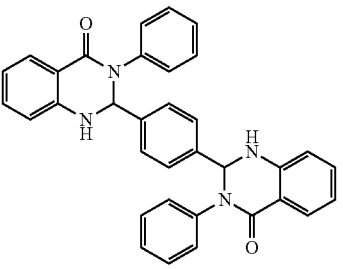 [SMILES: O=C1c2ccccc2NC(c2ccc(C3Nc4ccccc4C(=O)N3c3ccccc3)cc2)N1c1ccccc1] | 59 |

| Ex. | Reactant 1 | Reactant 2 | Reactant 3 | Product | Yield [%] |
|---|---|---|---|---|---|
| 1s | 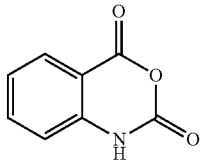 [118-48-9] | 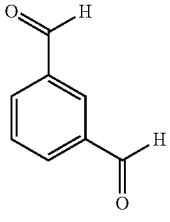 [626-19-7] | 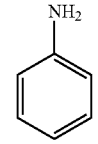 | 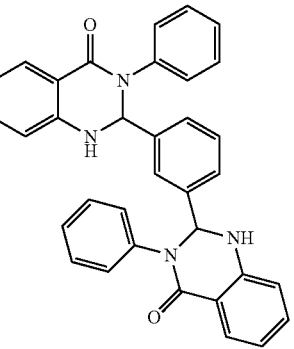 | 48 |
| 1t | 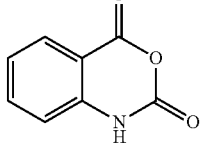 [118-48-9] | 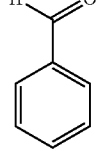 | 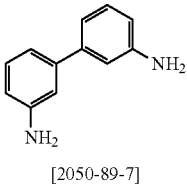 [SMILES: Nc1cccc(-c2cccc(N)c2)c1] [2050-89-7] | 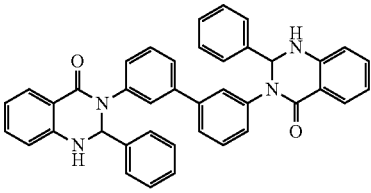 [SMILES: O=C1c2ccccc2NC(c2ccccc2)N1c1cccc(-c2cccc(N3C(=O)c4ccccc4NC3c3ccccc3)c2)c1] | 56 |

Example 2:
2-(4-Bromophenyl)-3-phenyl-3H-quinazolin-4-one

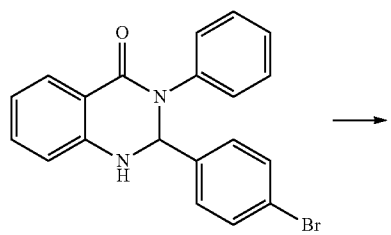

→

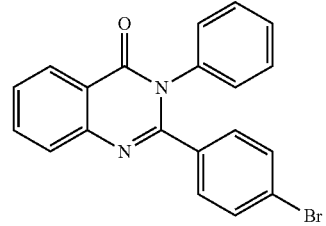

36 g (95 mmol) of 2-(4-bromophenyl)-3-phenyl-2,3-dihydro-1H-quinazolin-4-one are dissolved in 300 ml of DMF. 15 g (95 mmol) of potassium permanganate are added in portions to this solution, and the mixture is stirred at room temperature for 3 hours. After this time, the rest of the potassium permanganate is filtered off, and the solution is concentrated and purified by chromatography (eluent: heptane/dichloromethane, 5:1). The residue is recrystallized from toluene and from dichloromethane/isopropanol and finally sublimed under high vacuum; purity is 99.9%. The yield is 22 g (58 mmol), 61% of theory.

In an analogous manner, it is possible to obtain the following compounds:

| Ex. | Reactant 3 | Product | Yield [%] |
|---|---|---|---|
| 2a | 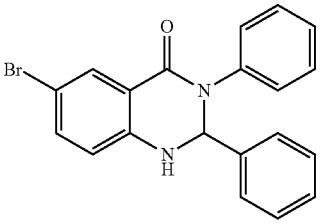 [SMILES: O=C1c2cc(Br)ccc2NC(c2ccccc2)N1c1ccccc1] | 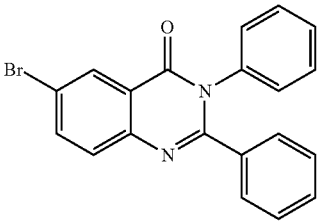 [SMILES: O=c1c2cc(Br)ccc2nc(-c2ccccc2)n1-c1ccccc1] | 82 |

| Ex. | Reactant 3 | Product | Yield [%] |
|---|---|---|---|
| 2b | | | 86 |
| 2c | | | 74 |
| 2d | | | 70 |
| 2e | | | 80 |
| 2f | | | 68 |

| Ex. | Reactant 3 | Product | Yield [%] |
|---|---|---|---|
| 2g | | | 79 |
| 2h | | | 84 |
| 2j | | | 78 |
| 2l | | | 81 |

| Ex. | Reactant 3 | Product | Yield [%] |
|---|---|---|---|
| 2k | 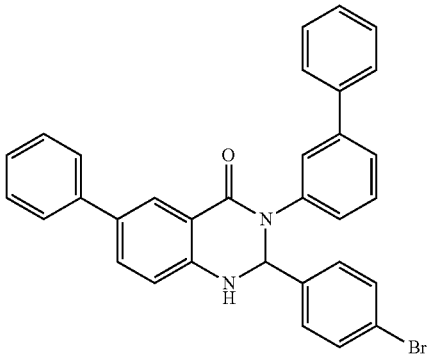 [SMILES: O=C1c2cc(-c3ccccc3)ccc2NC(c2ccc(Br)cc2)N1c1cccc(-c2ccccc2)c1] | 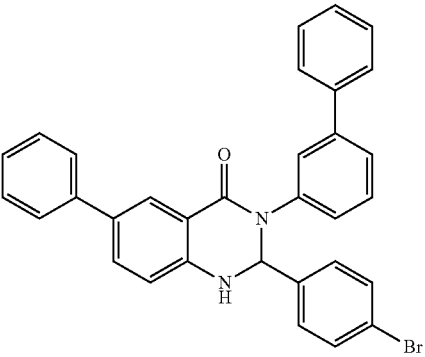 [SMILES: O=C1c2cc(-c3ccccc3)ccc2NC(c2ccc(Br)cc2)N1c1cccc(-c2ccccc2)c1] | 76 |
| 2l | 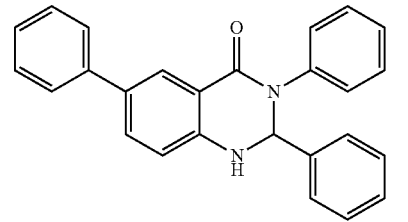 [SMILES: O=C1c2cc(-c3ccccc3)ccc2NC(c2ccccc2)N1c1ccccc1] | 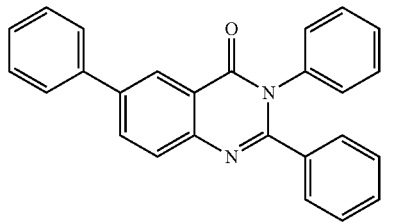 [SMILES: O=c1c2cc(-c3ccccc3)ccc2nc(-c2ccccc2)n1-c1ccccc1] | 82 |
| 2m | 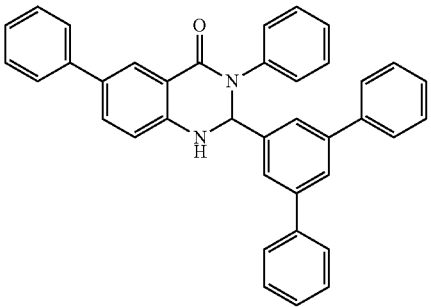 [SMILES: O=C1c2cc(-c3ccccc3)ccc2NC(c2cc(-c3ccccc3)cc(-c3ccccc3)c2)N1c1ccccc1] | 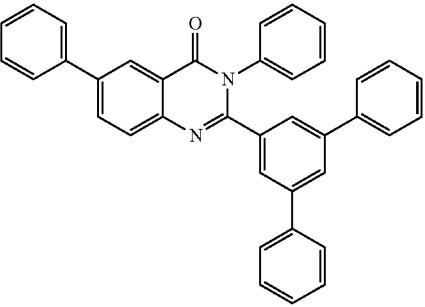 | 79 |
| 2n | 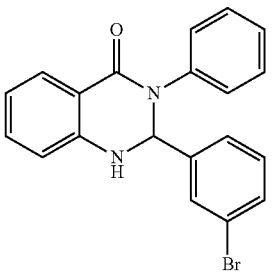 [SMILES: O=C1c2ccccc2NC(c2cccc(Br)c2)N1c1ccccc1] | 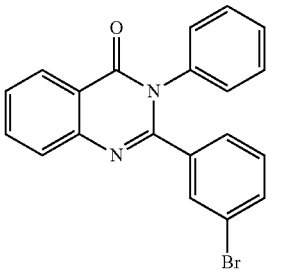 [SMILES: O=c1c2ccccc2nc(-c2cccc(Br)c2)n1-c1ccccc1] | 81 |
| 2o | 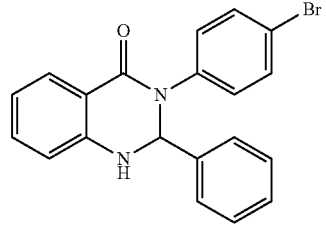 [SMILES: O=C1c2ccccc2NC(c2ccccc2)N1c1ccc(Br)cc1] | 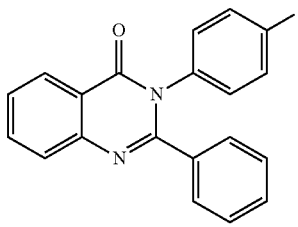 | 83 |

In analogy, the following compounds can be obtained when 2 eq. of KMnO₄ are used:

| Ex. | Reactant 1 | Product | Yield [%] |
|---|---|---|---|
| 2p | | | 67 |
| 2q | | | 61 |
| 2r | | | 59 |

| Ex. | Reactant 1 | Product | Yield [%] |
|---|---|---|---|
| 2s | | | 48 |
| 2t | | | 56 |

Example 3: 2-(4-Dibenzofuran-4-ylphenyl)-3-phenyl-3H-quinazolin-4-one

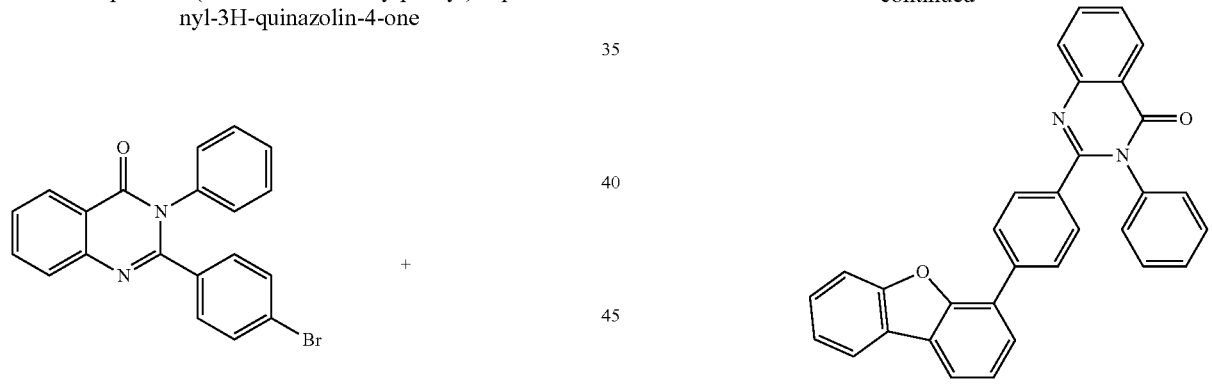

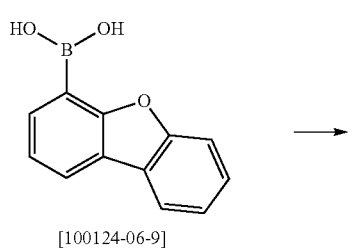

[100124-06-9]

41.3 g (110.0 mmol) of 4-dibenzofuranboronic acid, 41 g (110.0 mmol) of 2-(4-bromophenyl)-3-phenyl-3H-quinazolin-4-one and 44.6 g (210.0 mmol) of tripotassium phosphate are suspended in 500 ml of toluene, 500 ml of dioxane and 500 ml of water. Added to this suspension are 913 mg (3.0 mmol) of tri-o-tolylphosphine and then 112 mg (0.5 mmol) of palladium(II) acetate, and the reaction mixture is heated under reflux for 16 h. After cooling, the organic phase is removed, filtered through silica gel, washed three times with 200 ml of water and then concentrated to dryness. The residue is recrystallized from toluene and from dichloromethane/isopropanol and finally sublimed under high vacuum; purity is 99.9%. The yield is 41 g (90 mmol), corresponding to 82% of theory.

In an analogous manner, the following compounds are obtained;

| Ex | Reactant 1 | Reactant 2 | Product | Yield [%] |
|---|---|---|---|---|
| 3a | 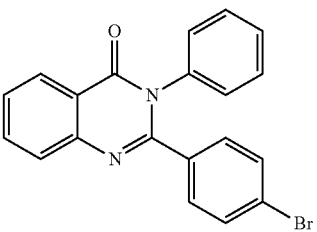 [SMILES: O=c1c2ccccc2nc(-c2ccc(Br)cc2)n1-c1ccccc1] | 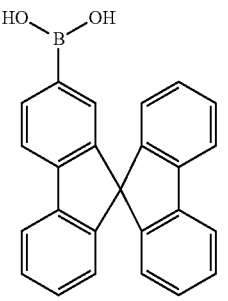 [SMILES: OB(O)c1ccc2c(c1)C1(c3ccccc3-c3ccccc31)c1ccccc1-2] | 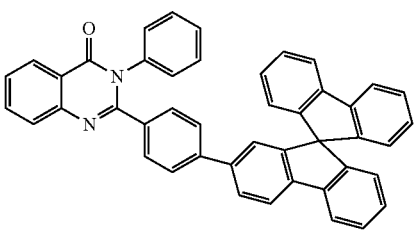 [SMILES: O=c1c2ccccc2nc(-c2ccc(-c3ccc4c(c3)C3(c5ccccc5-c5ccccc53)c3ccccc3-4)cc2)n1-c1ccccc1] | 83 |
| 3b | 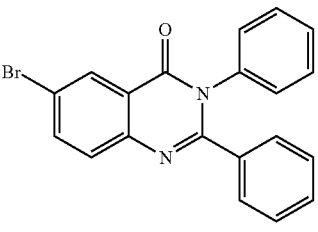 [SMILES: O=c1c2cc(Br)ccc2nc(-c2ccccc2)n1-c1ccccc1] | 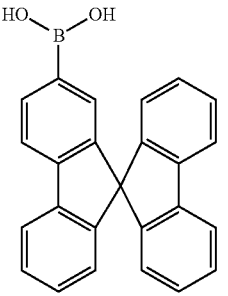\
236389-21-2 | 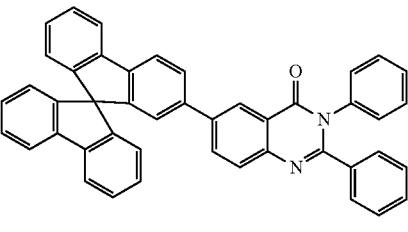 [SMILES: O=c1c2cc(-c3ccc4c(c3)C3(c5ccccc5-c5ccccc53)c3ccccc3-4)ccc2nc(-c2ccccc2)n1-c1ccccc1] | 82 |
| 3c | 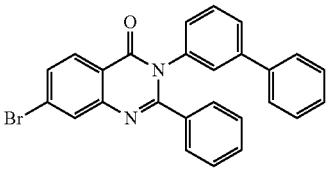 [SMILES: O=c1c2ccc(Br)cc2nc(-c2ccccc2)n1-c1cccc(-c2ccccc2)c1] | 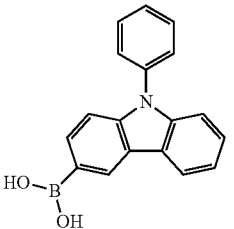\
[854952-58-2] | 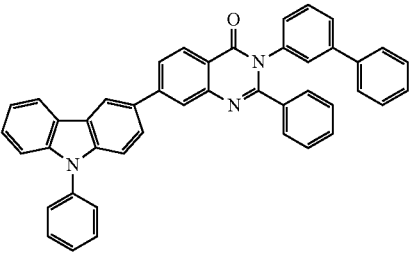 [SMILES: O=c1c2ccc(-c3ccc4c(c3)c3ccccc3n4-c3ccccc3)cc2nc(-c2ccccc2)n1-c1cccc(-c2ccccc2)c1] | 81 |
| 3d | 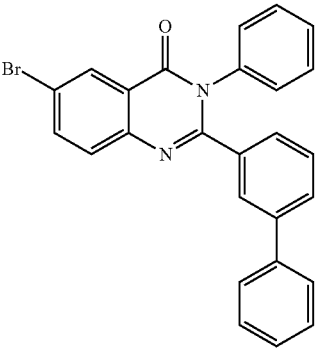 [SMILES: O=c1c2cc(Br)ccc2nc(-c2cccc(-c3ccccc3)c2)n1-c1ccccc1] | 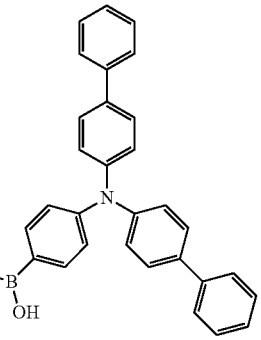\
[943836-24-8] | 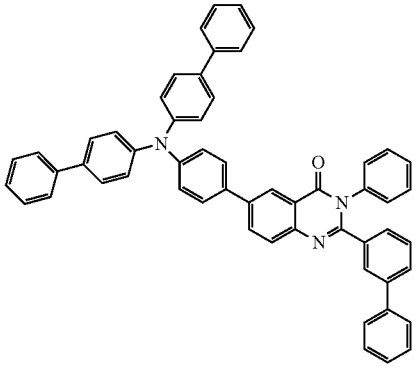 [SMILES: O=c1c2cc(-c3ccc(N(c4ccc(-c5ccccc5)cc4)c4ccc(-c5ccccc5)cc4)cc3)ccc2nc(-c2cccc(-c3ccccc3)c2)n1-c1ccccc1] | 83 |

-continued
| Ex | Reactant 1 | Reactant 2 | Product | Yield [%] |
|---|---|---|---|---|
| 3e | 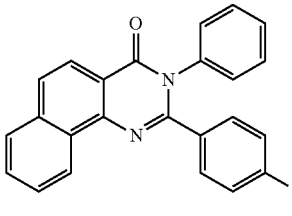 | 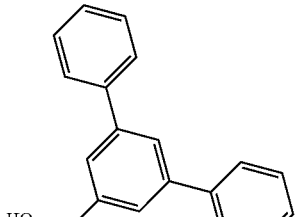<br>[128388-54-5] | 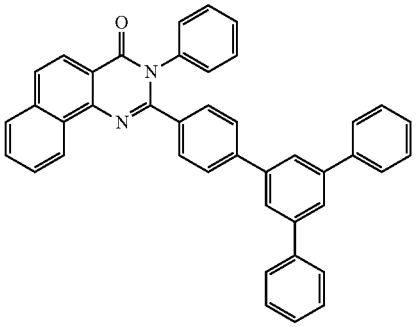 [SMILES: O=c1c2ccc3ccccc3c2nc(-c2ccc(-c3cc(-c4ccccc4)cc(-c4ccccc4)c3)cc2)n1-c1ccccc1] | 88 |
| 3f | 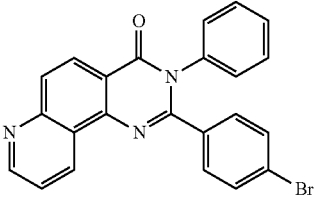 | 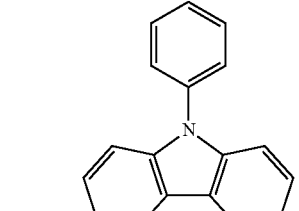<br>[854952-58-2] | 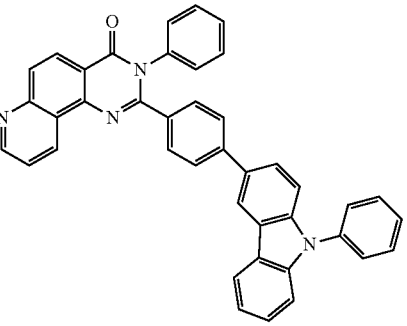 | 68 |
| 3g | 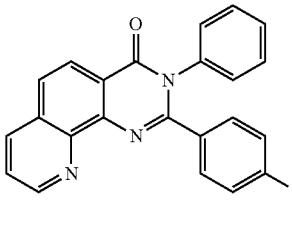 | 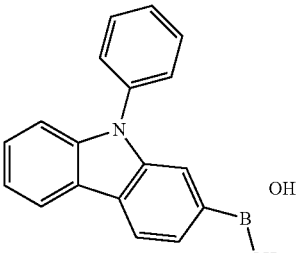<br>[1001911-63-2] | 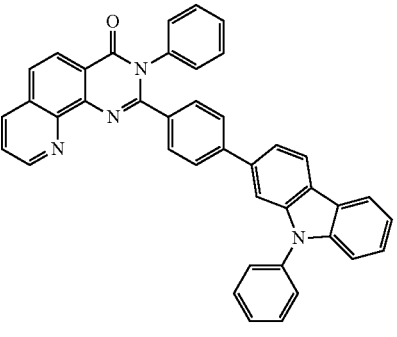 [SMILES: O=c1c2ccc3cccnc3c2nc(-c2ccc(-c3ccc4c5ccccc5n(-c5ccccc5)c4c3)cc2)n1-c1ccccc1] | 75 |
| 3h | 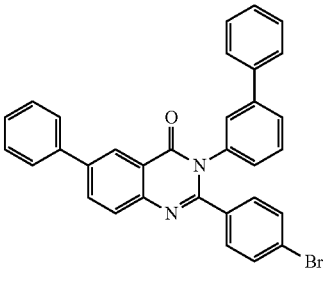 [SMILES: O=c1c2cc(-c3ccccc3)ccc2nc(-c2ccc(Br)cc2)n1-c1cccc(-c2ccccc2)c1] | 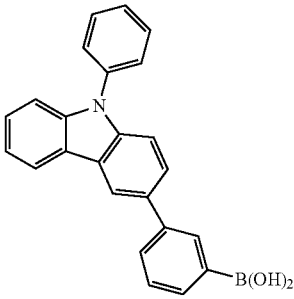<br>[854952-60-6] | 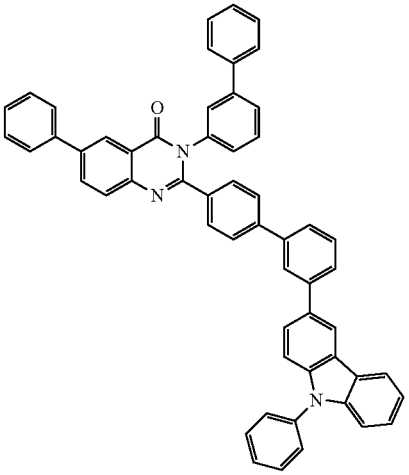 [SMILES: O=c1c2cc(-c3ccccc3)ccc2nc(-c2ccc(-c3cccc(-c4ccc5c(c4)c4ccccc4n5-c4ccccc4)c3)cc2)n1-c1cccc(-c2ccccc2)c1] | 76 |

| Ex | Reactant 1 | Reactant 2 | Product | Yield [%] |
|---|---|---|---|---|
| 3j | 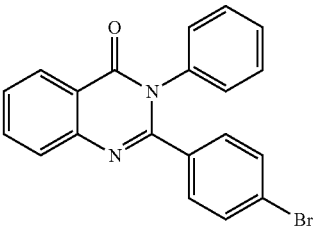 [SMILES: O=c1c2ccccc2nc(-c2ccc(Br)cc2)n1-c1ccccc1] | 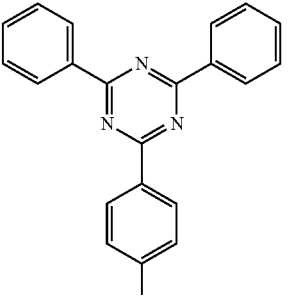  [1313018-07-3] | 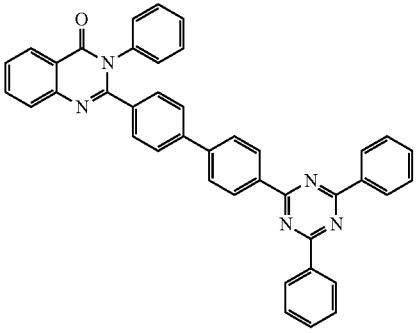 [SMILES: O=c1c2ccccc2nc(-c2ccc(-c3ccc(-c4nc(-c5ccccc5)nc(-c5ccccc5)n4)cc3)cc2)n1-c1ccccc1] | 83 |
| 3i | 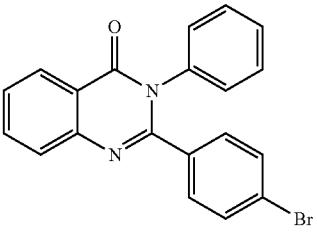 [SMILES: O=c1c2ccccc2nc(-c2ccc(Br)cc2)n1-c1ccccc1] | 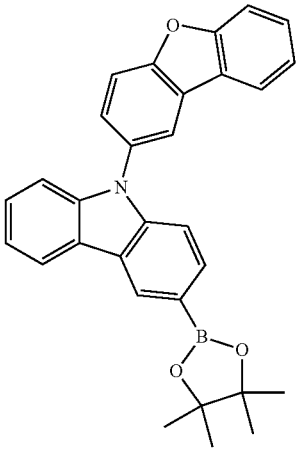  [1338488-91-7] | 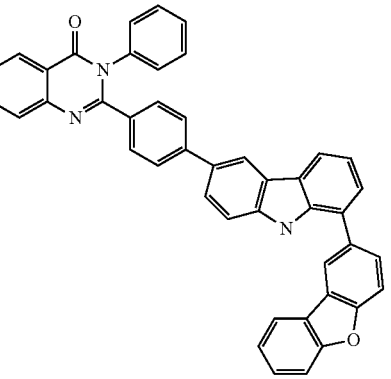 | 85 |
| 3k | 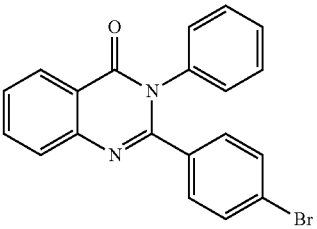 [SMILES: O=c1c2ccccc2nc(-c2ccc(Br)cc2)n1-c1ccccc1] | 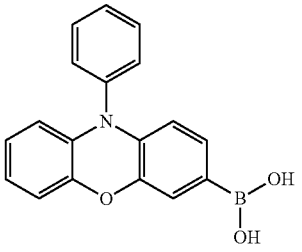  [1314019-67-4] | 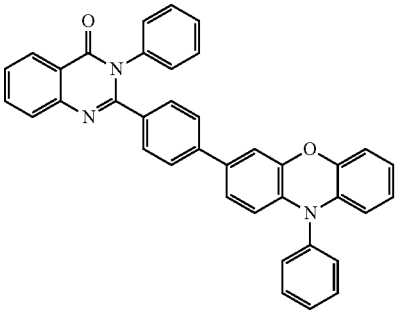 [SMILES: O=c1c2ccccc2nc(-c2ccc(-c3ccc4c(c3)Oc3ccccc3N4c3ccccc3)cc2)n1-c1ccccc1] | 88 |
| 3l | 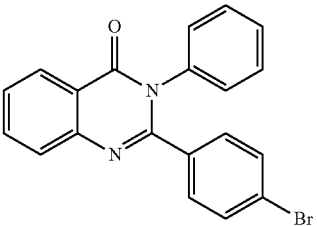 [SMILES: O=c1c2ccccc2nc(-c2ccc(Br)cc2)n1-c1ccccc1] | 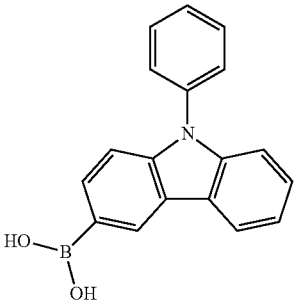  [854952-58-2] | 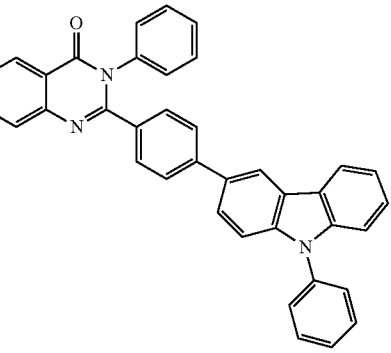 | 86 |

-continued
| Ex | Reactant 1 | Reactant 2 | Product | Yield [%] |
|---|---|---|---|---|
| 3m | 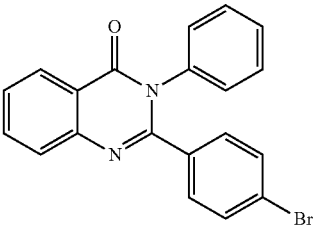 [SMILES: O=c1c2ccccc2nc(-c2ccc(Br)cc2)n1-c1ccccc1] | 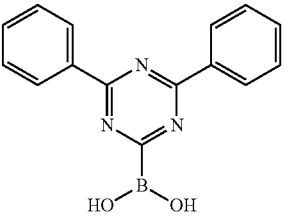 [1251825-65-6] | 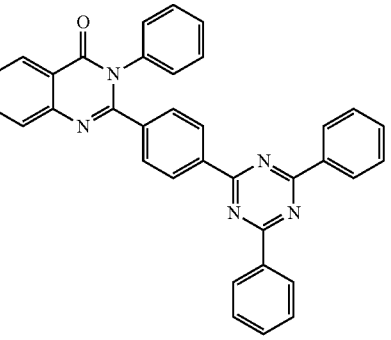 | 76 |
| 3n | 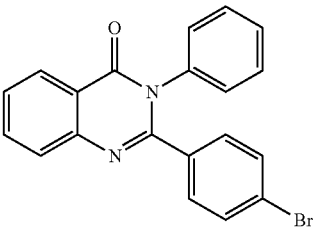 [SMILES: O=c1c2ccccc2nc(-c2ccc(Br)cc2)n1-c1ccccc1] | 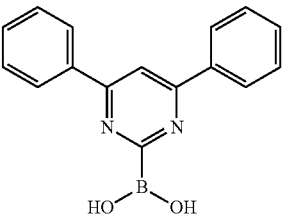 [1314221-56-1] | 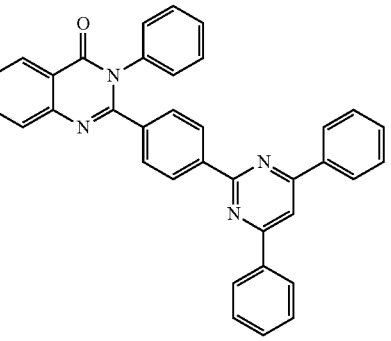 | 86 |
| 3o | 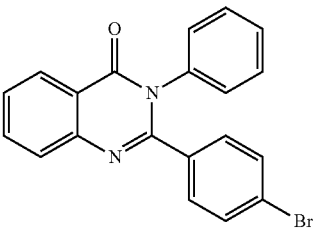 [SMILES: O=c1c2ccccc2nc(-c2ccc(Br)cc2)n1-c1ccccc1] | 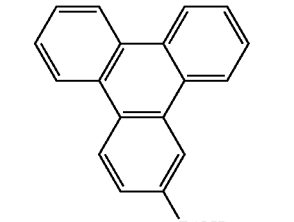 [654664-63-8] | 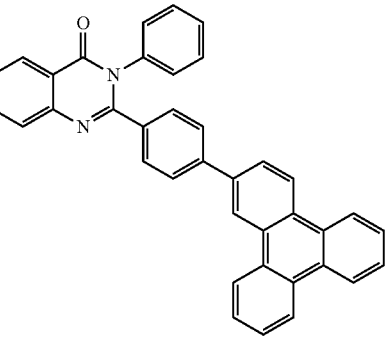 | 67 |
| 3p | 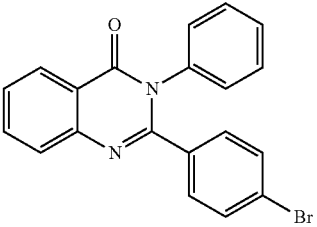 [SMILES: O=c1c2ccccc2nc(-c2ccc(Br)cc2)n1-c1ccccc1] | 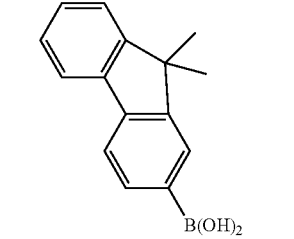 [333432-28-3] | 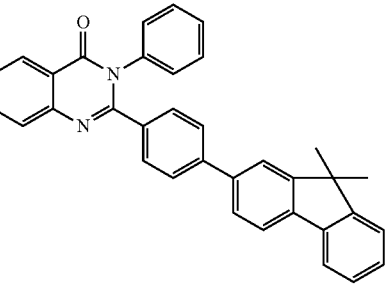 | 82 |

In analogy, the following compounds are obtained with 0.5 eq. of boron compound:
| Ex. | Reactant 1 | Reactant 2 | Product | Yield [%] |
|---|---|---|---|---|
| 3q | 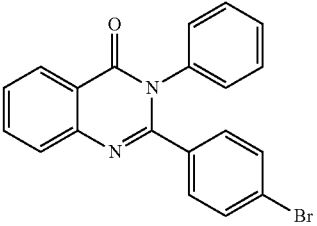 [SMILES: O=c1c2ccccc2nc(-c2ccc(Br)cc2)n1-c1ccccc1] | 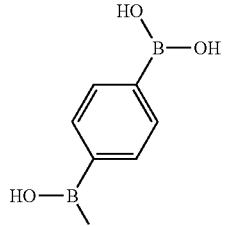 [4612-26-4] | 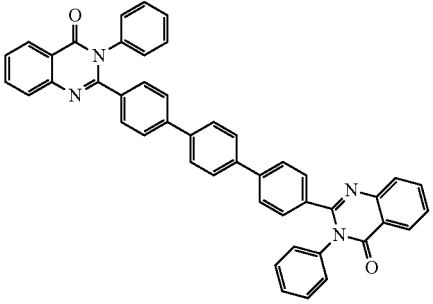 [SMILES: O=c1c2ccccc2nc(-c2ccc(-c3ccc(-c4ccc(-c5nc6ccccc6c(=O)n5-c5ccccc5)cc4)cc3)cc2)n1-c1ccccc1] | 86 |
| 3r | 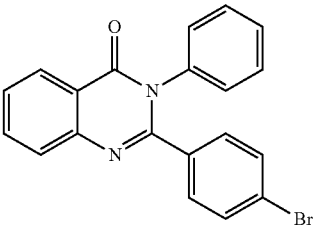 [SMILES: O=c1c2ccccc2nc(-c2ccc(Br)cc2)n1-c1ccccc1] | 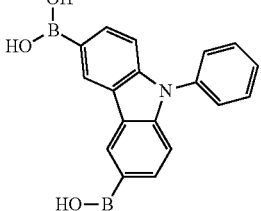 [1135916-40-3] | 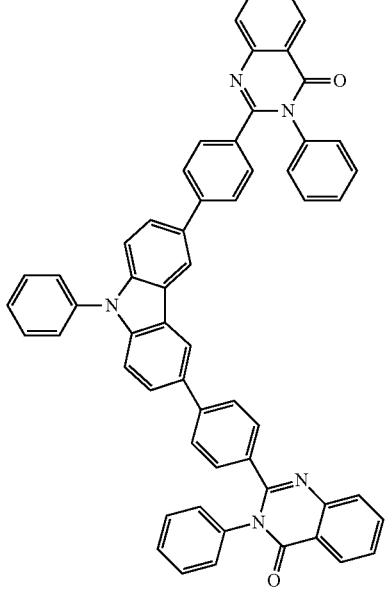 | 81 |
| 3s | 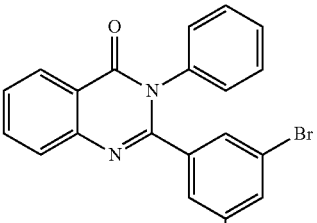 | 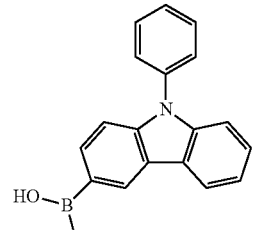 [854952-58-2] | 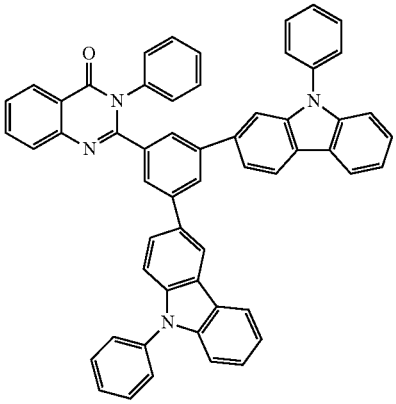 [SMILES: O=c1c2ccccc2nc(-c2cc(-c3ccc4c(c3)c3ccccc3n4-c3ccccc3)cc(-c3ccc4c5ccccc5n(-c5ccccc5)c4c3)c2)n1-c1ccccc1] | 83 |

Example 4: 2-[4-(3,6-Diphenylcarbazol-9-yl)-phenyl]-3-phenyl-3H-quinazolin-4-one

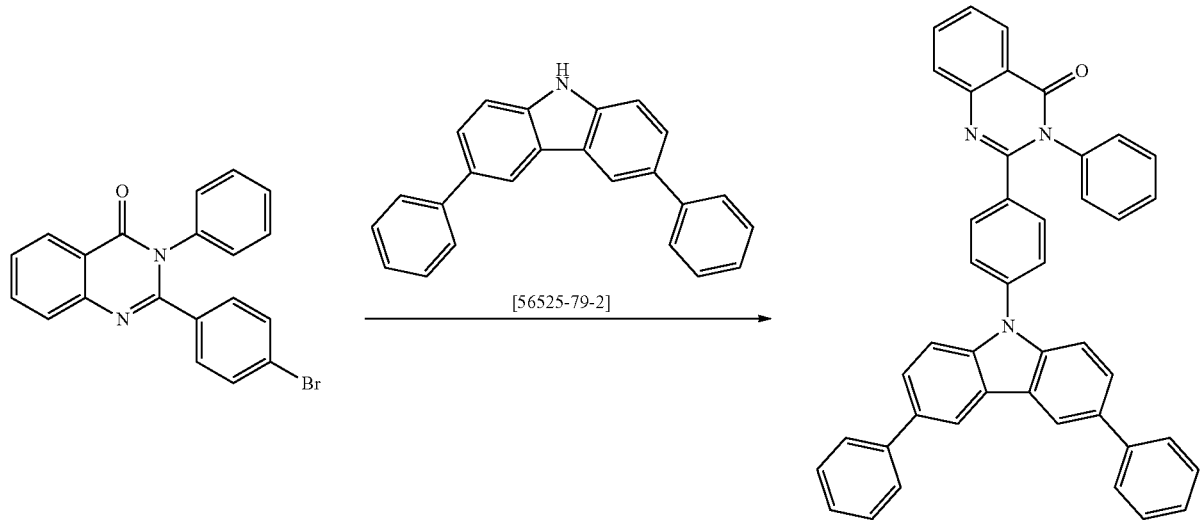 [SMILES: O=c1c2ccccc2nc(-c2ccc(Br)cc2)n1-c1ccccc1 ; c1ccc(-c2ccc3[nH]c4ccc(-c5ccccc5)cc4c3c2)cc1 ; O=c1c2ccccc2nc(-c2ccc(-n3c4ccc(-c5ccccc5)cc4c4cc(-c5ccccc5)ccc43)cc2)n1-c1ccccc1]

32 g (102.4 mmol) of 3,6-diphenyl-9H-carbazole, 42 g (112 mmol) of 2-(4-bromophenyl)-3-phenyl-3H-quinazolin-4-one and 2.3 g (10.2 mmol) of 1,3-di[2-pyridyl]propane-1,3-dione, 28.3 g (204 mmol) of potassium carbonate and 1.9 g (10.2 mmol) of copper iodide in 1000 ml of DMF are stirred under reflux for 90 h. The solution is diluted with water and extracted twice with ethyl acetate, and the combined organic phases are dried over $Na_2SO_4$ and concentrated by rotary evaporation and purified by chromatography (EtOAc/hexane: 2/3). The residue is recrystallized from toluene and from dichloromethane and finally sublimed under high vacuum; purity is 99.9%. The yield is 47 g (77 mmol), corresponding to 69% of theory.

In an analogous manner, the following compounds are obtained:

| Ex. | Reactant 1 | Reactant 2 | Product | Yield [%] |
|---|---|---|---|---|
| 4b | | [1257220-47-5] | | 66 |
| 4c | | [103012-26-6] | | 74 |
| 4d | | [1030735-14-8] | | 71 |

| Ex. | Reactant 1 | Reactant 2 | Product | Yield [%] |
|---|---|---|---|---|
| 4e | | [1024598-06-8] | | 70 |
| 4f | | [1386375-27-4] | | 65 |
| 4g | | [1257220-47-5] | | 69 |

| Ex. | Reactant 1 | Reactant 2 | Product | Yield [%] |
|---|---|---|---|---|
| 4h | (structure: 3-(4-bromophenyl)-2-phenylquinazolin-4(3H)-one) | (structure: indolocarbazole with gem-dimethyl fluorene) [1257220-47-5] | (structure: coupled product) | 72 |

Example 5: Production of the OLEDs

In examples 11 to 115 which follow (see Tables 1 and 2), the data of various OLEDs are presented. Cleaned glass plaques (cleaning in laboratory glass washer, Merck Extran detergent) coated with structured ITO (indium tin oxide) of thickness 50 nm are pretreated with UV ozone for 25 minutes (PR-100 UV ozone generator from UVP) and, within 20 min, for improved processing, coated with 20 nm of PEDOT:PSS (poly(3,4-ethylenedioxythiophene) poly(styrenesulphonate), purchased as CLEVIOS™ P VP AI 4083 from Heraeus Precious Metals GmbH Deutschland, spun on from aqueous solution) and then baked at 180° C. for 10 min. These coated glass plaques form the substrates to which the OLEDs are applied.

The OLEDs basically have the following layer structure: substrate/hole transport layer (HTL)/interlayer (IL)/electron blocker layer (EBL) emission layer (EML)/optional hole blocker layer (HBL)/electron transport layer (ETL) and finally a cathode. The cathode is formed by an aluminium layer of thickness 100 nm. The exact structure of the OLEDs can be found in Table 1. A reference such as "4a" in the table relates to the materials shown in the tables for the examples. The further materials required for production of the OLEDs are shown in table 3.

All materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as 4a:BIC1:TEG1 (30%:60%:10%) mean here that the material 4a is present in the layer in a proportion by volume of 30%, BIC1 in a proportion of 60% and TEG1 in a proportion of 10%. Analogously, the electron transport layer may also consist of a mixture of two materials.

The OLEDs are characterized in a standard manner. For this purpose, the electroluminescence spectra, the current efficiency (measured in cd/A), the power efficiency (measured in lm/W) and the external quantum efficiency (EQE, measured in percent) as a function of luminance, calculated from current-voltage-luminance characteristics (IUL characteristics) assuming Lambertian emission characteristics, and also the lifetime are determined. The electroluminescence spectra are determined at a luminance of 1000 cd/m², and the CIE 1931 x and y colour coordinates are calculated therefrom. The parameter 01000 in Table 2 refers to the voltage which is required for a luminance of 1000 cd/m². CE1000 and PE1000 respectively refer to the current and power efficiencies which are achieved at 1000 cd/m². Finally, EQE1000 refers to the external quantum efficiency at an operating luminance of 1000 cd/m².

The data for the various OLEDs are collated in Table 2.

TABLE 1

| | Structure of the OLEDs | | | | | |
|---|---|---|---|---|---|---|
| Ex. | HTL thickness | IL thickness | EBL thickness | EML thickness | HBL thickness | ETL thickness |
| I1 | SpA1 70 nm | HATCN 5 nm | SpMA1 90 nm | 2q:TEG1 (85%:15%) 30 nm | IC1 10 nm | ST1:LiQ (50%:50%) 30 nm |
| I2 | SpA1 70 nm | HATCN 5 nm | SpMA1 90 nm | 2r:TEG1 (85%:15%) 30 nm | IC1 10 nm | ST1:LiQ (50%:50%) 30 nm |

TABLE 1-continued

Structure of the OLEDs

| Ex. | HTL thickness | IL thickness | EBL thickness | EML thickness | HBL thickness | ETL thickness |
|---|---|---|---|---|---|---|
| I3 | SpA1 70 nm | HATCN 5 nm | SpMA1 90 nm | 2s:TEG1 (85%:15%) 30 nm | IC1 10 nm | ST1:LiQ (50%:50%) 30 nm |
| I4 | SpA1 70 nm | HATCN 5 nm | SpMA1 90 nm | 2s:TEG1 (90%:10%) 30 nm | IC1 10 nm | ST1:LiQ (50%:50%) 30 nm |
| I5 | SpA1 70 nm | HATCN 5 nm | SpMA1 90 nm | 2s:IC1:TEG1 (42%:42%:16%) 30 nm | ST1 10 nm | ST1:LiQ (50%:50%) 30 nm |
| I6 | SpA1 70 nm | HATCN 5 nm | SpMA1 90 nm | 2f:TEG1 (90%:15%) 30 nm | IC1 10 nm | ST1:LiQ (50%:50%) 30 nm |
| I7 | SpA1 70 nm | HATCN 5 nm | SpMA1 90 nm | 4:TEG1 (90%:15%) 30 nm | IC1 10 nm | ST1:LiQ (50%:50%) 30 nm |
| I8 | SpA1 90 nm | HATCN 5 nm | SpMA1 130 nm | 3d:TER1 (92%:8%) 40 nm | — | ST1:LiQ (50%:50%) 40 nm |
| I9 | SpA1 70 nm | HATCN 5 nm | SpMA1 90 nm | 3m:TEG1 (90%:15%) 30 nm | IC1 10 nm | ST1:LiQ (50%:50%) 30 nm |
| I10 | SpA1 70 nm | HATCN 5 nm | SpMA1 90 nm | 4a:TEG1 (90%:10%) 30 nm | IC1 10 nm | ST1:LiQ (50%:50%) 30 nm |
| I11 | SpA1 70 nm | HATCN 5 nm | SpMA1 90 nm | 4a:IC1:TEG1 (45%:45%:10%) 30 nm | IC1 10 nm | ST1:LiQ (50%:50%) 30 nm |
| I12 | SpA1 70 nm | HATCN 5 nm | SpMA1 90 nm | 4a:BIC1:TEG1 (30%:60%:10%) 30 nm | IC1 10 nm | ST1:LiQ (50%:50%) 30 nm |
| I13 | SpA1 70 nm | HATCN 5 nm | SpMA1 90 nm | 4h:TEG1 (90%:10%) 30 nm | IC1 10 nm | ST1:LiQ (50%:50%) 30 nm |
| I14 | SpA1 70 nm | HATCN 5 nm | SpMA1 90 nm | 4h:BIC1:TEG1 (60%:30%:10%) 30 nm | IC1 10 nm | ST1:LiQ (50%:50%) 30 nm |
| I15 | SpA1 70 nm | HATCN 5 nm | SpMA1 90 nm | 4h:TEG2 (90%:15%) 30 nm | IC1 10 nm | ST1:LiQ (50%:50%) 30 nm |

TABLE 2

Data of the OLEDs

| Ex. | U1000 (V) | CE1000 (cd/A) | PE1000 (lm/W) | EQE 1000 | CIE x/y at 1000 cd/m$^2$ |
|---|---|---|---|---|---|
| E1 | 3.8 | 57 | 48 | 15.8% | 0.32/0.63 |
| E2 | 3.7 | 56 | 47 | 15.7% | 0.33/0.62 |
| E3 | 3.7 | 59 | 50 | 16.5% | 0.32/0.62 |
| E4 | 3.9 | 61 | 50 | 16.6% | 0.32/0.63 |
| E5 | 3.2 | 63 | 62 | 17.1% | 0.33/0.63 |
| E6 | 3.6 | 62 | 56 | 17.8% | 0.32/0.62 |
| E7 | 3.7 | 60 | 50 | 16.8% | 0.32/0.63 |
| E8 | 4.9 | 10.3 | 6.6 | 11.0% | 0.67/0.33 |
| E9 | 3.4 | 61 | 57 | 17.4% | 0.34/0.62 |
| E10 | 3.6 | 49 | 43 | 13.7% | 0.34/0.62 |
| E11 | 3.1 | 52 | 54 | 14.7% | 0.33/0.62 |
| E12 | 3.6 | 47 | 41 | 13.1% | 0.32/0.63 |
| E13 | 3.9 | 58 | 48 | 16.3% | 0.32/0.63 |
| E14 | 3.9 | 54 | 43 | 15.1% | 0.33/0.62 |
| E15 | 3.8 | 57 | 47 | 16.1% | 0.34/0.61 |

TABLE 3
Structural formulae of the materials for the OLEDs
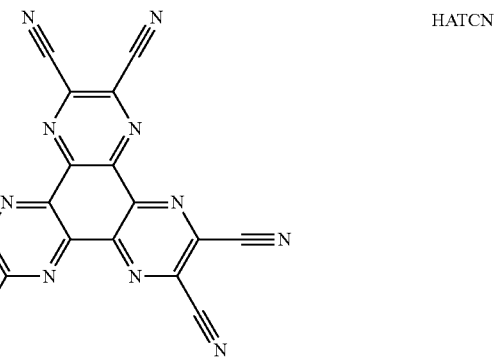
HATCN
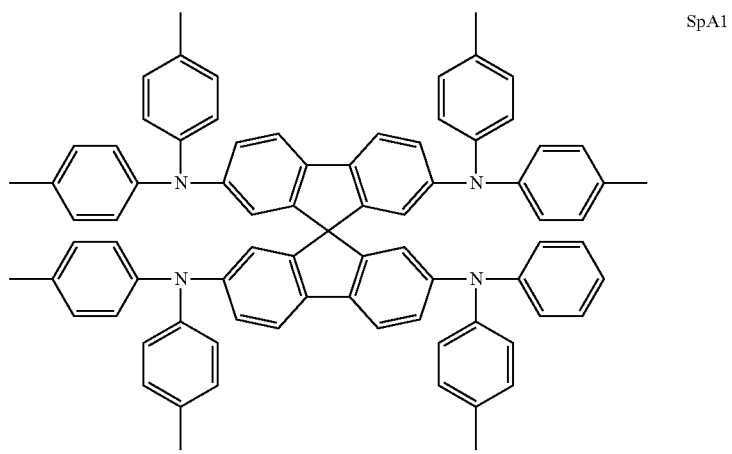
SpA1
LiQ
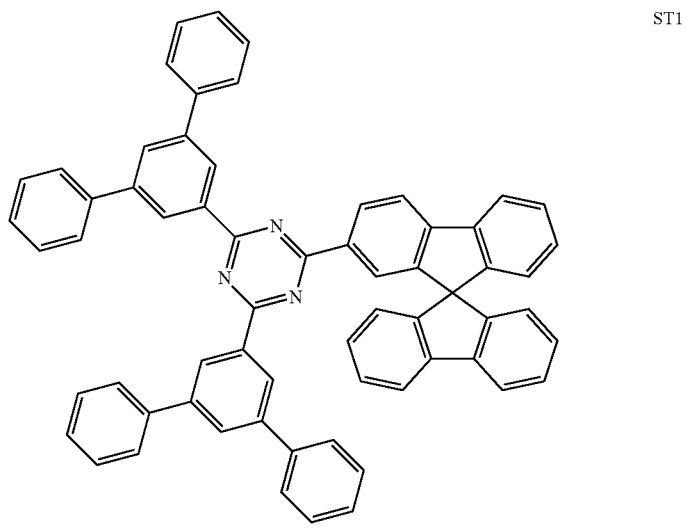
ST1

TABLE 3-continued
Structural formulae of the materials for the OLEDs
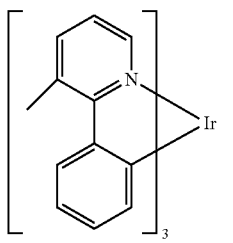
TEG1
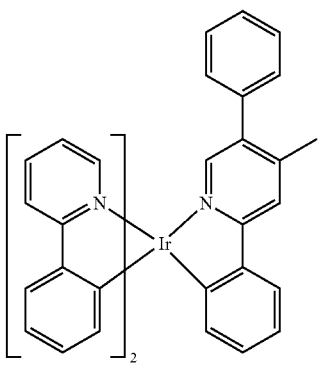
TEG2
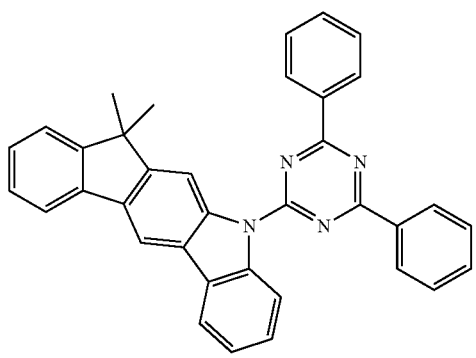 [SMILES: CC1(C)c2ccccc2-c2cc3c4ccccc4n(-c4nc(-c5ccccc5)nc(-c5ccccc5)n4)c3cc21]
IC1
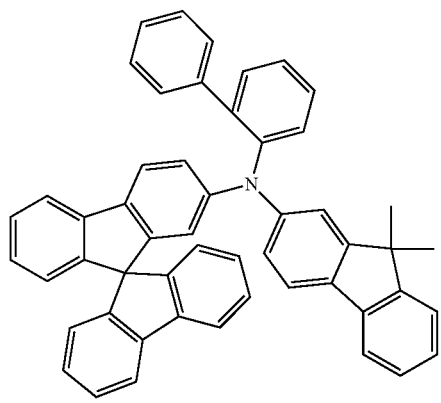 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
SpMA1
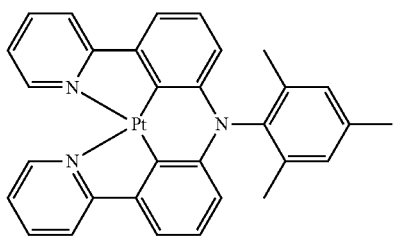
TER1

TABLE 3-continued
Structural formulae of the materials for the OLEDs
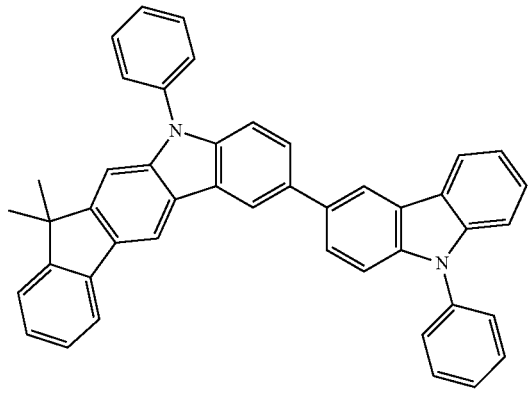 [SMILES: CC1(C)c2ccccc2-c2cc3c4cc(-c5ccc6c(c5)c5ccccc5n6-c5ccccc5)ccc4n(-c4ccccc4)c3cc21]
BIC1
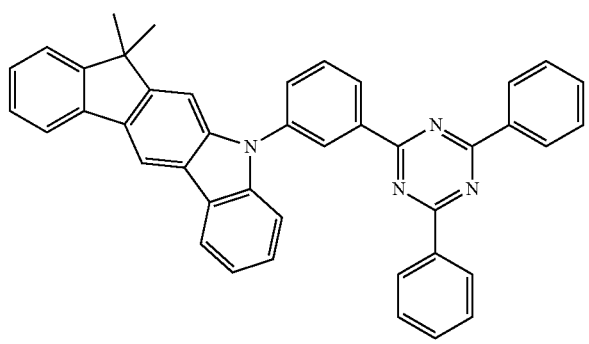 [SMILES: CC1(C)c2ccccc2-c2cc3c4ccccc4n(-c4cccc(-c5nc(-c6ccccc6)nc(-c6ccccc6)n5)c4)c3cc21]
IC1
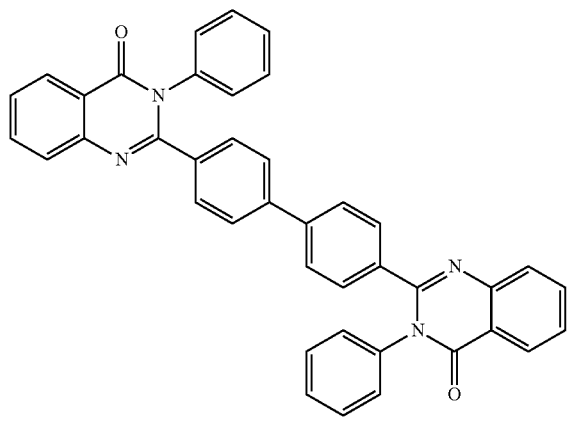 [SMILES: O=c1c2ccccc2nc(-c2ccc(-c3ccc(-c4nc5ccccc5c(=O)n4-c4ccccc4)cc3)cc2)n1-c1ccccc1]
2q
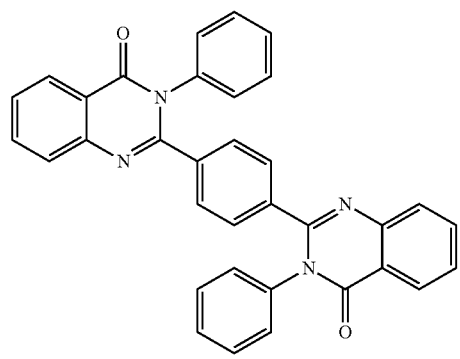 [SMILES: O=c1c2ccccc2nc(-c2ccc(-c3nc4ccccc4c(=O)n3-c3ccccc3)cc2)n1-c1ccccc1]
2r TABLE 3-continued
Structural formulae of the materials for the OLEDs
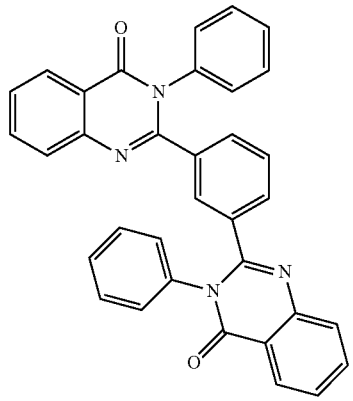 [SMILES: O=c1c2ccccc2nc(-c2cccc(-c3nc4ccccc4c(=O)n3-c3ccccc3)c2)n1-c1ccccc1]
2s
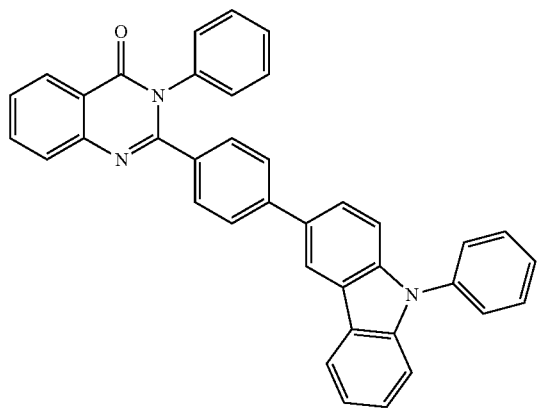 [SMILES: O=c1c2ccccc2nc(-c2ccc(-c3ccc4c(c3)c3ccccc3n4-c3ccccc3)cc2)n1-c1ccccc1]
2f
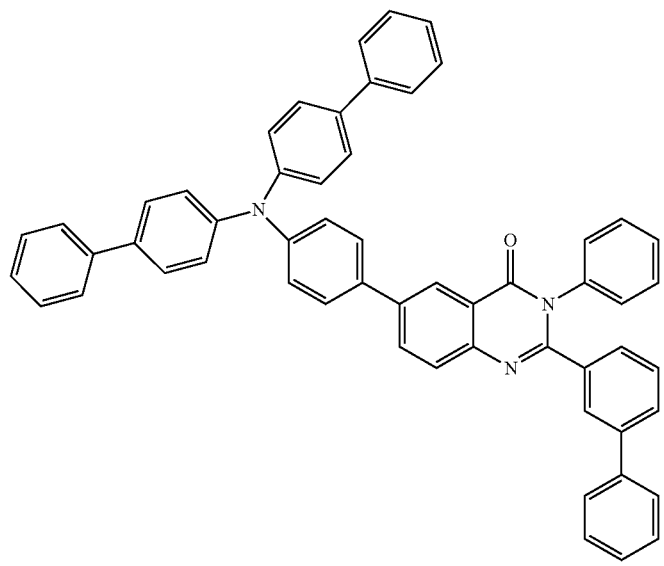 [SMILES: O=c1c2cc(-c3ccc(N(c4ccc(-c5ccccc5)cc4)c4ccc(-c5ccccc5)cc4)cc3)ccc2nc(-c2cccc(-c3ccccc3)c2)n1-c1ccccc1]
3d TABLE 3-continued
Structural formulae of the materials for the OLEDs
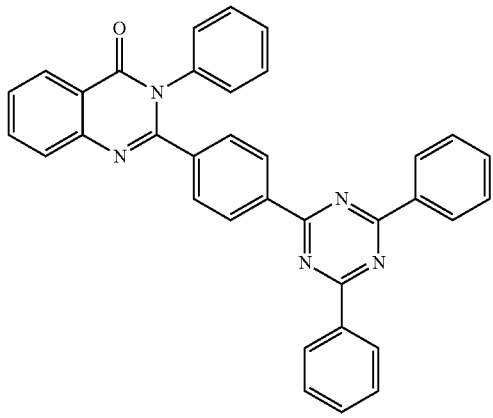
3m
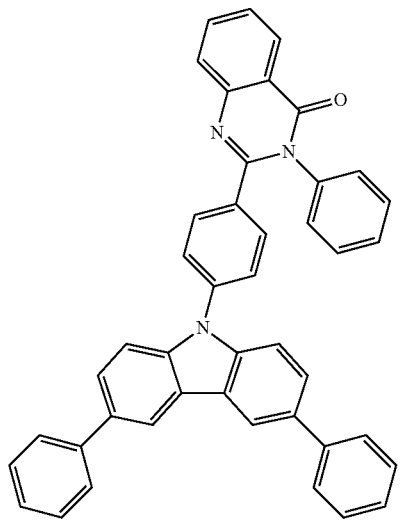 [SMILES: O=c1c2ccccc2nc(-c2ccc(-n3c4ccc(-c5ccccc5)cc4c4cc(-c5ccccc5)ccc43)cc2)n1-c1ccccc1]
4
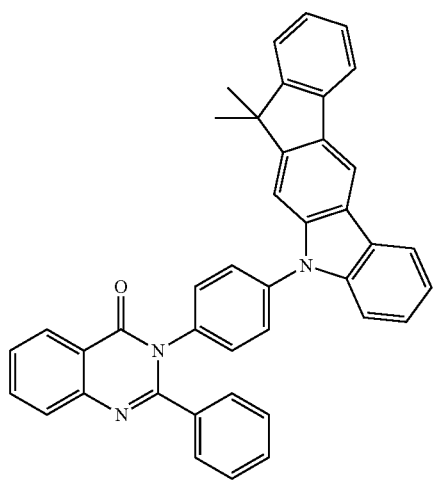 [SMILES: CC1(C)c2ccccc2-c2cc3c4ccccc4n(-c4ccc(-n5c(-c6ccccc6)nc6ccccc6c5=O)cc4)c3cc21]
4a TABLE 3-continued Structural formulae of the materials for the OLEDs

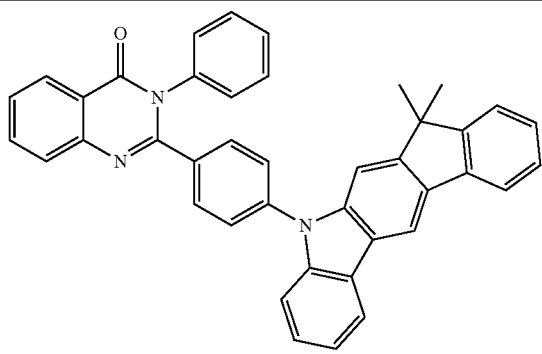

4h

The invention claimed is:

1. A mixture comprising at least one phosphorescent dopant and at least one compound of the Formula (1)

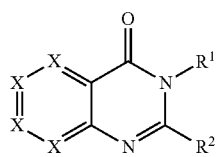

Formula (1)

where the symbols and indices used are as follows:

X is the same or different at each instance and is N or $CR^3$, where not more than 2 X per heteroaryl group are N;

$R^1$ is an aromatic or heteroaromatic ring system which has 5 to 60 aromatic ring atoms and is optionally substituted in each case by one or more $R^4$ radicals;

$R^2$ is an aromatic or heteroaromatic ring system selected from the groups having the following Formulae (Ar-3) to (Ar-27):

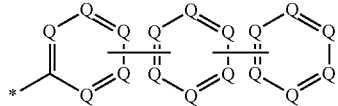

Formula (Ar-3)

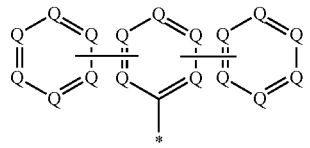

Formula (Ar-4)

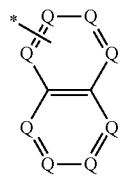

Formula (Ar-5)

-continued

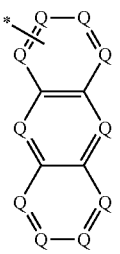

Formula (Ar-6)

Formula (Ar-7)

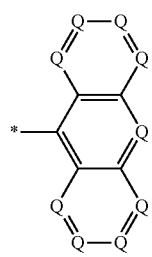

Formula (Ar-8)

Formula (Ar-9)

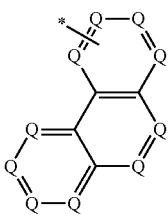

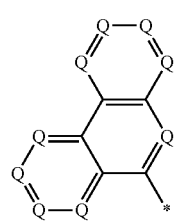

Formula (Ar-10)

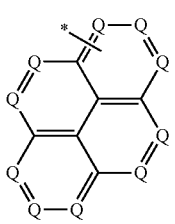

Formula (Ar-11)

Formula (Ar-12)

Formula (Ar-13)

Formula (Ar-14)

Formula (Ar-15)

Formula (Ar-16)

Formula (Ar-17)

Formula (Ar-18)

Formula (Ar-19)

Formula (Ar-20)

Formula (Ar-21)

Formula (Ar-22)

Formula (Ar-23)

Formula (Ar-24)

Formula (Ar-25)

Formula (Ar-26)

-continued

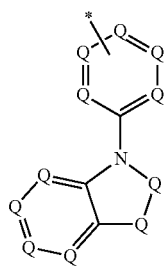

Formula (Ar-27)

Q is the same or different at each instance and is CR$^4$ or N, where not more than 3 Q symbols per cycle are N;

E is the same or different at each instance and is (CR$^4$)$_2$, NR$^4$, O, S or C=O;

G at each instance is a single bond, (CR$^4$)$_2$, NR$^4$, O, S or C=O;

n is 0 or 1, where n=0 means that no E group is bonded at this position and R$^4$ radicals are bonded to the corresponding carbon atoms instead;

Ar$^2$ is the same or different at each instance and is a bivalent aromatic or heteroaromatic ring system which has 5 to 60 aromatic ring atoms and may be substituted by one or more R$^4$ radicals;

Ar$^1$ are the same or different at each instance and are an aromatic or heteroaromatic ring system which has 6 to 60 aromatic ring atoms and may in each case also be substituted by one or more R$^4$ radicals; where the two Ar$^1$ may be joined and/or Ar$^1$ may be joined to Ar$^2$ via at least one bridge K in each case;

K is the same or different at each instance and is a single bond or a divalent bridge selected from N(R$^4$), B(R$^4$), O, C=O, C(R$^4$)$_2$, Si(R$^4$)$_2$ and S; and

* represents the bond to the quinazolinone base skeleton;

R$^3$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si(R$^4$)$_3$, B(OR$^4$)$_2$, OSO$_2$R$^4$, N(R$^4$)$_2$, a straight-chain alkyl, alkoxy or thioalkoxy group having 1 to 40 carbon atoms or a branched or cyclic alkyl, alkoxy or thioalkoxy group having 3 to 40 carbon atoms and is optionally substituted in each case by one or more R$^4$ radicals, where one or more nonadjacent CH$_2$ groups is optionally replaced by C≡C, Si(R$^4$)$_2$, Ge(R$^4$)$_2$, Sn(R$^4$)$_2$, C=O, C=S, C=Se, P(=O)(R$^4$), SO, SO$_2$, O, S or CONR$^4$ and where one or more hydrogen atoms is optionally replaced by D, F, Cl, Br, I, CN or NO$_2$, or an aromatic or heteroaromatic ring system which has 5 to 60 aromatic ring atoms and is optionally substituted in each case by one or more R$^4$ radicals, or an aryloxy or heteroaryloxy group which has 5 to 60 aromatic ring atoms and is optionally substituted by one or more R$^4$ radicals;

Ar is the same or different at each instance and is an aromatic or heteroaromatic ring system which has 6 to 60 aromatic ring atoms and may also be substituted in each case by one or more R$^4$ radicals, R$^4$ is the same or different at each instance and is H, D, F, Cl, Br, I, CHO, C(=O)R$^5$, P(=O)(R$^5$)$_2$, S(=O)R$^5$, S(=O)$_2$R$^5$, CN, NO$_2$, Si(R$^5$)$_3$, B(OR$^5$)$_2$, OSO$_2$R$^5$, N(R$^5$)$_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more R$^5$ radicals, where one or more nonadjacent CH$_2$ groups is optionally replaced by C≡C, Si(R$^5$)$_2$, Ge(R$^5$)$_2$, Sn(R$^5$)$_2$, C=O, C=S, C=Se, P(=O)(R$^5$), SO, SO$_2$, O, S or CONR$^5$ and where one or more hydrogen atoms is optionally replaced by D, F, Cl, Br, I, CN or NO$_2$, or an aromatic or heteroaromatic ring system which has 5 to 60 aromatic ring atoms, each of which is optionally substituted by one or more R$^5$ radicals, or an aryloxy or heteroaryloxy group which has 5 to 60 aromatic ring atoms and is optionally substituted by one or more R$^5$ radicals;

R$^5$ is the same or different at each instance and is H, D, F, Cl, Br, I, N(R$^6$)$_2$, C(=O)R$^6$, P(=O)(R$^6$)$_2$, S(=O) R$^6$, S(=O)$_2$R$^6$, CR$^6$=C(R$^6$)$_2$, CN, NO$_2$, Si(R$^6$)$_3$, B(OR$^6$)$_2$, OSO$_2$R$^6$, N(R$^6$)$_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more R$^6$ radicals, where one or more nonadjacent CH$_2$ groups is optionally replaced by R$^6$C=CR$^6$, C≡C, Si(R$^6$)$_2$, C=O, C=NR$^6$, P(=O)(R$^6$), SO, SO$_2$, NR$^6$, O, S or CONR$^6$ and where one or more hydrogen atoms is optionally replaced by D, F, Cl, Br, I, CN or NO$_2$, or an aromatic or heteroaromatic ring system which has 5 to 60 aromatic ring atoms, each of which is optionally substituted by one or more R$^6$ radicals, or an aryloxy or heteroaryloxy group which has 5 to 60 aromatic ring atoms and is optionally substituted by one or more R$^6$ radicals, or an aralkyl or heteroaralkyl group which has 5 to 60 aromatic ring atoms and is optionally substituted by one or more R$^6$ radicals;

R$^6$ is the same or different at each instance and is H, D, F or an aliphatic hydrocarbyl radical having 1 to 20 carbon atoms or an aryl or heteroaryl group which has 5 to 60 ring atoms and is optionally substituted by one or more R$^7$ radicals; and R$^7$ is the same or different at each instance and is H, D, F or an aliphatic hydrocarbyl radical having 1 to 20 carbon atoms.

2. The mixture according to claim 1, wherein the at least one compound of one of the Formula (1) is at least one compound of Formula (3):

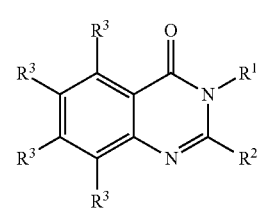

Formula (3)

where

R$^1$ is an aromatic or heteroaromatic ring system which has 5 to 60 aromatic ring atoms and is optionally substituted in each case by one or more R$^4$ radicals;

R$^2$ is an aromatic or hetero aromatic ring system selected from the groups having the following Formulae (Ar-3) to (Ar-27):

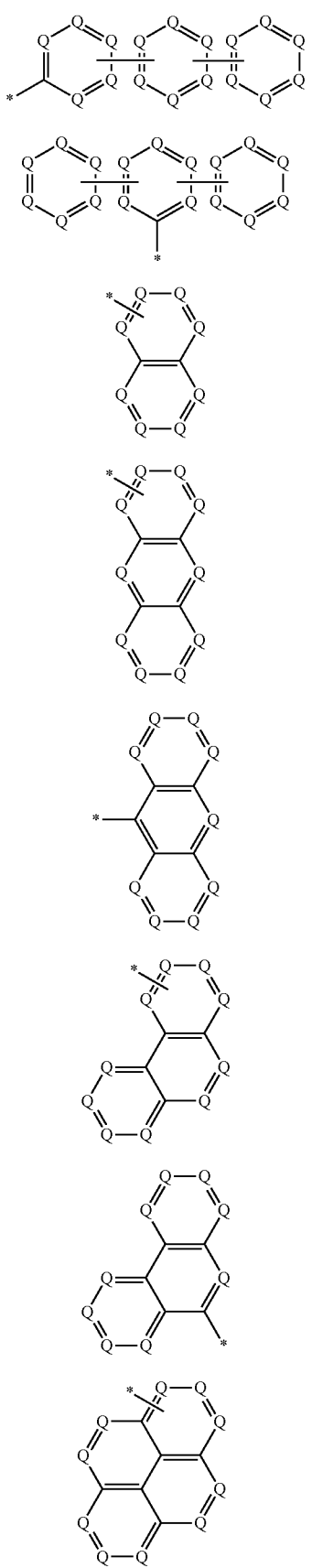
-continued
Formula (Ar-11)
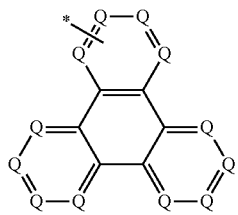
Formula (Ar-12)
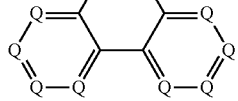
Formula (Ar-13)
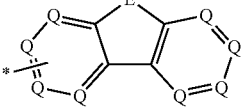
Formula (Ar-14)
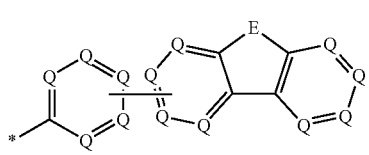
Formula (Ar-15)
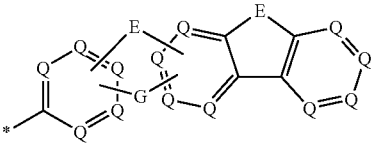
Formula (Ar-16)
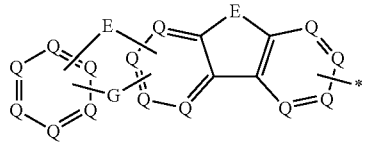
Formula (Ar-17)
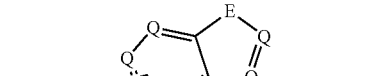
Formula (Ar-18)
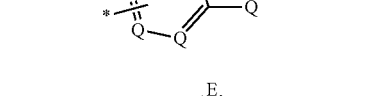
Formula (Ar-19)
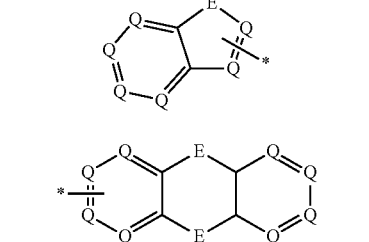
Formula (Ar-20)
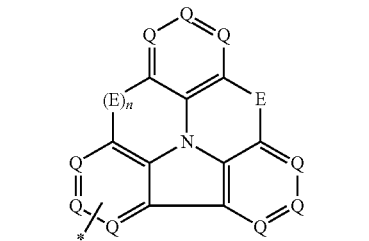

-continued

Formula (Ar-21)

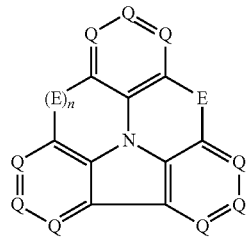

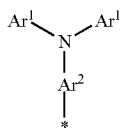

Formula (Ar-23)

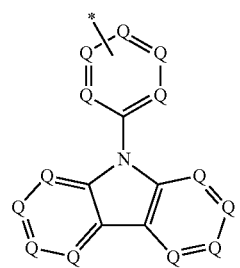

Formula (Ar-24)

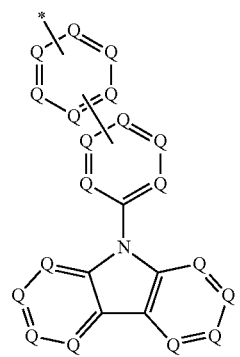

Formula (Ar-25)

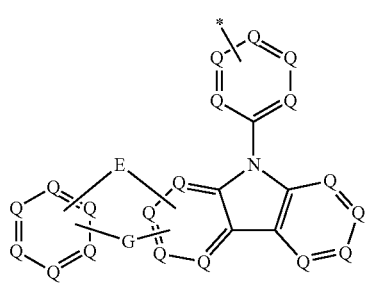

Formula (Ar-26)

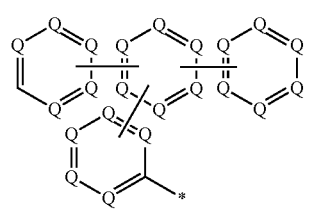

-continued

Formula (Ar-22)

Formula (Ar-27)

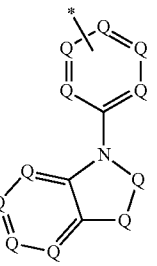

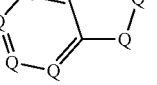

Q is the same or different at each instance and is $CR^4$ or N, where not more than 3 Q symbols per cycle are N;

E is the same or different at each instance and is $(CR^4)_2$, $NR^4$, O, S or C=O;

G at each instance is a single bond, $(CR^4)_2$, $NR^4$, O, S or C=O;

n is 0 or 1, where n=0 means that no E group is bonded at this position and $R^4$ radicals are bonded to the corresponding carbon atoms instead;

$Ar^2$ is the same or different at each instance and is a bivalent aromatic or heteroaromatic ring system which has 5 to 60 aromatic ring atoms and may be substituted by one or more $R^4$ radicals;

$Ar^1$ are the same or different at each instance and are an aromatic or heteroaromatic ring system which has 6 to 60 aromatic ring atoms and may in each case also be substituted by one or more $R^4$ radicals; where the two $Ar^1$ may be joined and/or $Ar^1$ may be joined to $Ar^2$ via at least one bridge K in each case;

K is the same or different at each instance and is a single bond or a divalent bridge selected from $N(R^4)$, $B(R^4)$, O, C=O, $C(R^4)_2$, $Si(R^4)_2$ and S; and

* represents the bond to the quinazolinone base skeleton;

$R^3$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si(R$^4$)$_3$, B(OR$^4$)$_2$, OSO$_2$R$^4$, N(R$^4$)$_2$, a straight-chain alkyl, alkoxy or thioalkoxy group having 1 to 40 carbon atoms or a branched or cyclic alkyl, alkoxy or thioalkoxy group having 3 to 40 carbon atoms and is optionally substituted in each case by one or more $R^4$ radicals, where one or more non-adjacent CH$_2$ groups is optionally replaced by C≡C, Si(R$^4$)$_2$, Ge(R$^4$)$_2$, Sn(R$^4$)$_2$, C=O, C=S, C=Se, P(=O)(R$^4$), SO, SO$_2$, O, S or CONR$^4$ and where one or more hydrogen atoms is optionally replaced by D, F, Cl, Br, I, CN or NO$_2$, or an aromatic or heteroaromatic ring system which has 5 to 60 aromatic ring atoms and is optionally substituted in each case by one or more $R^4$ radicals, or an aryloxy or heteroaryloxy group which has 5 to 60 aromatic ring atoms and is optionally substituted by one or more $R^4$ radicals;

Ar is the same or different at each instance and is an aromatic or heteroaromatic ring system which has 6 to 60 aromatic ring atoms and may also be substituted in each case by one or more $R^4$ radicals, $R^4$ is the same or different at each instance and is H, D, F, Cl, Br, I, CHO, C(=O)R$^5$, P(=O)(R$^5$)$_2$, S(=O)R$^5$, S(=O)$_2$R$^5$, CN, NO$_2$, Si(R$^5$)$_3$, B(OR$^5$)$_2$, OSO$_2$R$^5$, N(R$^5$)$_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more $R^5$ radicals, where one or more nonadjacent $CH_2$ groups is optionally replaced by $C \equiv C$, $Si(R^5)_2$, $Ge(R^5)_2$, $Sn(R^5)_2$, $C=O$, $C=S$, $C=Se$, $P(=O)(R^5)$, SO, $SO_2$, O, S or $CONR^5$ and where one or more hydrogen atoms is optionally replaced by D, F, Cl, Br, I, CN or $NO_2$, or an aromatic or heteroaromatic ring system which has 5 to 60 aromatic ring atoms, each of which is optionally substituted by one or more $R^5$ radicals, or an aryloxy or heteroaryloxy group which has 5 to 60 aromatic ring atoms and is optionally substituted by one or more $R^5$ radicals;

$R^5$ is the same or different at each instance and is H, D, F, Cl, Br, I, $N(R^6)_2$, $C(=O)R^6$, $P(=O)(R^6)_2$, $S(=O)R^6$, $S(=O)_2R^6$, $CR^6=C(R^6)_2$, CN, $NO_2$, $Si(R^6)_3$, $B(OR^6)_2$, $OSO_2R^6$, $N(R^6)_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more $R^6$ radicals, where one or more nonadjacent $CH_2$ groups is optionally replaced by $R^6C=CR^6$, $C \equiv C$, $Si(R^6)_2$, $C=O$, $C=NR^6$, $P(=O)(R^6)$, SO, $SO_2$, $NR^6$, O, S or $CONR^6$ and where one or more hydrogen atoms is optionally replaced by D, F, Cl, Br, I, CN or $NO_2$, or an aromatic or heteroaromatic ring system which has 5 to 60 aromatic ring atoms, each of which is optionally substituted by one or more $R^6$ radicals, or an aryloxy or heteroaryloxy group which has 5 to 60 aromatic ring atoms and is optionally substituted by one or more $R^6$ radicals, or an aralkyl or heteroaralkyl group which has 5 to 60 aromatic ring atoms and is optionally substituted by one or more $R^6$ radicals;

$R^6$ is the same or different at each instance and is H, D, F or an aliphatic hydrocarbyl radical having 1 to 20 carbon atoms or an aryl or heteroaryl group which has 5 to 60 ring atoms and is optionally substituted by one or more $R^7$ radicals; and $R^7$ is the same or different at each instance and is H, D, F or an aliphatic hydrocarbyl radical having 1 to 20 carbon atoms.

3. The mixture according to claim 1, wherein the at least one phosphorescent dopant comprises a compound which, at room temperature, exhibits luminescence from an excited state with spin multiplicity >1.

4. The mixture according to claim 3, wherein the at least one phosphorescent dopant comprises a compound which emits light under suitable excitation and contains at least one atom of atomic number greater than 20.

5. The mixture according to claim 4, wherein the at least one phosphorescent dopant comprises a compound containing at least one atom of atomic number greater than 56 and less than 80.

6. The mixture according to claim 5, wherein the at least one phosphorescent dopant comprises a compound containing copper, molybdenum, tungsten, rhenium, ruthenium, osmium, rhodium, iridium, palladium, platinum, silver, gold and/or europium.

7. The mixture according to claim 6, wherein the at least one phosphorescent dopant comprises a compound selected from the Formulae (D-1) to (D-4)

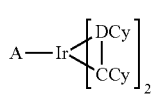

Formula (D-1)

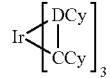

Formula (D-2)

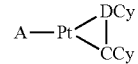

Formula (D-3)

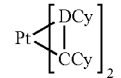

Formula (D-4)

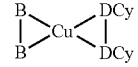

Formula (D-5)

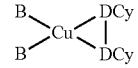

Formula (D-6)

where R has the same definition as described above for formula (1), and the further symbols used are as follows:

DCy is the same or different at each instance and is a cyclic group which contains at least one donor atom or bears it as a substituent via which the cyclic group is bonded to the metal, and which may in turn bear one or more $R^4$ substituents; the DCy and CCy groups are joined to one another via a covalent bond;

CCy is the same or different at each instance and is a cyclic group which contains a carbon atom via which the cyclic group is bonded to the metal, and which may in turn bear one or more $R^4$ substituents;

A is the same or different at each instance and is a monoanionic ligand with bidentate chelation, and B is the same or different at each instance and is a compound comprising at least one donor atom which binds to the metal.

8. A process for producing the mixture according to claim 1, wherein the compound of the Formula (1) is formed by one or more coupling reactions and/or cyclizations.

9. A formulation comprising at least one mixture according to claim 1 and one or more solvents.

10. A solution, a suspension or a miniemulsion comprising at least one mixture according to claim 1 and one or more solvents.

11. An electronic device comprising the mixture according to claim 1.

12. The electronic device as claimed in claim 11, wherein the device is selected from the group consisting of organic electroluminescent devices, organic integrated circuits, organic field-effect transistors, organic thin-film transistors, organic light-emitting transistors, organic solar cells, organic dye-sensitized solar cells, organic optical detectors, organic photoreceptors, organic field-quench devices, light-emitting electrochemical cells, organic laser diodes and organic plasmon emitting devices.

13. The electronic device according to claim 11, wherein the device is an organic electroluminescent device and the mixture is used in an emitting layer.

14. A matrix material for a phosphorescent compound which comprises a compound according to Formula (1)

Formula (1)

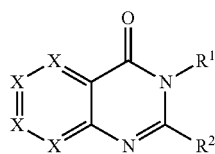

where the symbols and indices used are as follows:

X is the same or different at each instance and is N or $CR^3$, where not more than 2 X per heteroaryl group are N;

$R^1$ is an aromatic or heteroaromatic ring system which has 5 to 60 aromatic ring atoms and is optionally substituted in each case by one or more $R^4$ radicals;

$R^2$ is an aromatic or heteroaromatic ring system selected from the groups having the following Formulae (Ar-3) to (Ar-27):

Formula (Ar-3)

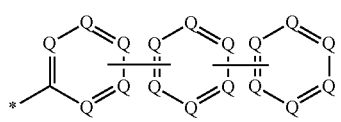

Formula (Ar-4)

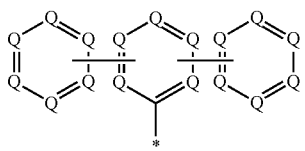

Formula (Ar-5)

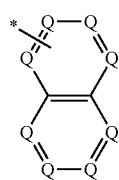

Formula (Ar-6)

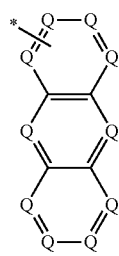

Formula (Ar-7)

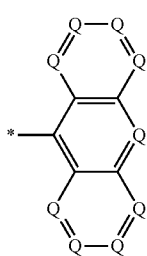

-continued

Formula (Ar-8)

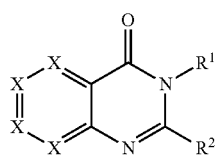

Formula (Ar-9)

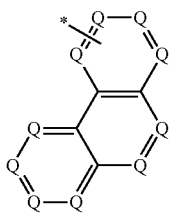

Formula (Ar-10)

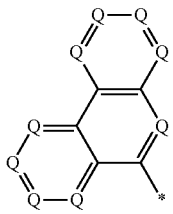

Formula (Ar-11)

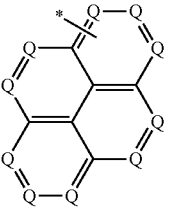

Formula (Ar-12)

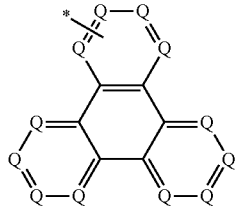

Formula (Ar-13)

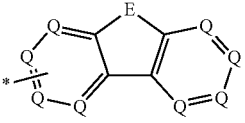

Formula (Ar-14)

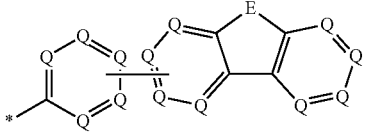

Formula (Ar-15)

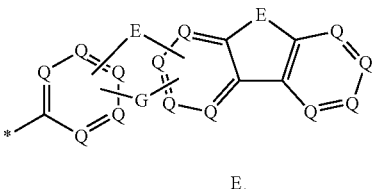

Formula (Ar-16)

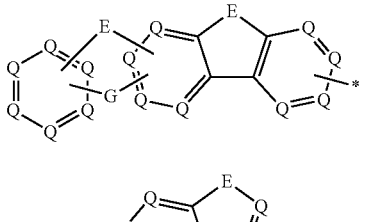

-continued

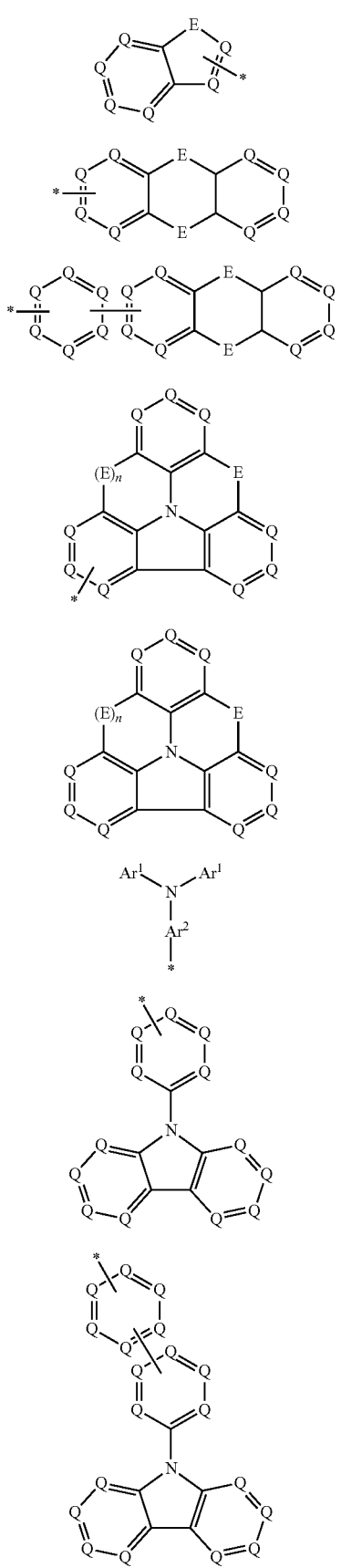

Formula (Ar-17)

Formula (Ar-18)

Formula (Ar-19)

Formula (Ar-20)

Formula (Ar-21)

Formula (Ar-22)

Formula (Ar-23)

Formula (Ar-24)

-continued

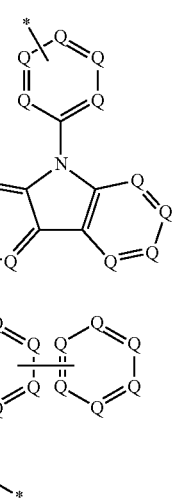

Formula (Ar-25)

Formula (Ar-26)

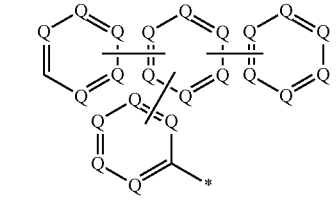

Formula (Ar-27)

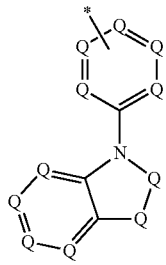

Q is the same or different at each instance and is $CR^4$ or N, where not more than 3 Q symbols per cycle are N;

E is the same or different at each instance and is $(CR^4)_2$, $NR^4$, O, S or C=O;

G at each instance is a single bond, $(CR^4)_2$, $NR^4$, O, S or C=O;

n is 0 or 1, where n=0 means that no E group is bonded at this position and $R^4$ radicals are bonded to the corresponding carbon atoms instead;

$Ar^2$ is the same or different at each instance and is a bivalent aromatic or heteroaromatic ring system which has 5 to 60 aromatic ring atoms and may be substituted by one or more $R^4$ radicals;

$Ar^1$ are the same or different at each instance and are an aromatic or heteroaromatic ring system which has 6 to 60 aromatic ring atoms and may in each case also be substituted by one or more $R^4$ radicals; where the two $Ar^1$ may be joined and/or $Ar^1$ may be joined to $Ar^2$ via at least one bridge K in each case;

K is the same or different at each instance and is a single bond or a divalent bridge selected from $N(R^4)$, $B(R^4)$, O, C=O, $C(R^4)_2$, $Si(R^4)_2$ and S; and

*represents the bond to the quinazolinone base skeleton;

$R^3$ is the same or different at each instance and is H, D, F, Cl, Br, I, CHO, C(=O)Ar, P(=O)(Ar)$_2$, S(=O)Ar, S(=O)$_2$Ar, CN, NO$_2$, Si(R$^4$)$_3$, B(OR$^4$)$_2$, OSO$_2$R$^4$, N(R$^4$)$_2$, a straight-chain alkyl, alkoxy or thioalkoxy group having 1 to 40 carbon atoms or a branched or cyclic alkyl, alkoxy or thioalkoxy group having 3 to 40 carbon atoms and is optionally substituted in each case by one or more $R^4$ radicals, where one or more non-adjacent CH$_2$ groups is optionally replaced by C≡C, Si($R^4$)$_2$, Ge($R^4$)$_2$, Sn($R^4$)$_2$, C=O, C=S, C=Se, P(=O)($R^4$), SO, SO$_2$, O, S or CONR$^4$ and where one or more hydrogen atoms is optionally replaced by D, F, Cl, Br, I, CN or NO$_2$, or an aromatic or heteroaromatic ring system which has 5 to 60 aromatic ring atoms and is optionally substituted in each case by one or more $R^4$ radicals, or an aryloxy or heteroaryloxy group which has 5 to 60 aromatic ring atoms and is optionally substituted by one or more $R^4$ radicals;

Ar is the same or different at each instance and is an aromatic or heteroaromatic ring system which has 6 to 60 aromatic ring atoms and may also be substituted in each case by one or more $R^4$ radicals, $R^4$ is the same or different at each instance and is H, D, F, Cl, Br, I, CHO, C(=O)$R^5$, P(=O)($R^5$)$_2$, S(=O)$R^5$, S(=O)$_2$$R^5$, CN, NO$_2$, Si($R^5$)$_3$, B(O$R^5$)$_2$, OSO$_2$$R^5$, N($R^5$)$_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more $R^5$ radicals, where one or more nonadjacent CH$_2$ groups is optionally replaced by C≡C, Si($R^5$)$_2$, Ge($R^5$)$_2$, Sn($R^5$)$_2$, C=O, C=S, C=Se, P(=O)($R^5$), SO, SO$_2$, O, S or CONR$^5$ and where one or more hydrogen atoms is optionally replaced by D, F, Cl, Br, I, CN or NO$_2$, or an aromatic or heteroaromatic ring system which has 5 to 60 aromatic ring atoms, each of which is optionally substituted by one or more $R^5$ radicals, or an aryloxy or heteroaryloxy group which has 5 to 60 aromatic ring atoms and is optionally substituted by one or more $R^5$ radicals;

$R^5$ is the same or different at each instance and is H, D, F, Cl, Br, I, N($R^6$)$_2$, C(=O)$R^6$, P(=O)($R^6$)$_2$, S(=O)$R^6$, S(=O)$_2$$R^6$, C$R^6$=C($R^6$)$_2$, CN, NO$_2$, Si($R^6$)$_3$, B(O$R^6$)$_2$, OSO$_2$$R^6$, N($R^6$)$_2$, a straight-chain alkyl, alkoxy or thioalkoxy group having 1 to 40 carbon atoms or a branched or cyclic alkyl, alkoxy or thioalkoxy group having 3 to 40 carbon atoms, each of which is optionally substituted by one or more $R^6$ radicals, where one or more nonadjacent CH$_2$ groups is optionally replaced by $R^6$C=C$R^6$, C≡C, Si($R^6$)$_2$, C=O, C=N$R^6$, P(=O)($R^6$), SO, SO$_2$, N$R^6$, O, S or CONR$^6$ and where one or more hydrogen atoms is optionally replaced by D, F, Cl, Br, I, CN or NO$_2$, or an aromatic or heteroaromatic ring system which has 5 to 60 aromatic ring atoms, each of which is optionally substituted by one or more $R^6$ radicals, or an aryloxy or heteroaryloxy group which has 5 to 60 aromatic ring atoms and is optionally substituted by one or more $R^6$ radicals, or an aralkyl or heteroaralkyl group which has 5 to 60 aromatic ring atoms and is optionally substituted by one or more $R^6$ radicals;

$R^6$ is the same or different at each instance and is H, D, F or an aliphatic hydrocarbyl radical having 1 to 20 carbon atoms or an aryl or heteroaryl group which has 5 to 60 ring atoms and is optionally substituted by one or more $R^7$ radicals; and $R^7$ is the same or different at each instance and is H, D, F or an aliphatic hydrocarbyl radical having 1 to 20 carbon atoms.

\* \* \* \* \*